(12) United States Patent
Kato

(10) Patent No.: US 6,288,963 B1
(45) Date of Patent: Sep. 11, 2001

(54) SEMICONDUCTOR MEMORY DEVICE

(75) Inventor: Yoshiharu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 09/593,013

(22) Filed: Jun. 13, 2000

(30) Foreign Application Priority Data

Dec. 21, 1999 (JP) .................................................. 11-362802

(51) Int. Cl.$^7$ ...................................................... G11C 7/00
(52) U.S. Cl. .................. 365/222; 365/189.09; 365/226; 365/227
(58) Field of Search ............................. 365/222, 189.09, 365/226, 227; 327/534, 535, 536, 537

(56) References Cited

U.S. PATENT DOCUMENTS

| | | | |
|---|---|---|---|
| 5,315,166 | * | 5/1994 | Arimoto .................. 327/537 |
| 5,396,114 | * | 3/1995 | Lee et al. ................. 327/535 |
| 5,781,481 | * | 7/1998 | Iwakiri .................. 365/189.11 |
| 5,886,932 | * | 3/1999 | Choi ..................... 365/189.09 |
| 5,956,281 | * | 9/1999 | Nakai et al. ............. 365/222 |
| 6,150,870 | * | 11/2000 | Kang ..................... 327/537 |
| 6,172,928 | * | 1/2001 | Ooishi ................... 365/222 |

* cited by examiner

Primary Examiner—David Nelms
Assistant Examiner—Gene N. Auduong
(74) Attorney, Agent, or Firm—Arent Fox Kintner Plotkin & Kahn, PLLC

(57) ABSTRACT

A variation in substrate voltage VBB caused by a reduction of power supply voltage VDD when an operation mode is shifted to a data retention mode is detected, and a cycle of refresh operation during this varying period is shortened or a plurality of memory cells are refreshed simultaneously, thereby enhancing the electric charge retention ability of the memory cells during this transient period. After the transient period is elapsed, the refresh cycle is returned to the original operating cycle, and the power consumption during the data retention mode can be effectively reduced.

22 Claims, 43 Drawing Sheets

FIG.1 BLOCK DIAGRAM OF SEMICONDUCTOR MEMORY DEVICE ACCORDING TO FIRST EMBODIMENT

FIG.2 CONCRETE EXAMPLE OF SUBSTRATE VOLTAGE DETECTING CIRCUIT IN FIRST EMBODIMENT

FIG. 4 CONCRETE EXAMPLE OF REFRESH TIMER CIRCUIT IN FIRST EMBODIMENT

FIG.6 FIRST MODIFICATION OF REFRESH TIMER CIRCUIT IN FIRST EMBODIMENT

FIG.7 TIME CHART FOR EXPLAINING OPERATION OF FIRST MODIFICATION OF REFRESH TIMER CIRCUIT IN FIRST EMBODIMENT

FIG.8 SECOND MODIFICATION OF REFRESH TIMER CIRCUIT IN FIRST EMBODIMENT

FIG. 9 TIME CHART FOR EXPLAINING SECOND MODIFICATION OF REFRESH TIMER CIRCUIT IN FIRST EMBODIMENT

FIG.10 THIRD MODIFICATION OF REFRESH TIMER CIRCUIT IN FIRST EMBODIMENT

FIG.11 FOURTH MODIFICATION OF REFRESH TIMER CIRCUIT IN FIRST EMBODIMENT

FIG.12 FIFTH MODIFICATION OF REFRESH TIMER CIRCUIT IN FIRST EMBODIMENT

FIG.13 TIME CHART FOR EXPLAINING OPERATION OF FIFTH MODIFICATION ON FIRST EMBODIMENT

FIG.14 SIXTH MODIFICATION OF REFRESH TIMER CIRCUIT IN FIRST EMBODIMENT

FIG.15 TIME CHART FOR EXPLAINING OPERATION OF SIXTH MODIFICATION IN FIRST EMBODIMENT

FIG.16 SEVENTH MODIFICATION OF REFRESH TIMER CIRCUIT IN FIRST EMBODIMENT

FIG.17 BLOCK DIAGRAM OF SEMICONDUCTOR MEMORY DEVICE ACCORDING TO SECOND EMBODIMENT

FIG. 18 CONCRETE EXAMPLE OF DATA RETENTION MODE ENTRY JUDGING CIRCUIT IN SECOND EMBODIMENT

FIG.19 FIRST MODIFICATION OF DATA RETENTION MODE ENTRY JUDGING CIRCUIT IN SECOND EMBODIMENT

FIG.20 TIME CHART FOR EXPLAINING OPERATION OF FIRST MODIFICATION OF DATA RETENTION MODE ENTRY JUDGING CIRCUIT IN SECOND EMBODIMENT

FIG.22 CONCRETE EXAMPLE OF VDD VOLTAGE VARIATION DETECTING CIRCUIT IN THIRD EMBODIMENT

TIME CHART FOR EXPLAINING COMPARISON OPERATION OF COMPARATOR IN EXAMPLE OF VDD VOLTAGE VARIATION DETECTING CIRCUIT IN THIRD EMBODIMENT

FIG.24 BLOCK DIAGRAM OF SEMICONDUCTOR MEMORY DEVICE ACCORDING TO FOURTH EMBODIMENT

FIG.25 CONCRETE EXAMPLE OF SUBSTRATE VOLTAGE VARIATION AUXILIARY CIRCUIT IN FOURTH EMBODIMENT

FIG.26 BLOCK DIAGRAM OF SEMICONDUCTOR MEMORY DEVICE ACCORDING TO FIFTH EMBODIMENT

FIG.27 CONCRETE EXAMPLE OF INTERNAL REDUCED VOLTAGE CIRCUIT WITH VOLTAGE CONTROL FUNCTION IN FIFTH EMBODIMENT

FIG.28 TIME CHART FOR EXPLAINING OPERATION OF INTERNAL REDUCED VOLTAGE CIRCUIT WITH VOLTAGE CONTROL FUNCTION IN FIFTH EMBODIMENT

CONCRETE EXAMPLE OF DATA RETENTION EXIT DETECTING CIRCUIT IN SIXTH EMBODIMENT

FIG.31 TIME CHART FOR EXPLAINING OPERATION OF DATA RETENTION EXIT DETECTING CIRCUIT IN SIXTH EMBODIMENT

FIG.32 FIRST MODIFICATION OF DATA RETENTION EXIT DETECTING CIRCUIT IN SIXTH EMBODIMENT

SECOND MODIFICATION OF DATA RETENTION EXIT DETECTING CIRCUIT IN SIXTH EMBODIMENT

FIG.34 CONCRETE EXAMPLE OF SUBSTRATE VOLTAGE GENERATING AUXILIARY CIRCUIT FOR REINFORCING GENERATION OF SUBSTRATE VOLTAGE VBB IN COOPERATION WITH DATA RETENTION EXIT CIRCUIT IN SIXTH EMBODIMENT

FIG.35 MODIFICATION OF SUBSTRATE VOLTAGE GENERATING AUXILIARY CIRCUIT FOR REINFORCING GENERATION OF SUBSTRATE VOLTAGE VBB IN COOPERATION WITH DATA RETENTION EXIT CIRCUIT IN SIXTH EMBODIMENT

FIG. 36 BLOCK DIAGRAM OF SEMICONDUCTOR MEMORY DEVICE ACCORDING TO SEVENTH EMBODIMENT

FIG.37 CONCRETE EXAMPLE OF INTERNAL REDUCED VOLTAGE CIRCUIT WITH VOLTAGE CONTROL FUNCTION IN SEVENTH EMBODIMENT

FIG.38 BLOCK DIAGRAM OF SEMICONDUCTOR MEMORY DEVICE IN PRIOR ART

SCHEMATIC FIGURE SHOWING POSITIONAL RELATION AMONG MEMORY CELL, WORD LINE AND BIT LINE IN MEMORY ARRAY OF SEMICONDUCTOR MEMORY DEVICE

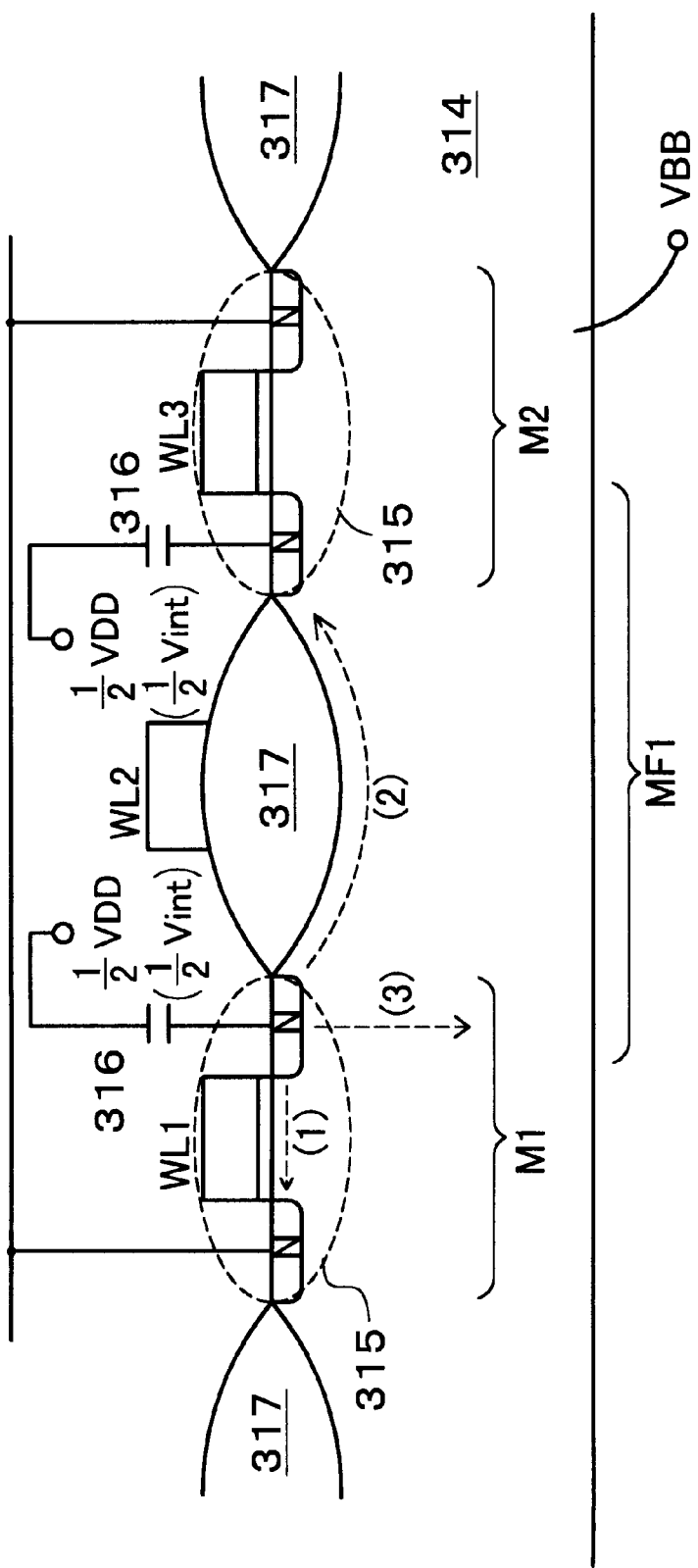
FIG.40 SECTIONAL FIGURE OF MEMORY CELL SECTIONED ALONG BIT LINE OF SEMICONDUCTOR MEMORY DEVICE

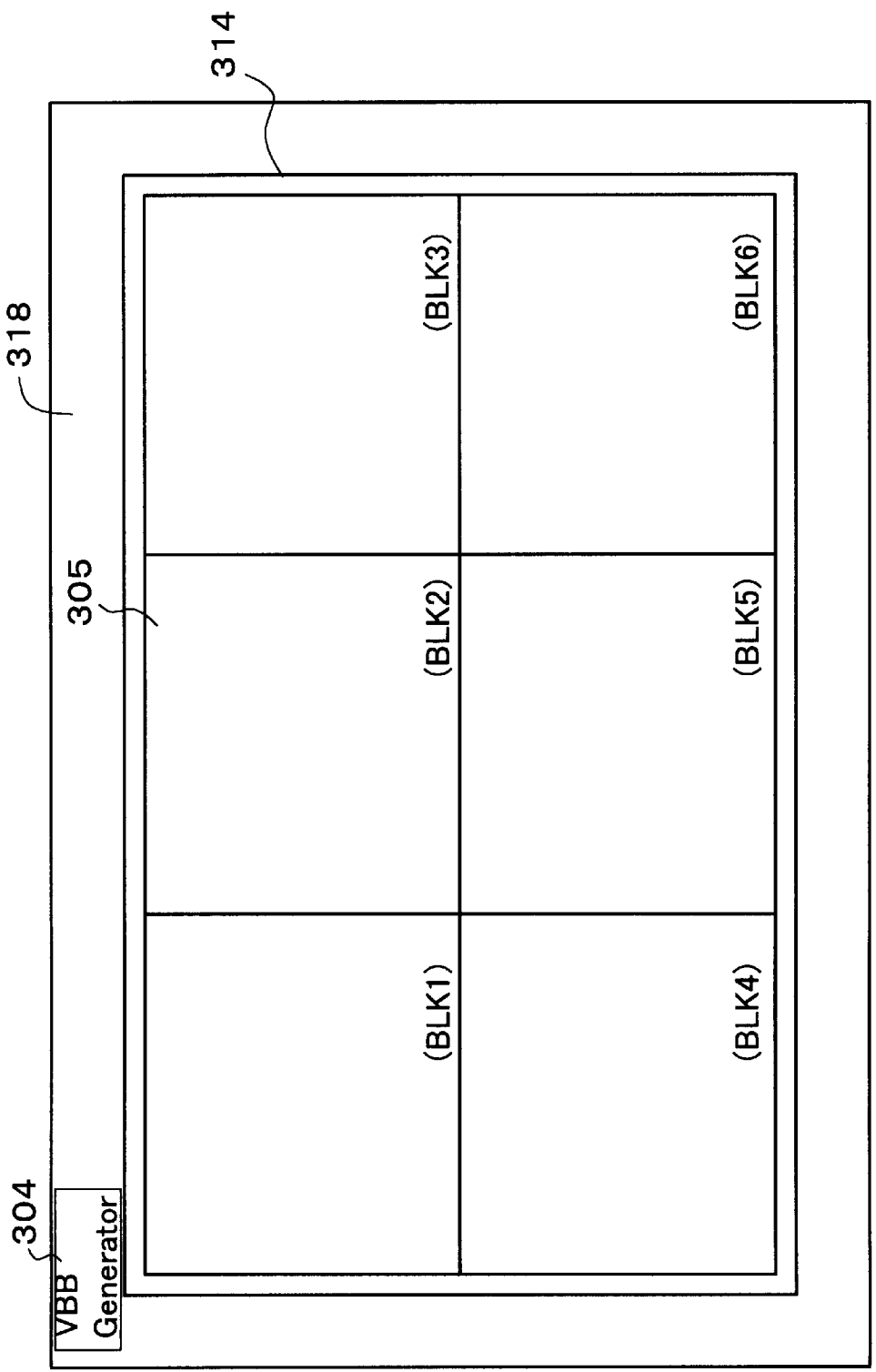
FIG.41 SCHEMATIC FIGURE SHOWING EXAMPLE OF CHIP LAYOUT IN SEMICONDUCTOR MEMORY DEVICE

FIG.42A

TIME CHART SHOWING VARIATION OF SUBSTRATE VOLTAGE VBB ACCORDING TO REDUCTION OF POWER SUPPLY VOLTAGE VDD WHEN OPERATION MODE IS SHIFTED TO DATA RETENTION MODE IN SEMICONDUCTOR MEMORY DEVICE

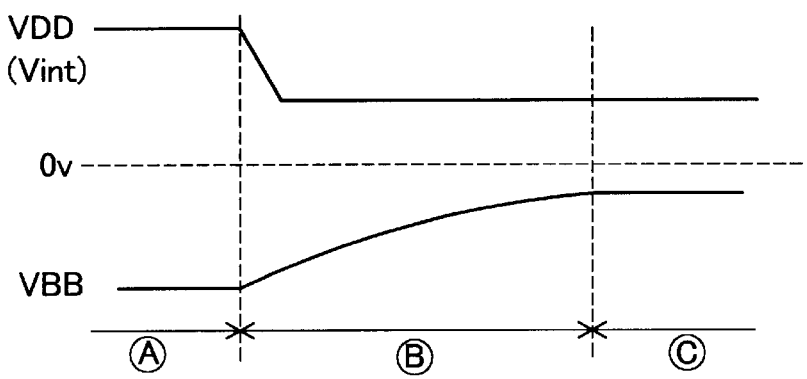

FIG.42B

TIME CHART SHOWING VARIATION OF SUBSTRATE VOLTAGE VBB ACCORDING TO RISE OF POWER SUPPLY VOLTAGE VDD WHEN OPERATION MODE IS RESTORED FROM DATA RETENTION MODE IN SEMICONDUCTOR MEMORY DEVICE

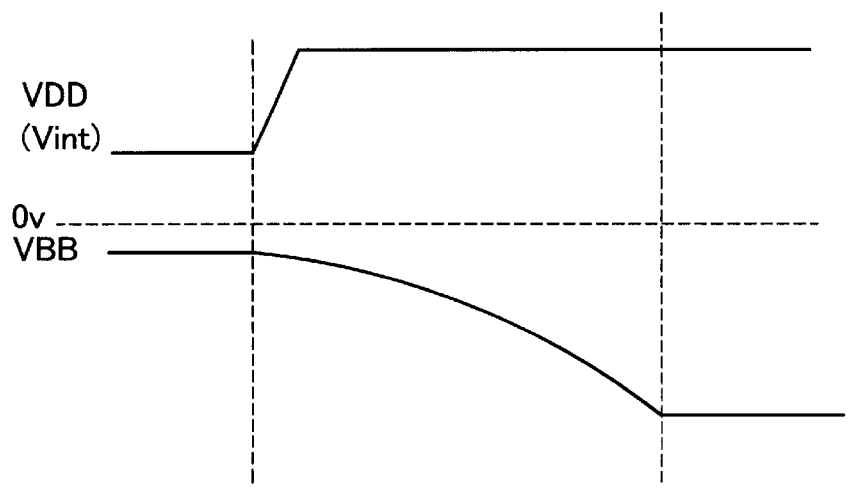

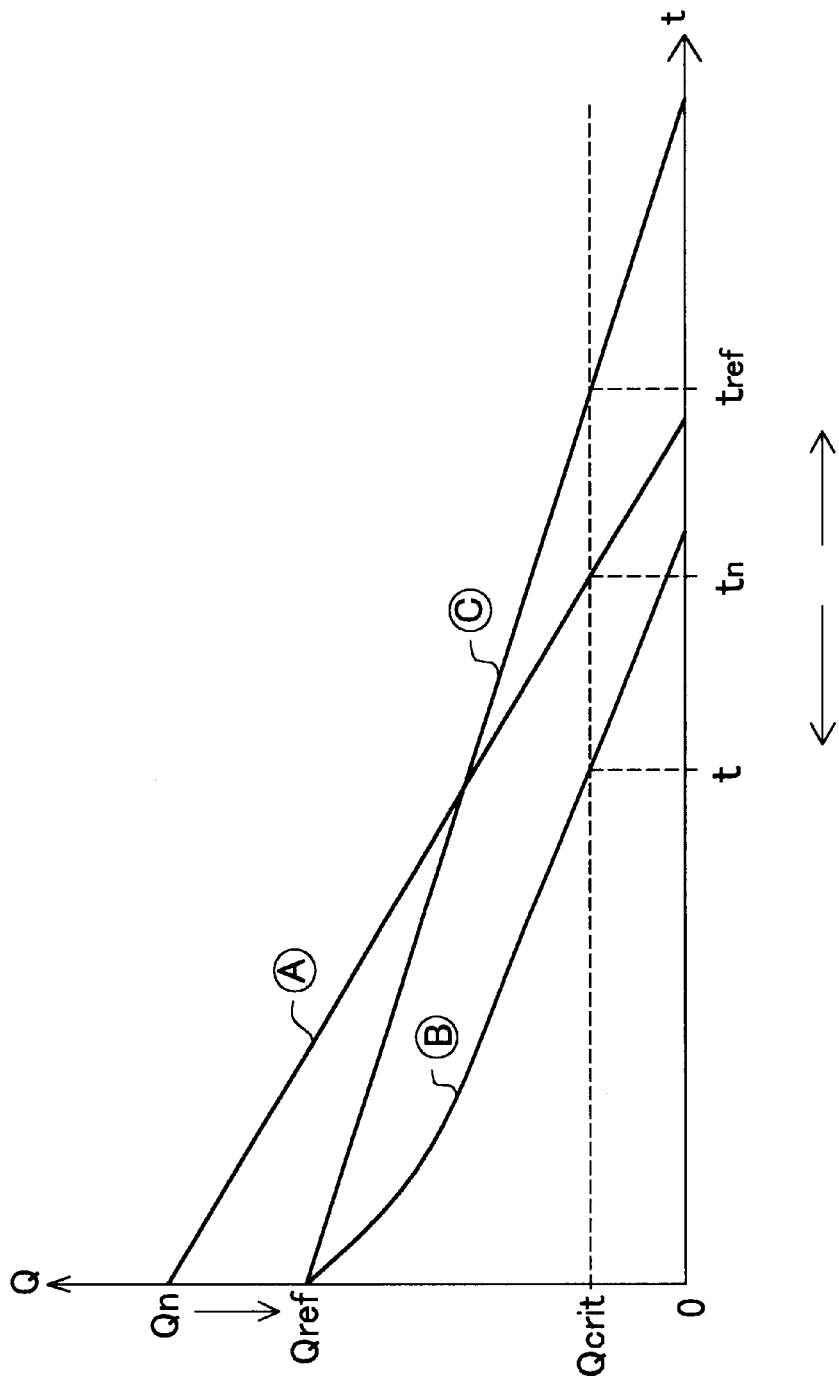
FIG.43 GRAPH SCHEMATICALLY SHOWING VARIATION OF CHARGE QUANTITY RETAINED IN MEMORY ACCORDING TO TIME ELAPSE

SEMICONDUCTOR MEMORY DEVICE

BACKGROUND OF THE INVENTION

1. Field of the Invention

The present invention relates to a semiconductor memory device such as a dynamic random access memory (DRAM, hereinafter) requiring refresh operation which is an operation for recharging electric charge periodically so as to retain electric charge accumulated in a memory cell, and more particularly, to a semiconductor memory device in which power consumption in the dormant state where only the recharging is carried out can be reduced, thereby to be able to use for a long time when installed in various portable equipments.

2. Description of Related Art

In recent years, many high-speed memories having large capacities are mounted in various portable equipments such as a notebook personal computer and a mobile personal computer as functionality is advancing. The DRAM is a typical memory, and is used as a standard memory of the portable equipment because of its large capacity and high speed.

On the other hand, the portable equipment itself is required to operate for a long time with one charge and is required that the power consumption of its components is small. In the case of the DRAM, it is necessary to periodically refresh for retaining electric charge accumulated in its memory cell, and to recharge the electric charge accumulated in the memory cell, and electric power is consumed even in the dormant state where data are not input or output. Therefore, in order to reduce the power consumption of the portable equipment, it is also necessary to reduce the power consumption at the time of refresh operation of the DRAM.

So as to meet the above requirement, in the DRAM, a refresh operation for reducing the power consumption in a so-called data retention mode in the dormant state is carried out. The data retention mode will be explained below with reference to FIGS. 38 to 43.

FIG. 38 shows a circuit block diagram 300 of a DRAM. A control circuit 301 receives external signals such as /RAS (Row Address Strobe) signal, /CAS (Column Address Strobe) signal, /WE (Write Enable) signal, CLK (Clock) signal, /CS (Chip Select) signal and the like, and controls input of address, input and output of data, refresh control and the like. A column decoder 302 connects a bit line (BL) selected by a column address (CA) to a data bus (not shown), thereby inputting and outputting data. An internal reduced voltage generating circuit 303 is mounted in the DRAM for reducing an external power supply voltage when mismatch is generated between an external power supply voltage and a power supply voltage required for a device as the packing density is increased. A substrate voltage generating circuit 304 is a circuit for generating voltage for biasing a substrate portion in a memory cell array 305 to negative voltage because of a reason which will be mentioned later.

In the DRAM, a memory cell group is disposed on the memory cell array 305 in a matrix manner, and a large number of memory cells are connected to a word line (WL in the drawing) selected in correspondence with a row address signal. This memory cell array 305 comprises six, for example, blocks BLK1 to BLK6. At the time of the refresh operation, row address (RAref) to be refreshed by a refresh address counter circuit 307 is counted up based on a refresh cycle set by a refresh timer circuit 306, and is supplied to a row address selecting circuit 308. The row address selecting circuit 308 selects the refresh row address (RAref), a part of the refresh row address (RAref) is supplied to a cell array block selecting circuit 309, and the remainder is supplied to a word line selecting circuit 310. A word line driving circuit 311 activates a word line in the block corresponding to the refresh address (RAref) in response to outputs of the cell array block selecting circuit 309 and the word line selecting circuit 310.

Electric charge in a memory cell connected to the selected word line WL is read out to the bit line BL, and is amplified by a sense amplifier (not shown) so that the amount of electric charge accumulated in the memory cell is restored. This refresh operation is carried out by selecting the word lines WL in sequence within a time period during which the electric charge in the memory cell is retained in the memory cell.

FIG. 39 schematically shows the positional relation among the memory cell 313, the word lines WL and bit lines BL (BL1, /BL1, /BL2 in FIG. 39) in the memory cell array 305. FIG. 39 shows a region B in FIG. 38 in enlarged scale. In FIG. 39, symbols ○ represent memory cells 313. A memory cell group intersecting the word line WL is selected by the word line WL, and electric charge is input and output on the intersecting bit lines BL (BL1, /BL1, /BL2 in FIG. 39). The memory cells 313 are laid out in a staggered arrangement manner, and the positional relation among the memory cells 313 including the word lines WL, bit lines BL (BL1, /BL1, /BL2 in FIG. 39) and the like is most densely integrated.

A cross section structure of the memory cell 313 along the bit line BL1 in FIG. 39 is shown in FIG. 40. Each of M1 and M2 of the memory cell 313 comprises one NMOS transistor 315 formed on a P-type substrate 314 and one cell capacitor 316, surroundings thereof are separated from adjacent cells by thick field oxide layers 317. The adjacent cells are disposed in a back-to-back manner through the field oxide layers 317, and WL2 of the word line WL which selects memory cells 313 which are adjacent in the vertical direction in FIG. 40 are disposed on the field oxide layers 317. In the memory cell 313 of this structure, electric charge as the data is accumulated in the cell capacitor 316, and the input and output as well as the retention of the electric charge are conducted by switching the NMOS transistor 315.

In recent years, when a substrate is grounded, a threshold voltage of the NMOS transistor is about 0.4 V due to the progression of packing density, but with such a low threshold voltage, the amount of accumulated electric charge is reduced by a leak current from the cell capacitor 316 through the switching NMOS transistor 315 of the memory cell 313, and it is not preferable in terms of electric charge retention characteristics in some cases. Further, due to a structure in view of a layout of the memory cell 313, the NMOS transistor (field MOS transistor, hereinafter, MF1 in FIGS. 39 and 40) is formed such that diffusion layers of the adjacent cell capacitors 316 sandwiches the field oxide layer 317, and the WL2 of the word line WL on the field oxide layer 317 is used as a gate. Due to the progression of packing density, a threshold voltage of the field MOS transistor MF1 tends to be shallower, and in a state where the substrate has grounded potential, the current leak (leak current (2) in FIG. 40) between the adjacent cell capacitors 316 by driving of WL2 of other word line WL may induce some problems, and this is known as a so-called disturb problem. To solve the above problem, in recent DRAM, threshold voltage of the switching NMOS transistor 315 and the field MOS transistor MF1 are set deep utilizing a substrate bias effect of the MOS transistor by biasing negative voltage VBB to the substrate 314, thereby preventing the leak current and the like.

Here, the purpose of the refresh operation is achieved by amplifying the electric charge of the cell capacitor 316 read out on a bit line BL without inputting or outputting data, and again charging the electric charge to the cell capacitor. Concerning the frequency of this operation, the operation cycle may be set long within a range of produce specification in accordance with the electric charge retention ability of the memory cell 313, and unlike the normal data input and output operation requiring high access speed, high speed of the operation is not required.

That is, in the refresh operation, the power supply voltage can be reduced and as a result, voltage applied to the word line WL can also be reduced. Therefore, even if the substrate bias effect is weakened, the disturb problem can be improved, and the leak current (2) in FIG. 40 can be reduced. In addition, the VBB voltage is increased in the negative voltage (which is expressed as "VBB is shallow", hereinafter), to weaken the substrate bias effect. Therefore, electric field applied to a junction between the substrate and the diffusion layer of the cell capacitor 316 of the memory cell 313 is also relaxed and thus, the leak current (3) in the connected portion in FIG. 40 can also be reduced. The reduction in the substrate bias effect in this case is so small that the leak current (the leak current (1) in FIG. 40) through the NMOS switch 315 does not induce any problem.

FIG. 43 is a graph schematically showing that the amount of accumulated electric charge is reduced with time after the cell capacitor 316 is charged at time t=0. In FIG. 43, axis of ordinates shows the amount of accumulated electric charge, and axis of abscissas shows time. Symbol A represents a process of reduction in the accumulated electric charge in a normal operation state, and symbol C represents a process of the reduction in the accumulated electric charge in the above-described state where the power supply voltage is reduced. Both the cases are based on the assumption that the leak current is constant, therefore the amount of accumulated electric charge is reduced linearly (symbol B will be described later). As shown in FIG. 43, the reducing speed of the amount of the accumulated electric charge of the memory cell 313 in the symbol C is reduced as compared with the speed in the normal operation state, and the time (tref in FIG. 43) during which the amount of the electric charge (Qcrit) is reduced to a level requiring recharge by the refresh operation is longer than the time of the normal operation state(tn in FIG. 43). Therefore, the interval of refresh operations can be set long.

By applying the above operation to the refresh operation in dormant state, the power supply voltage VDD can be reduced, and the cycle of the refresh operation can be set long. Therefore, the current consumption can be reduced, and the power consumption which is the product of the power supply voltage and the cycle can be reduced with the square effect. The present operation is employed as a technique indispensable for DRAM mounted in the portable equipment as the data retention mode.

However, in the above-described conventional data retention mode, due to unbalanced transient voltage value between the substrate voltage VBB and the power supply voltage VDD applied to the memory cell, or between the substrate voltage VBB and an internal voltage Vint which is reduced in a chip, when an operation mode shifted to the data retention mode or when the operation mode is shifted back from the data retention mode, there is a problem that power consumption can not be a reduced sufficiently in the data retention mode. In addition, there is a problem that the electric charge decays when the operation mode is returned from the data retention mode.

The above problems will be explained based on FIGS. 41 to 43. FIG. 41 schematically shows one example of a chip layout 318 of the DRAM. The memory cell array 305 is divided into six cell array blocks (BLK1 to BLK6) for the sake of expediency, and the cell array blocks are disposed on a chip 318. As shown in FIG. 41, the memory cell array 305 occupies a large area on the chip 318. On the other hand, the substrate voltage generating circuit 304 generates and supplies VBB voltage for biasing a substrate of the memory cell array 305, but the substrate region 314 constitutes a substrate capacity component 319 having large area and large capacity (FIG. 38), whereas a driving ability of this circuit is limited due to constraints of an area to be occupied by the substrate voltage generating circuit 304 on the chip 318. Therefore, the transient response characteristics of the generated VBB are limited, and the following ability with respect to abrupt variation in the substrate voltage has a certain limit.

Therefore, as shown in FIG. 42A, if the power supply voltage VDD or the internal voltage Vint is reduced by shifting the operation mode to the data retention mode, a set value of the substrate voltage generating circuit 304 is changed such that the substrate voltage VBB in accordance with these power supply voltages is output, but since the ability for positively discharging the electric charge accumulated in the substrate capacity component 319 of the memory cell array 305 is limited, a certain transient period is required until the substrate potential VBB is converged to a new set voltage (a region B in FIG. 42A).

In such a transient period, even though the power supply voltage (VDD or Vint) is reduced, a state where the VBB is low in negative voltage (this will be explained as "VBB is deep", hereinafter) is continued, both the voltages are out of proportion to each other. That is, since the power supply voltage is applied to the cell capacitor 316 of the memory cell 313 and the electric charge is accumulated, the amount of the electric charge which can be accumulated in the cell capacitor 316 is reduced due to the reduction of the power supply voltage. Therefore, the substrate voltage VBB to be applied between the diffusion layer which is an electric charge accumulation layer of the cell capacitor 316 and the substrate 314 is kept deep during this transient period, the electric field applied to the junction is large and thus, the leak current (leak current (3) in FIG. 40) is large. Symbol B in FIG. 43 shows this state. The leak current is the greatest immediately after the power supply voltage VBB is reduced and thereafter, as the time is elapsed, the substrate voltage VBB becomes shallower as the substrate voltage VBB is converged to a new set value after the power supply voltage is reduced. Therefore, elapsed time of the accumulated electric charge amount is represented as a curved line curving downward. As can be seen from FIG. 43 also, there is an unbalanced state where the leak current is large as compared with the accumulated electric charge amount, the reducing speed of the accumulated electric charge amount is faster than that in the normal operating state after the power supply voltage reduces (symbol C in FIG. 43), and in some cases, the state is worsened as compared with the normal operating state before the power supply voltage is reduced (symbol A in FIG. 43), and the retention ability of electric charge is worsened.

Therefore, even though proficiency of the refresh period in the data retention mode is higher than that in the normal operating state, and even though the data retention mode has ability for setting the refresh interval longer, the retention characteristic of the accumulated electric charge of the memory cell 313 is worsened due to delay of transient response of VBB in the shifting period to this mode, the cycle of the refresh operation must be set short. That is, after the operation mode is shifted to the data retention mode, the refresh operation must be carried out while keeping the short cycle, the current consumption in this mode remains great against the initial purpose, the power consumption can only be reduced in an amount corresponding to the reduction of the power supply voltage, and there is a problem that the power consumption can not be reduced sufficiently.

Further, as shown in FIG. 42B, if the power supply voltage VDD or the internal voltage Vint is increased because the operation mode is returned from the data retention mode, the set value of the substrate voltage generating circuit 304 is changed such that the substrate voltage VBB in accordance with the power supply voltage is output, but due to the limit of ability for charging the electric charge accumulated in the substrate capacity component 319 of the memory cell array 305, a certain transient period is required until the substrate voltage VBB is converged to a new set voltage.

During the transient period, even though the power supply voltage (VDD or Vint) is high, a state where the substrate voltage VBB is shallow is continued, and both the voltages are out of balance. During this time, when the word line WL passing between the cell capacitors 316 of the adjacent memory cells 313 is continuously selected and is retained in high voltage, if the electric charge of the adjacent cell capacitors 316 is combination of high level and low level, leak current (leak current (2) in FIG. 40) by the effect of the field MOS transistor MF1 is generated between the diffusion layers of the cell capacitors 316 sandwiching the word line WL, the high level side accumulated electric charge leaks toward the low level side diffusion layer, there is an adverse possibility that the electric charge decays, and a so-called disturb problem is caused.

Furthermore, in an operation state other than the above-described state, in case that the power supply voltage VDD, the internal voltage Vint or the substrate voltage VBB is varied and these voltages are out of balance, there is a problem that the electric charge retention characteristic of the memory cell 313 is worsened by the same reason, and the electric charge decays.

SUMMARY OF THE INVENTION

The present invention has been accomplished to solve the above conventional problems, and it is an object of the invention to provide a semiconductor memory device in which a temporary reduction in electric charge accumulating ability of a memory cell when an operation mode is shifted to a data retention mode and during a transient period at the time of returning from the data retention mode is supplemented, and by preventing the ability from being lowered, the power consumption at the time of the data retention mode can be reduced.

At the same time, it is another object of the invention to provide a semiconductor memory device in which the electric charge retention characteristic of the memory cell is not worsened against the other transient variation between the power supply voltage or the internal voltage and the substrate voltage.

To achieve the above object, according to one aspect of the present invention, it is provided a semiconductor memory device with a first operation mode operating at a first power supply voltage and a second operation mode for carrying out a refresh operation of memory cells at a second power supply voltage lower than the first power supply voltage, the semiconductor memory device comprising:

a substrate voltage generating circuit for generating a substrate voltage applied to a substrate portion of a memory cell region;

a refresh section for carrying out the refresh operation of the memory cells at a predetermined cycle in the first operation mode; and a refresh control section for controlling the refresh section so that the refresh operation is carried out at a first cycle which is shorter than the predetermined cycle during a varying period of the substrate voltage when the first operation mode is shifted to the second operation mode.

According to the semiconductor memory device, during the varying period of the substrate voltage when the first operation mode is shifted to the second operation mode and the power supply voltage is reduced, the refresh control section controls the refresh section such that the refresh operation is carried out at a first cycle which is shorter than the predetermined cycle. With this, the electric charge retention ability of the memory cells during the varying period of the substrate voltage after the power supply voltage is reduced can be prevented from being deteriorated.

To achieve the above purposes of the invention, according to another aspect of the invention, it is also provided a semiconductor memory device with a first operation mode operating at a first power supply voltage and a second operation mode for carrying out a refresh operation of memory cells at a second power supply voltage lower than the first power supply voltage, the semiconductor memory device comprising:

a substrate voltage generating circuit for generating a substrate voltage applied to a substrate portion of a memory cell region;

a refresh section for carrying out the refresh operation of the memory cells at a predetermined cycle in the first operation mode; and a substrate voltage control circuit for connecting the substrate voltage to a predetermined voltage node during a varying period of the substrate voltage when the first operation mode is shifted to the second operation mode.

According to the above semiconductor memory device, during the varying period of the substrate voltage when the first operation mode is shifted to the second operation mode and the power supply voltage is reduced, the substrate voltage control circuit swiftly overcomes the unbalance state in voltage between the second power supply voltage and the substrate voltage by connecting the substrate voltage to the predetermined voltage, and it is possible to prevent the electric charge retention ability of the memory cells in the unbalance state from being deteriorated.

To achieve the above purposes of the invention, according to further another aspect of the invention, it is provided a semiconductor memory device with a first operation mode operating at a first power supply voltage and a second operation mode for carrying out a refresh operation of memory cells at a second power supply voltage lower than the first power supply voltage, the semiconductor memory device comprising:

a substrate voltage generating circuit for generating a substrate voltage applied to a substrate portion of a memory cell region;

a reduced voltage generating circuit for generating the second power supply voltage from the first power supply voltage;

wherein the reduced voltage generating circuit reduces a level of the second power supply voltage in response to a variation of the substrate voltage during a varying period in which the first operation mode is shifted to the second operation mode.

According to the above semiconductor memory device, since the level of the second power supply voltage is reduced in accordance with variation in substrate voltage when the first operation mode is shifted to the second operation mode, the unbalance state in the voltage value between the second power supply voltage and the substrate voltage in the refresh operation of the memory cells in the second operation mode is not generated, and it is possible to prevent the electric charge retention ability of the memory cells from being deteriorated.

Further, according to another aspect of the present invention, it is provided a semiconductor memory device with a first operation mode operating at a first power supply voltage and a second operation mode for carrying out a refresh operation of memory cells at a second power supply voltage lower than the first power supply voltage, the semiconductor memory device comprising:

a substrate voltage generating circuit for generating a substrate voltage applied to a substrate portion of a memory cell region;

a reduced voltage generating circuit for generating the second power supply voltage from the first power supply voltage;

wherein the reduced voltage generating circuit reduces the first power supply voltage to the second power supply voltage after the substrate voltage reaches to a predetermined level when the first operation mode is shifted to the second operation mode.

According to the above semiconductor memory device, when the first operation mode is shifted to the second operation mode, after the substrate voltage is varied and reaches a predetermined level, the reduced voltage generating circuit reduces the first power supply voltage to the second power supply voltage. Therefore, the refresh operation of the memory cells is not carried out at the second power supply voltage during the varying period of the substrate voltage. Therefore, during the varying period, the power supply voltage to be applied to the cell capacitor is kept high, and the accumulated electric charge amount should not be reduced, and the electric charge retention ability of the electric charge can be kept excellently, and it is possible to prevent the electric charge retention ability during the varying period of the substrate voltage from being deteriorated.

According to further another aspect of the present invention, it is provided a semiconductor memory device with a first operation mode operating at a first power supply voltage and a second operation mode for carrying out a refresh operation of memory cells at a second power supply voltage lower than the first power supply voltage, the semiconductor memory comprising:

a substrate voltage generating circuit for generating a substrate voltage applied to a substrate portion of a memory cell region;

wherein a driving ability of the substrate voltage generating circuit is increased during a period in which the second operation mode is shifted to the first operation mode.

According to the above semiconductor memory device, when the second operation mode is shifted to the first operation mode, since the driving ability of the substrate voltage generating circuit is increased, the substrate voltage can swiftly follow in accordance with the rise of the power supply voltage from the second power supply voltage to the first power supply voltage. Therefore, variation in substrate voltage caused by the rise of the power supply voltage is suppressed, the unbalance state of the voltage value between the power supply voltage and the substrate voltage is swiftly overcome, and it is possible to prevent the electric charge retention ability from being deteriorated. Therefore, a disturb problem when the operation mode is returned from the data retention mode is not generated, and the memory cells can reliably hold the data.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention.

In the drawings,

FIG. 40 is a sectional view of the memory cell taken along the bit line of the semiconductor memory;

FIG. 41 is a schematic view showing one example of a chip layout of the semiconductor memory;

FIG. 42A is a time chart showing a variation in the substrate voltage VBB when a power supply voltage VDD (an internal voltage Vint) is reduced as an operation mode is shifted to the data retention mode in the semiconductor memory;

FIG. 42B is a time chart showing a variation in the substrate voltage VBB when the power supply voltage VDD (an internal voltage Vint) is increased as the operation mode is returned from the data retention mode in the semiconductor memory; and FIG. 43 is a graph schematically showing the elapsed time of the amount of an accumulated electric charge of the memory cell over time.

DETAILED DESCRIPTION OF THE INVENTION

Semiconductor memories according to the present invention will be explained in detail below based on first to seventh embodiment embodying the invention with reference to the drawings.

Figure 1:
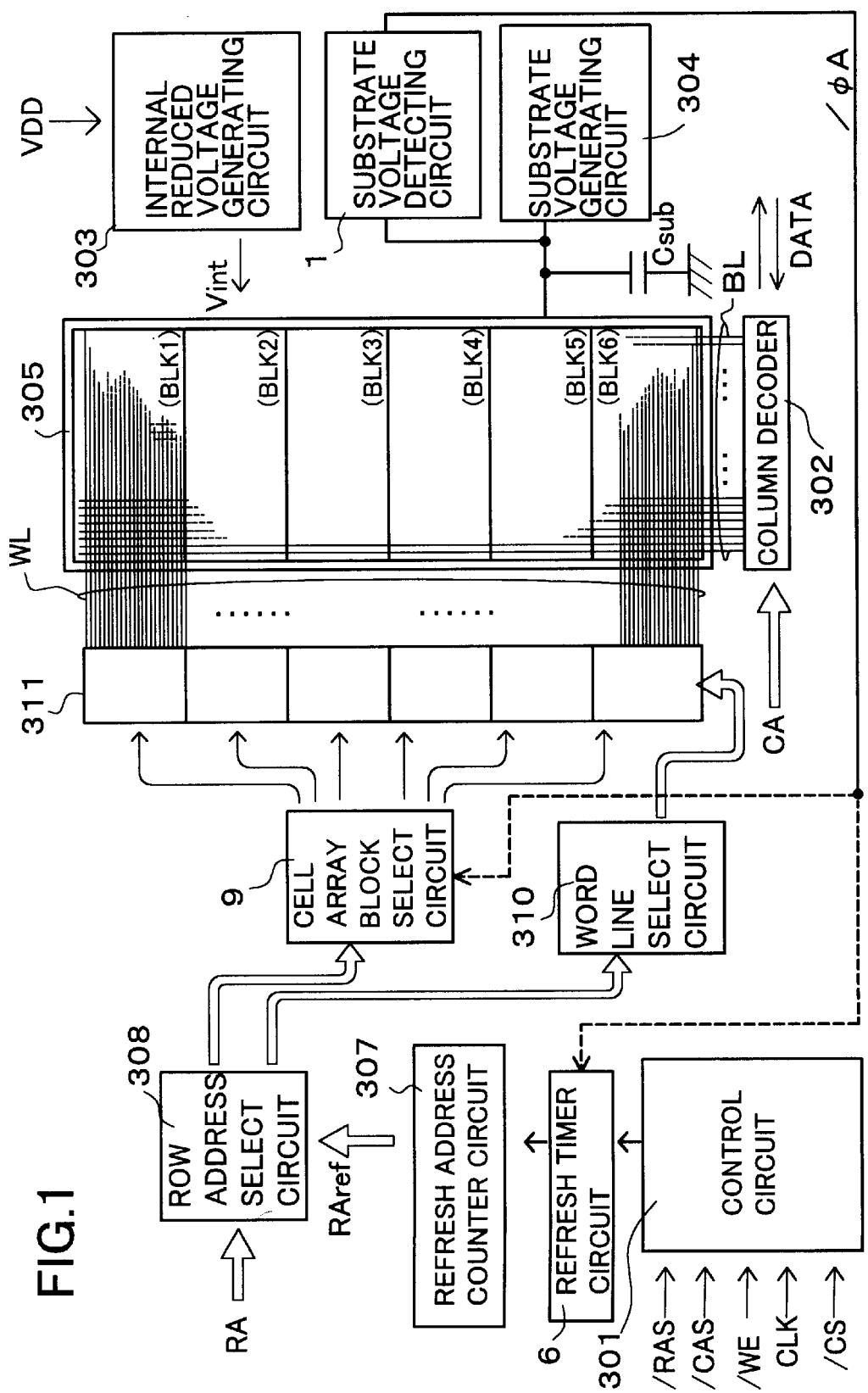
FIG. 1 is a circuit block diagram of a semiconductor memory of a first embodiment embodying the present invention.

FIG. 1 shows a semiconductor memory of a first embodiment embodying the present invention. In a structure shown in FIG. 1, components similar to those described in the description of relevant art are designated with the same symbols, and explanation thereof will be omitted. In a DRAM of the present embodiment, when an operation mode is shifted to a data retention mode, a power supply voltage VDD is lowered then a normal operation voltage, but at that time, a capacity component of a substrate portion in a memory cell array region is large, and a leak current from a substrate is small. Therefore, a substrate voltage VBB can not change with high follow ability to the reduction of the power supply voltage VDD, unbalance is generated between both the voltage values, and a period during which the electric charge retention ability of the memory cell is worsened is generated. Thereupon, the electric charge retention ability of the memory cell is improved by detecting a variation in substrate voltage VBB caused by reduction of the power supply voltage VDD, thereby shortening the cycle of a refresh operation during the variation period, or by refreshing more memory cells than conventional manner at the same time. In FIG. 1, a substrate voltage detecting circuit 1 always monitors the power supply voltage VDD and the substrate voltage VBB, detects a variation in substrate voltage VBB caused by reduction of the power supply voltage VDD, and outputs a low pulse (/ØA) for a given period. /ØA is input to a refresh timer circuit 6, a cell array block selecting circuit 9 or a word line selecting circuit 10. During the period of a low pulse of /ØA, a cycle of refresh operation is shortened.

Figure 2:
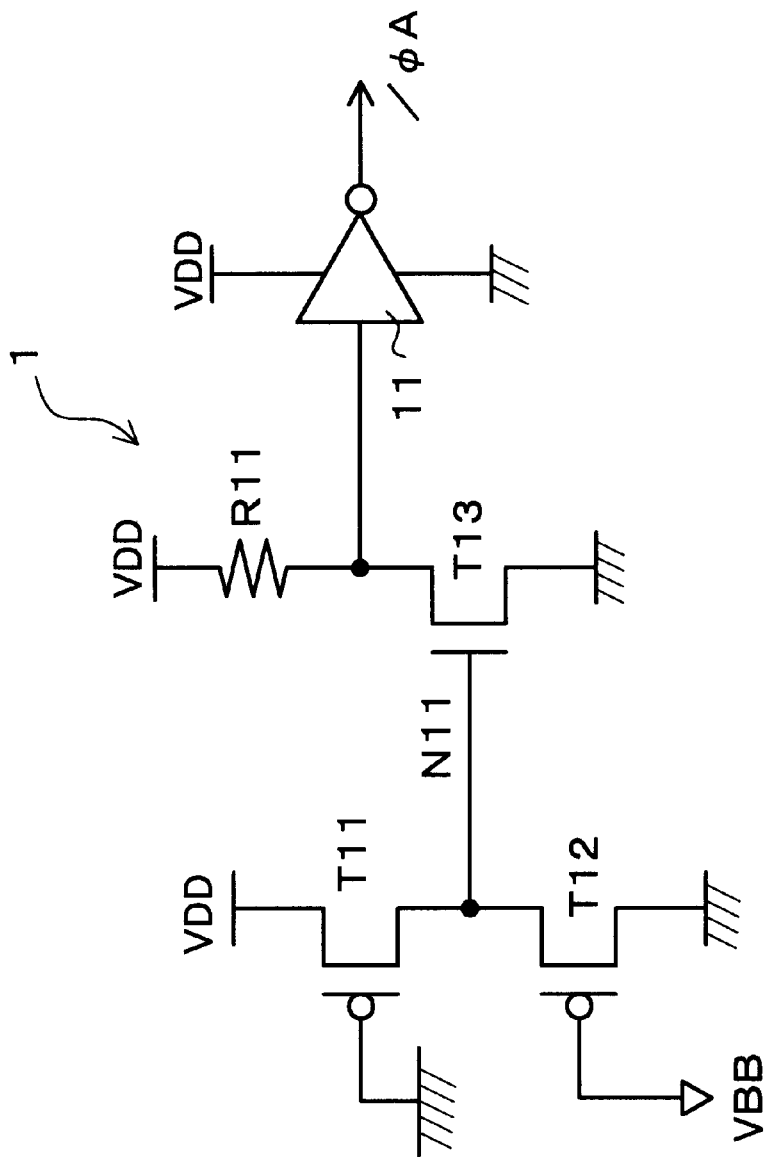
FIG. 2 shows a concrete example of a substrate voltage detecting circuit used in the first embodiment.

FIG. 2 shows the substrate voltage detecting circuit 1 which is a concrete example used in this embodiment. In a PMOS transistor T11, if its source is connected to the power supply voltage VDD and its gate is connected to a ground potential, the voltage of the power supply voltage VDD is biased between the gate and the source and the transistor T11 is turned ON. In a PMOS transistor T12, its drain is connected to a ground potential and its gate is connected to the substrate voltage VBB and is turned ON. A voltage which is obtained by dividing the power supply voltage VDD is output to a node N11 between the drain of the PMOS transistor T11 and the source of the PMOS transistor T12. A voltage of the node N11 is input to a gate of an NMOS transistor T13. In the NMOS transistor T13, its drain is connected to a resistor R11 and input to an inverter 11. The other end of the resistor R11 is connected to the power supply voltage VDD.

As described above, in the case of the PMOS transistor T11, voltage of the power supply voltage VDD is biased between the gate and the source and the transistor T11 is turned ON for flowing a drain current in accordance with a voltage of the drain node N11 of the PMOS transistor T11. Since this current flows to the ground potential which is a source through the PMOS transistor T12, a voltage suitable for a condition for flowing this current to the gate voltage VBB of the PMOS transistor T12 is self-biased as a voltage of the node N11 to keep balance. That is, the PMOS transistors T11 and T12 function as active resistor components, and N11 which is an intermediate node outputs a voltage obtained by dividing the power supply voltage VDD.

Figure 3:
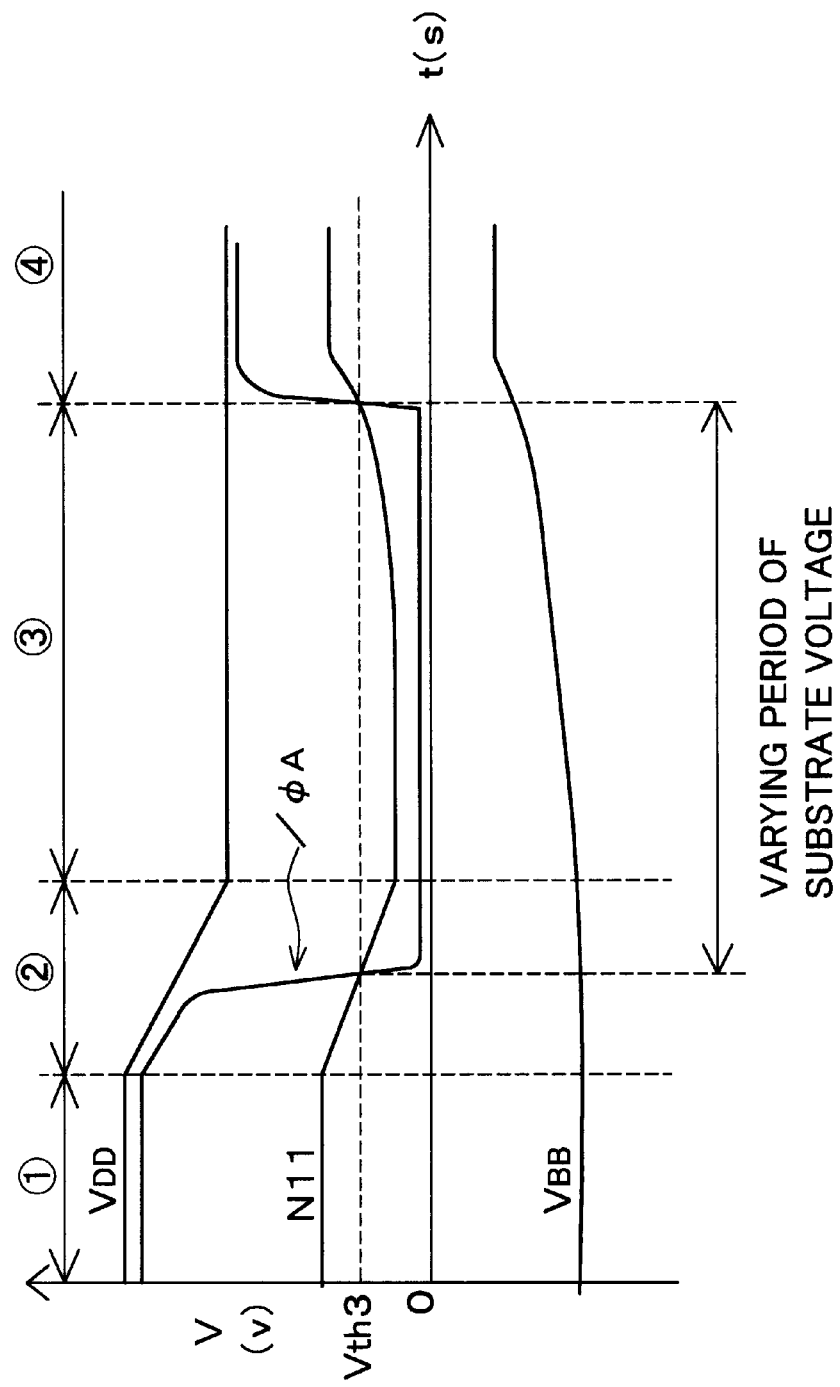
FIG. 3 is a time chart for explaining an operation of the concrete example of the substrate voltage detecting circuit used in the first embodiment.

Next, a concrete circuit operation will be explained with reference to a time chart in FIG. 3. In FIG. 3, a region ① is a normal operating state. The power supply voltage VDD is set high, the substrate voltage VBB is set deep, the voltage of the node N11 set in this state is greater than a threshold voltage Vth3 of the NMOS transistor T13, the NMOS transistor T13 is ON, and a drain node is pulled to low level. Therefore, an output /ØA of the inverter 1 is kept at high level. In a region ②, a state where an operation mode is shifted to the data retention mode is shown. Due to this shift, the power supply voltage VDD starts lowering, and the substrate voltage VBB is changed to shallower, but rise of substrate voltage VBB does not follow the reduction of the power supply voltage VDD due to the capacity component of the substrate and the voltage variation is slow. Therefore, as compared with the reduction of the power supply voltage VDD, the rise of the substrate voltage VBB can not follow, an effective voltage of the gate of the PMOS transistor T12 is low with respect to reduction in drain current caused by reduction in voltage between the gate and the source of the PMOS transistor T11, and since this current flows, the voltage of the node N11 is lowered. If the voltage of the N11 keeps reducing lower than the threshold value of the NMOS transistor T13, the NMOS transistor T13 is turned OFF, the output /ØA of the inverter is inverted to a low level. In a region ③, a state where the substrate voltage VBB is lower than a predetermined voltage value with respect to the reduction of the power supply voltage VDD is continued, and the output /A of the inverter is maintained at low level. In a region ④, after the power supply voltage VDD reduces, the charging of the capacity component of the substrate is advanced and if the substrate voltage VBB is increased, the gate voltage VBB of the PMOS transistor T12 is increased and thus, the same current flows and therefore, the voltage of the node N11 is increased, the NMOS transistor T13 is again turned ON, and the output /ØA of the inverter is again inverted to high level. From the above, a period during which the output /ØA of the inverter is low level is set as a variation period of the substrate voltage VBB.

The substrate voltage detecting circuit 1 shown in FIG. 2 is a circuit which sets the variation period of the substrate voltage VBB by always detecting the power supply voltage VDD and the substrate voltage VBB. As a modification of this circuit, a data retention entry judging circuit 2a (see FIG. 18) shown in a second embodiment which will be described later may be connected in place of the inverter 11 shown in FIG. 2. The variation period of the substrate voltage VBB in this case can be freely set while determined the period shown in FIG. 2 as the limit of the maximum length by a counter circuit 16 constituting the data retention entry judging circuit 2a.

Figure 4:
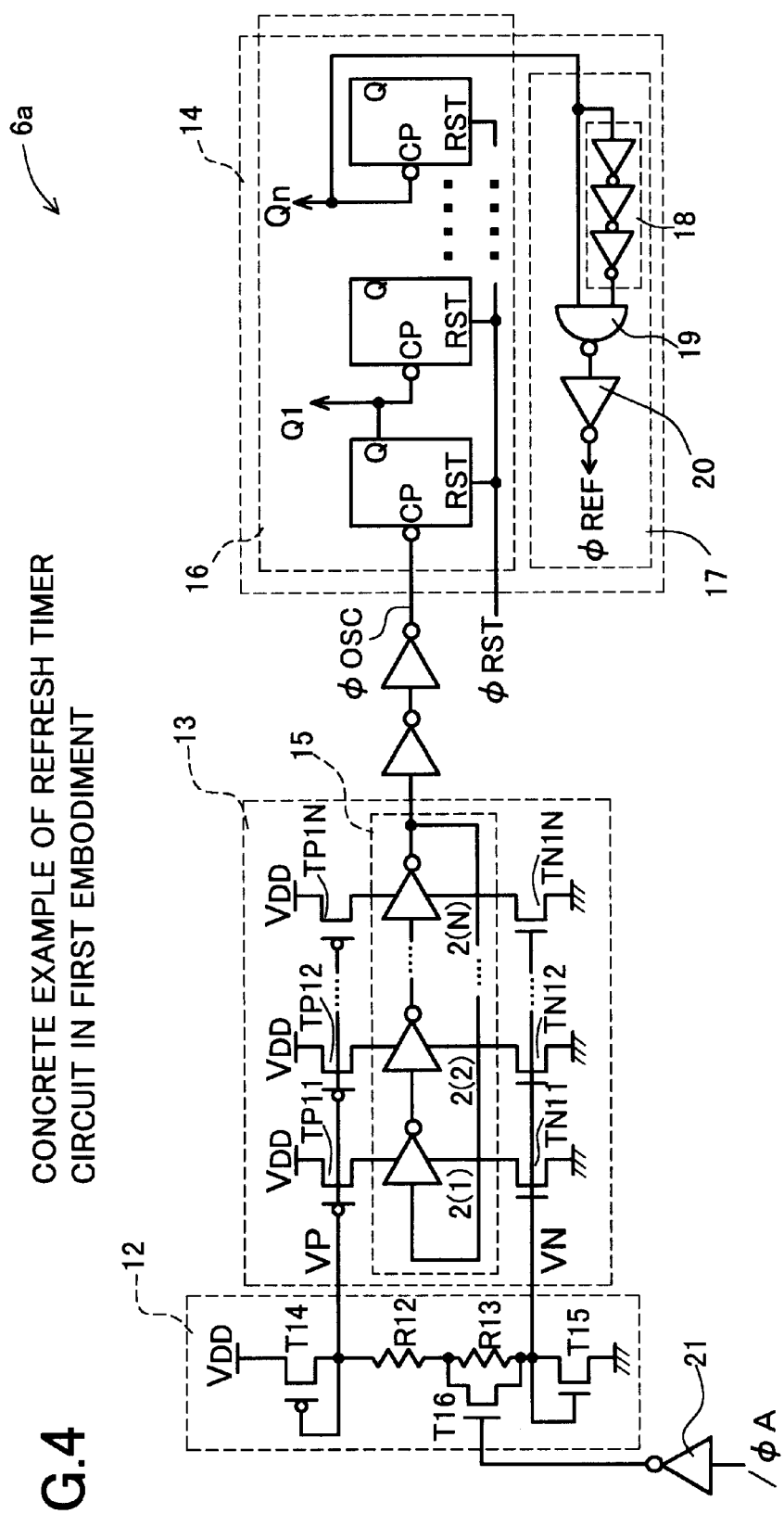
FIG. 4 shows a concrete example of a refresh timer circuit used in the first embodiment.

FIG. 4 shows a refresh timer circuit 6a which is a concrete example used in the present embodiment. This circuit comprises a counter section 14 for generating a refresh pulse ØREF every given times in response to an oscillate signal ØOSC, an oscillator section 13 for supplying the oscillate signal ØOSC to the counter section 14, and an oscillator current limiting circuit 12 for controlling a driving current to be supplied to an oscillator circuit 15 of the oscillator section 13.

As the counter circuit 16 of the counter section 14, a counter of asynchronous type is shown as a standard counter. An output signal of the oscillator circuit 15 of the oscillator 13 is adjusted in waveform formation and driving ability through a two-stage inverter, and is input to the counter circuit 16 as the oscillate signal ØOSC, and the counter circuit 16 counts the oscillate signal ØOSC. If the counter circuit 16 counts the oscillate signal ØOSC $2_{(n-1)}$ times, an output signal Qn of the counter circuit 16 is input to a pulse generating circuit 17. This output signal Qn is directly input to one of terminals of an NAND gate 19, and is input to the other terminal of the NAND gate 19 as an inverted signal through a delay element 18 such as an odd-number stage inverter. When the counter circuit 16 completes the predetermined count operation and outputs a high level signal Qn, the NAND gate 19 outputs a negative pulse in accordance with delay time of the delay element 18, the signal is inverted by an inverter 20, and a positive refresh pulse ØREF is output. In this concrete example, a standard counter is constituted by the asynchronous counter circuit 16, but it is needless to say that another counter circuit such as a synchronous counter circuit or an analogue timer can be used only if the circuit has the same function. If NOR gate is used in place of the NAND gate 19, it is needless to say that the pulse generating circuit 17 can generate pulse by obtaining opposite signal transition, and if combination of circuits is appropriately selected, various types of structure can be contrived.

The oscillator circuit 15 of the oscillator section 13 has a basic structure in which a predetermined odd number of inverters 2(n) (n. N: odd number) are connected, an output of the last inverter 2(N) is returned to an input of the first inverter 2(1). Further, a drain in each of PMOS transistors TP1n (n. N: odd number) is connected to a power supply terminal of each of constituent inverters 2(n), and a source in each of these transistors is connected to the power supply voltage VDD. A drain in each of the NMOS transistor TN1n (n. N: odd number) is connected to a ground terminal in each of the constituent inverters 2(n), and a source in each of these transistors is connected to a ground potential. Gates of PMOS transistors TP1n are commonly connected as a node VP, and connected to a drain of the PMOS transistor T14 of the oscillator current limiting circuit 12 and also connected to the gate, a source of the PMOS transistor T14 is connected to the power supply voltage VDD, and these PMOS transistors constitute a current mirror circuit. Similarly, gates of the NMOS transistors TN1n are commonly connected as a node VN, and connected to a drain of the NMOS transistor T15 of the oscillator current limiting circuit 12 and also connected to the gate, a source of the NMOS transistor T15 is connected to a ground potential, and these NMOS transistors constitute a current mirror circuit. A common gate node VP of each of the PMOS transistors TP1n is connected to a resistor R12 in the oscillator current limiting circuit 12, the other end of the resistor R12 is connected to a resistor R13, and is connected to a drain of the NMOS transistor T16. The other end of the resistor R13 and a source of the NMOS transistor T16 are connected to the common gate node VN of each of the NMOS transistors TN1n of the oscillator section 13. Further, a gate of the NMOS transistor T16 is connected to an output /ØA of the substrate voltage detecting circuit 1 through the inverter 21. The number of connection stages of the inverter is set so that a predetermined transmit frequency can be obtained, the transmit frequency is finely adjusted by limiting a load driving current of the inverter of the oscillator circuit 15 of the oscillator section 13 by the oscillator current limiting circuit 12.

Figure 5:
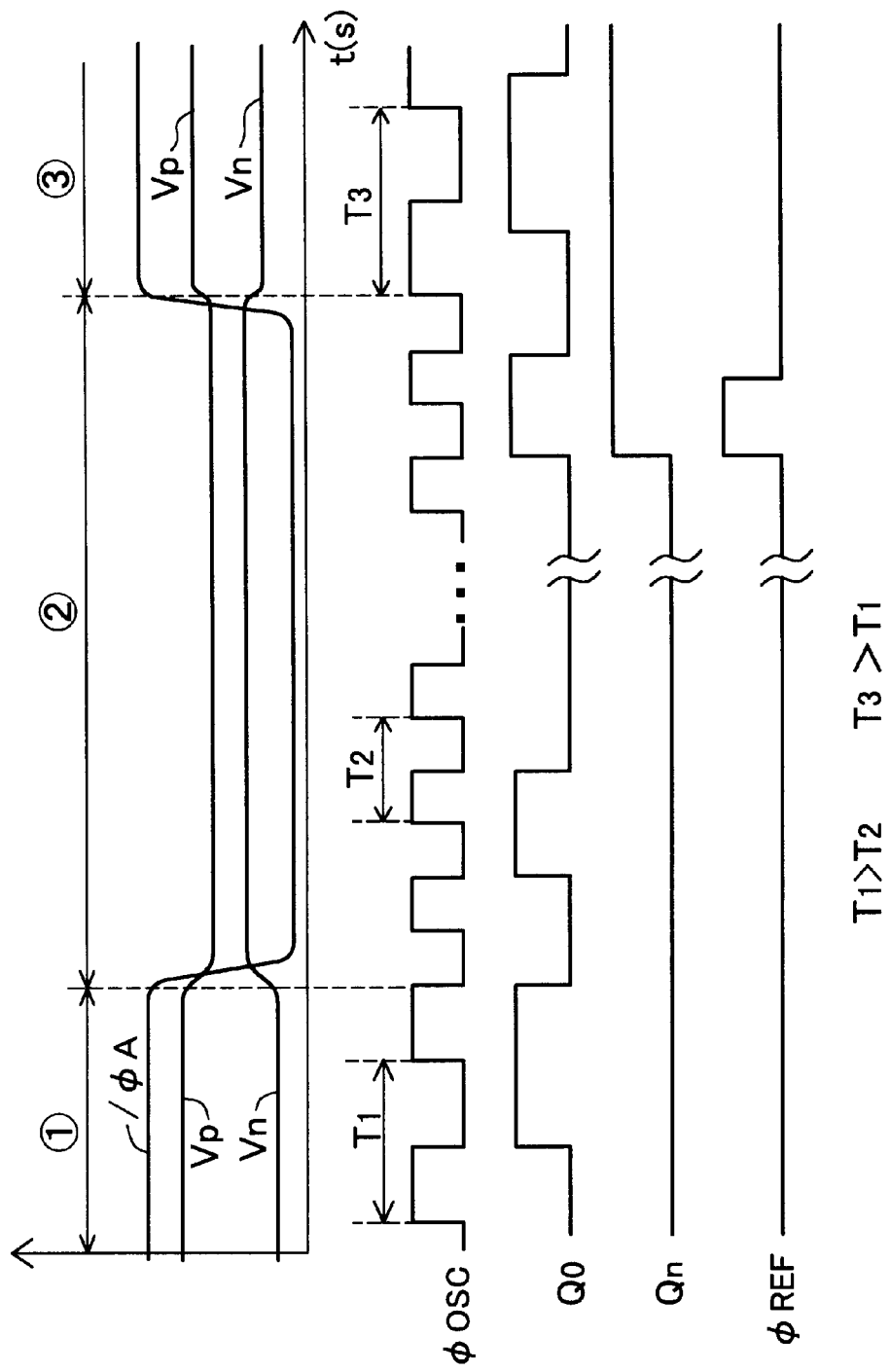
FIG. 5 is a time chart for explaining an operation of a concrete example of the refresh timer circuit used in the first embodiment.

A concrete operation will be explained by FIG. 5. In FIG. 5, a region ① is a normal operating state, /ØA is high level, the gate of the NMOS transistor T16 is kept at low level through the inverter 21 and is OFF. Therefore, the oscillator current limiting circuit 12 divides the power supply voltage VDD by the PMOS transistor T14, the resistors R12 and R13, and the NMOS transistor T15, the node VP is set to relatively high voltage level, and the node VN is set to relatively low voltage level. Voltages between the gates and the sources of the PMOS transistor T14 and the NMOS transistor T15 are suppressed to a low level, and current values of the current mirror circuits is suppressed to a low level. This is a load driving current of each of the inverters of the oscillator circuit 15 and as a result, a cycle T1 of the oscillate signal ØOSC becomes relatively long. The counter section 14 is counted up during this cycle T1, and whenever n-cycle is counted, one time refresh operation is carried out in response to the refresh pulse signal ØREF. Next, a region ② is a state where the operation mode is shifted to the data retention mode, the power supply voltage VDD is lowered, and /ØA is inverted to low level, the NMOS transistor T16 is ON, and the resistor R13 is short-circuited. The oscillator current limiting circuit 12 divides the power supply voltage VDD by the PMOS transistor T14, the resistor R12 and the NMOS transistor T15, the node VP is set to relatively lower voltage level than that in the normal state, and the node VN is set to relatively higher voltage level than that in the normal state. With this, voltages of the gates and sources of both the transistors are enhanced as compared with the normal state (region ①), and set current values of both the current mirror circuits become enhanced. Therefore, the load driving current of each of the inverter of the oscillator circuit 15 becomes enhanced, and the oscillator circuit 15 oscillates at cycle T2 (T1>T2) shorter than the normal operating state (region ①). Whenever the oscillate signal ØOSC of the short T2 cycle is counted n times, the refresh operation is carried out one time in response to the refresh pulse signal ØREF. In the drawing, a region ③ is a state where the variation period of the substrate voltage VBB is elapsed, and /ØA is returned to high level, the NMOS transistor T16 is OFF, the resistor R13 again contributes to division of the power supply voltage VDD, and the power supply voltage VDD itself is reduced. Therefore, the voltages between the gates and sources of the PMOS transistor T14 and the NMOS transistor T15 are suppressed to lower than the voltage value in the normal operation state, the load driving current of the inverter of the oscillator circuit 15 becomes minimum, the cycle of the oscillate signal ØOSC becomes T3 (T3>T1, T3>T2). Whenever the oscillate signal ØOSC of the long T3 cycle is counted n times, the refresh operation is carried out one time. Therefore, in the data retention mode, during the variation period of the substrate voltage VBB immediately after the shift, the refresh cycle becomes short, the electric charge retention ability is maintained, and the cycle after the variation period is elapsed is set longer, and the power consumption can be reduced.

Figure 6:
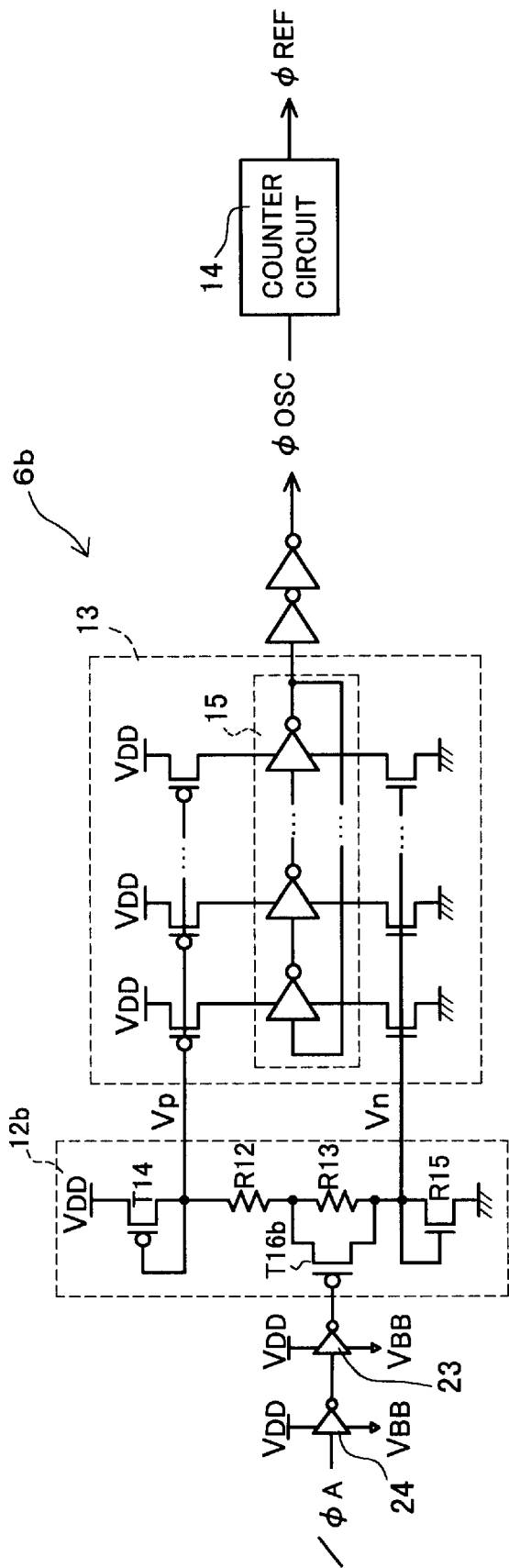
FIG. 6 shows a first modification of the refresh timer circuit used in the first embodiment.

FIG. 6 shows a first modification 6b of the refresh timer circuit. This modification includes the counter section 14 and the oscillator section 13 which are the same as those of the refresh timer circuit 6a shown in FIG. 4. Connected portions of the PMOS transistor T14, the resistor R12 and R13 and the NMOS transistor T15 for dividing the power supply voltage VDD in the oscillator current limiting circuit 12b to limit the inverter load driving current of the oscillator circuit 15 of the oscillator section 13 are also the same.

In this modification, in place of the NMOS transistor T16 and the inverter 21 in the concrete example shown in FIG. 4, as means for short-circuiting both ends of the resistor R13, a source of the PMOS transistor T16b is connected to a node between the resistors R12 and R13, and a drain of the PMOS transistor T16b is connected to a node VN which is a connected point between the other end of the resistor R13 and a drain of the NMOS transistor T15. Further, an output of the inverter 23 in which a negative power supply terminal is connected to the substrate voltage VBB is connected to the gate of the PMOS transistor T16b, an output of the inverter 24 in which a negative power supply terminal is connected to the substrate voltage VBB is connected to the input of the inverter 23, and an input of the inverter 24 is connected to the output /ØA of the substrate voltage detecting circuit 1.

Figure 7:
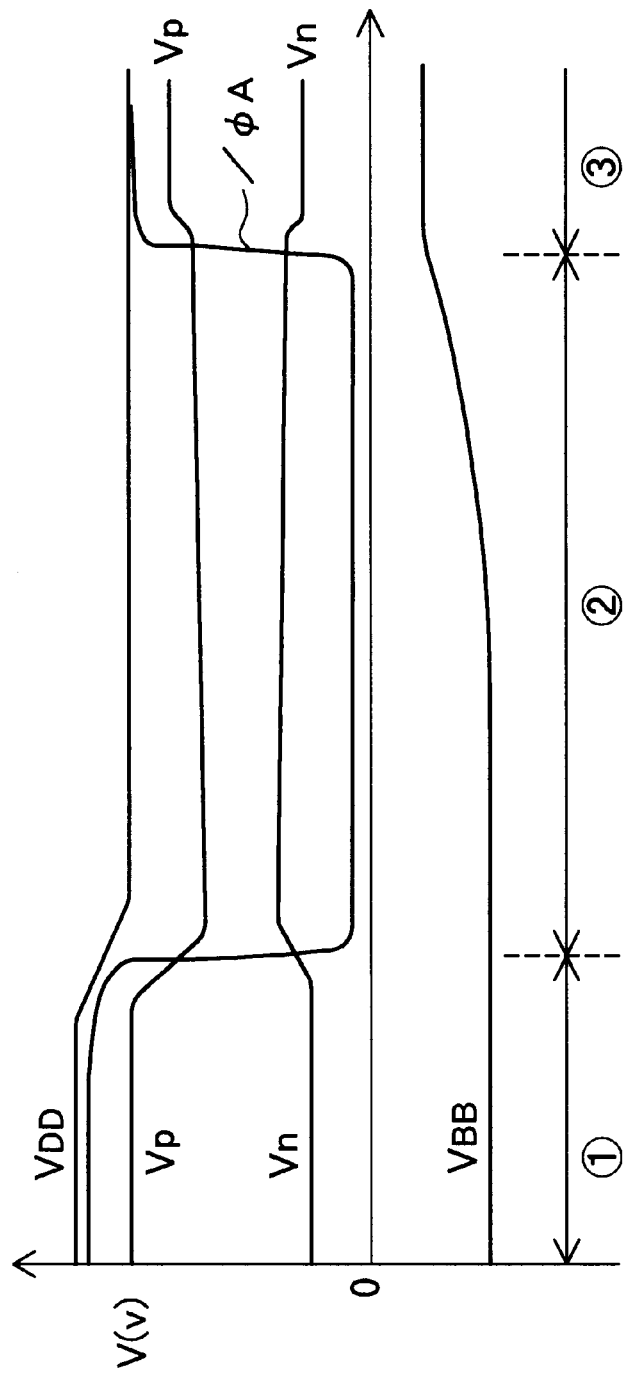
FIG. 7 is a time chart for explaining an operation of the first modification of the refresh timer circuit used in the first embodiment.

Next, the operation of this modification will be explained with reference to FIG. 7. The operation in a normal operating state is shown in a region ① in FIG. 7, and the same refresh cycle as that in the concrete example shown in FIG. 4 is counted. A region ② in FIG. 7 is a period during which the operation mode is shifted to the data retention mode and /ØA corresponding to varying time of the substrate voltage VBB is low level, outputs of the inverters 24 and 23 are inverted, the gate of the PMOS transistor T16b is lowered to the voltage level of the substrate voltage VBB, and the PMOS transistor T16b is turned ON. The resistor R13 is short-circuited, the voltage of the node VP is reduced as in the concrete example shown in FIG. 4, the voltage of the node VN is increased, the voltage between the gates and sources of the PMOS transistor T14 and the NMOS transistor T15 is set great and therefore, the set current value of the current mirror circuits is set great, the load driving current of the inverter of the oscillator circuit 15 becomes great, the oscillator section 13 oscillates with short cycle, and the refresh operation is also carried out with short cycle.

Here, the gate voltage when the PMOS transistor T16b is turned ON is substrate voltage VBB. The substrate voltage VBB gradually becomes shallow immediately after the power supply voltage VDD is reduced (see the region ② in FIG. 7), and the substrate voltage VBB is converged to a voltage value set by the power supply voltage VDD (see the region ③ in FIG. 7). Therefore, the lowest voltage is applied to the gate of the PMOS transistor T16b immediately after the power supply voltage VDD is reduced, a conductance of the PMOS transistor T16b becomes maximum, the both ends of the resistor R13 are connected to a minimum resistance component and then, the conductance is gradually reduced and the resistance component becomes great. That is, the node VP assumes the smallest voltage and the node VN assumes the greatest voltage immediately after the power supply voltage VDD is reduced (see the region ② in FIG. 7), the voltages between the gates and sources of the PMOS transistor T14 and the NMOS transistor T15 setting currents of the current mirror circuits are increased, the great current driving the inverter load of the oscillator circuit 15 is allowed to flow, thereby shortening the refresh cycle and the substrate voltage VBB becomes shallow, and when the unbalance between the substrate voltage VBB and the power supply voltage VDD is restored, the voltage of the node VP is increased and the voltage of the node VN is reduced (see the region ② in FIG. 7), the set current value is reduced, and a cycle shortening operation is loosened. This is an operation not shortening the refresh cycle more than necessary by adjusting in a self-biasing manner within the varying period of the substrate voltage VBB, a refresh cycle suitable for the electric charge retention ability of the memory cell can be obtained, and wasteful current consumption caused by the refresh operation can be reduced. When the varying time of the substrate voltage VBB is elapsed and /ØA is returned to high level (see the region ③ in FIG. 7), the PMOS transistor T16b is again turned OFF, but since the power supply voltage VDD at that time is reduced, the voltage of the node VP is increased as compared to that before the power supply voltage VDD is reduced, and the voltage of the node VN is reduced as compared to that before the power supply voltage VDD is reduced, the refresh cycle becomes long as compared to that before the power supply voltage VDD is reduced, and the current consumption in the data retention mode can be reduced.

Figure 8:
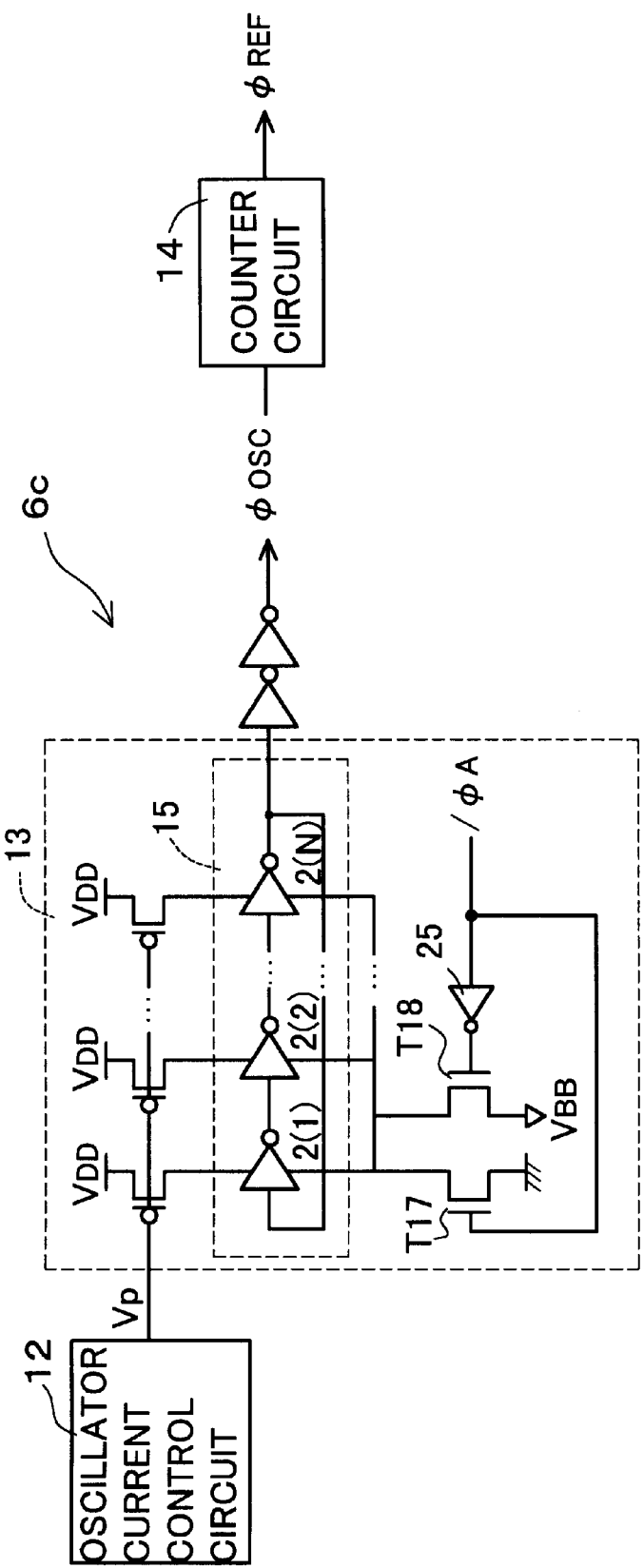
FIG. 8 shows a second modification of the refresh timer circuit used in the first embodiment.

FIG. 8 shows a second modification 6c of the refresh timer circuit. This modification also includes the counter section 14 and the oscillator current limit circuit 12 which are the same as those shown in FIG. 4, and further includes the oscillator circuit 15 of the oscillator section 13. The current supply to the power supply terminal of the oscillator circuit 15 is carried out by limiting the load driving current as in FIG. 4. Further, drains of NMOS transistors T17 and T18 are connected to ground terminals of the inverters 2(n) of the oscillator circuit 15, a source of the NMOS transistor T17 is connected to the ground potential, and a source of the NMOS transistor T18 is connected to the substrate voltage VBB. An output /ØA of the substrate voltage detecting circuit 1 is input to the gate of the NMOS transistor T17, and a signal in which /ØA is inverted is input to the gate of the NMOS transistor T18 through the inverter 25.

Figure 9:
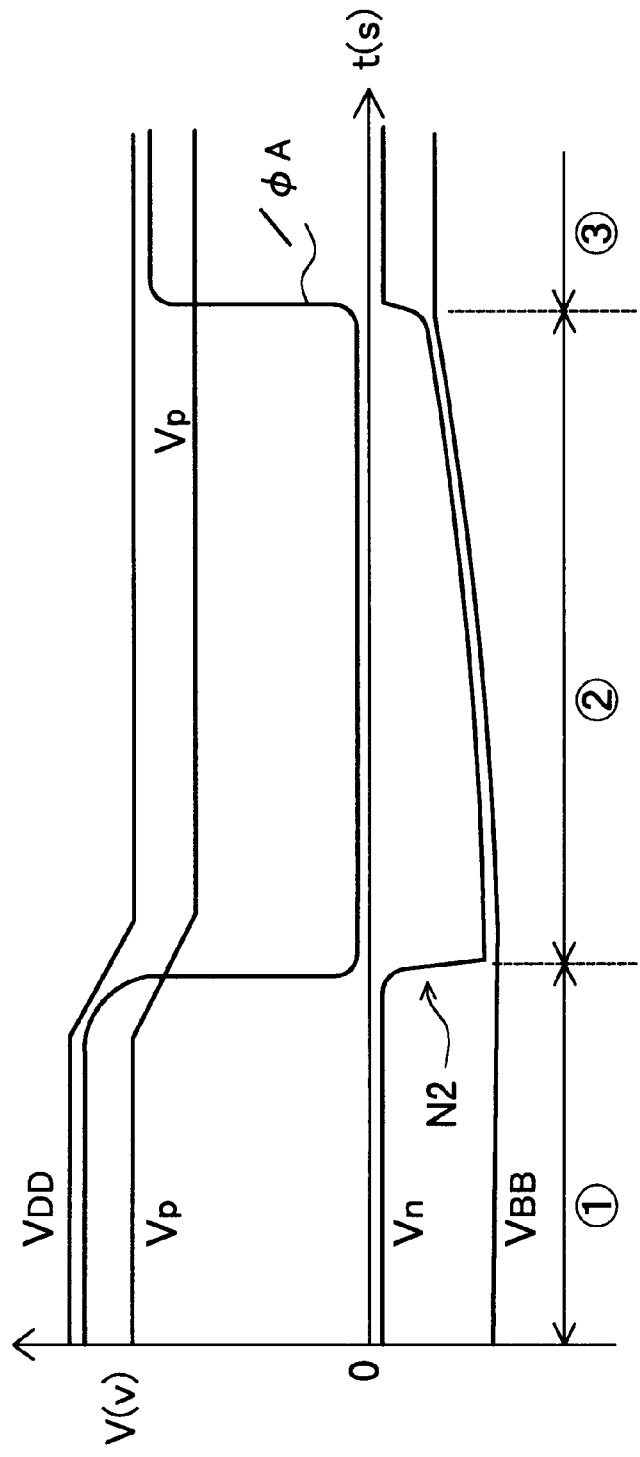
FIG. 9 is a time chart for explaining an operation of the second modification of the refresh timer circuit used in the first embodiment.

Before and after the varying period of the substrate voltage VBB, i.e., during a period when /ØA is high level, the NMOS transistor T17 is turned ON, the NMOS transistor T18 is turned OFF, the ground terminals of the inverters 2(n) of the oscillator circuit 15 are connected to ground potential through the NMOS transistor T17. The power supply terminals of the inverters 2(n) of the oscillator circuit 15 are of the same structure as that of the above-described concrete example (see FIGS. 4 and 5), and the current is supplied with the same driving ability. Therefore, in the operation in this modification when /ØA is high level, compare to the example shown in FIG. 4 driving current to the ground terminals is not limited, but if the driving ability of the inverters 2(n) is adjusted, substantially the same driving ability can be obtained, and since the power supply terminal side has the same structure, the same operation is obtained (see the regions ① and ③ in FIG. 9).

When /ØA becomes low level, the NMOS transistor T17 is turned OFF, the NMOS transistor T18 is turned ON, the ground terminals of the inverters 2(n) of the oscillator circuit 15 are connected to the substrate voltage VBB through the NMOS transistor T18. Since the negative power supply voltage of each of the inverters 2(n) of the oscillator circuit 15 is reduced and the applied driving voltage is increased, and also since the load driving circuit of the power supply terminal is increased, the driving ability is increased, the oscillating cycle of the oscillator section 13 is shortened, and the refresh cycle is also shortened. Further, the negative power supply is the substrate voltage VBB which becomes gradually shallower with time (see region ② in FIG. 9), and the load driving current is reduced in a self-biasing manner. That is, as in the first modification (see FIGS. 6 and 7), during the refresh cycle shortening period in the varying period of the substrate voltage VBB, and this is an operation not shortening the refresh cycle more than necessary by adjusting in a self-biasing manner, and wasteful current consumption caused by the refresh operation can be reduced.

As a limiting method of the load driving current in this modification, it is possible to use the method of the first modification shown in FIG. 6.

Figure 10:
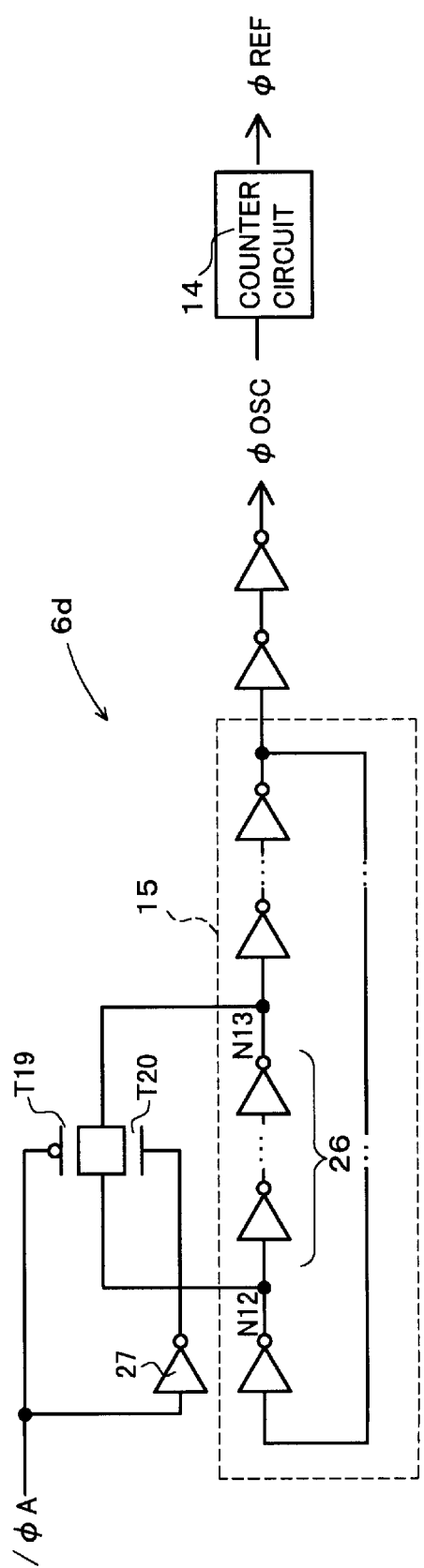
FIG. 10 shows a third modification of the refresh timer circuit used in the first embodiment.

FIG. 10 shows a third modification 6d of the refresh timer circuit. This modification includes the counter section 14 and the oscillator circuit 15 of the oscillator section 13 which are the same as those of the refresh timer circuit shown in FIG. 4. Further, sources and drains of a PMOS transistor T19 and an NMOS transistor T20 are connected to each other to form a switch circuit. On the end of this switch circuit is connected to an input terminal N12 of an inverter array 26 of the oscillator circuit 15, the other end is connected to an output terminal N13 of the inverter array 26 of the oscillator circuit 15, an output /ØA of the substrate voltage detecting circuit 1 is connected to the gate of the PMOS transistor T19 constituting the switch circuit, and /ØA is connected to the gate of the NMOS transistor T20 through an inverter 27.

If the substrate voltage detecting circuit 1 detects a varying period of the substrate voltage VBB and the /ØA becomes low level, the switch circuit is turned ON to short-circuit the node N12 and the node N13 of the oscillator circuit 15 to bypass the inverter array 26. Therefore, the number of stages of the inverter array constituting the oscillator circuit 15 are decreased, the oscillating cycle of the oscillator circuit 15 is shortened and as a result, the refresh cycle is shortened. If the varying period is elapsed and the /ØA is inverted to high level, the inverter array 26 is returned to the original state, and the cycle is returned to the original state.

Figure 11:
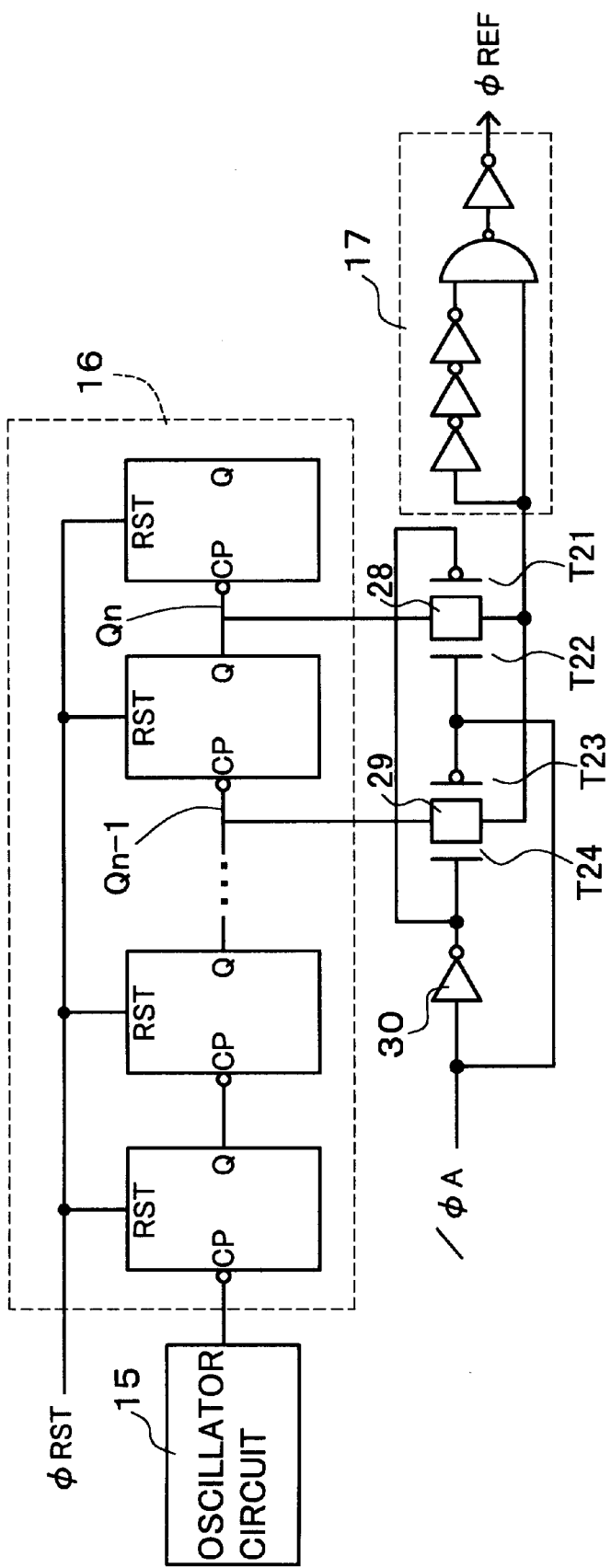
FIG. 11 shows a fourth modification of the refresh timer circuit used in the first embodiment.

FIG. 11 shows a fourth modification 6e of the refresh timer circuit. This modification includes a counter circuit 16 which is the same as the counter section 14 of the refresh timer circuit shown in FIG. 4, and the pulse generating circuit 17 and the oscillator circuit 15. Further, terminals of sources and drains of a PMOS transistor T21 and an NMOS transistor T22 are connected to each other to form a switch circuit 28, one end thereof is connected to a node Qn of the counter circuit 16, and the other end is connected to an input terminal of the pulse generating circuit 17. In addition, terminals of sources and drains of a PMOS transistor T23 and an NMOS transistor T24 are connected to each other to form a switch circuit 29, one end thereof is connected to a node Qn-1 of the counter circuit 16, and the other end is connected to an input terminal of the pulse generating circuit 17. Here, the node Qn-1 of the counter circuit 16 is a bit output terminal lower than the node Qn, and is one bit lower in FIG. 11. The gates of the NMOS transistor T22 and the PMOS transistor T23 are connected to the output /ØA of the substrate voltage detecting circuit 1, gates of the PMOS transistor T21 and the NMOS transistor T24 are connected to the /ØA through an inverter 30.

When the /ØA is high before and after the varying period of the substrate voltage VBB, the gate of the PMOS transistor T23 in the switch circuit is high level, the gate of the NMOS transistor T24 is low level, the switch circuit 29 is OFF, the gate of the PMOS transistor T21 is low level, the gate of the NMOS transistor T22 is high level, and the switch circuit 28 is turned ON. Therefore, the refresh operation is carried out with a cycle counted by the bit of the node Qn of the counter circuit 16.

If the /ØA becomes low level during the varying period of the substrate voltage VBB, since the levels of the gate voltages of the switch circuits 28 and 29 are inverted, the switch circuit 28 is turned OFF and the switch circuit 29 is turned ON. The node Qn-1 of the counter circuit 16 is connected to the pulse generating circuit 17. Since the Qn-1 is lower than Qn, the count cycle is shortened, and the refresh cycle is shortened. If the varying period is elapsed and the /ØA is inverted to high level, the connection of the counter output to the pulse generating circuit 17 is returned to Qn, and the cycle is returned to the original state.

Figure 12:
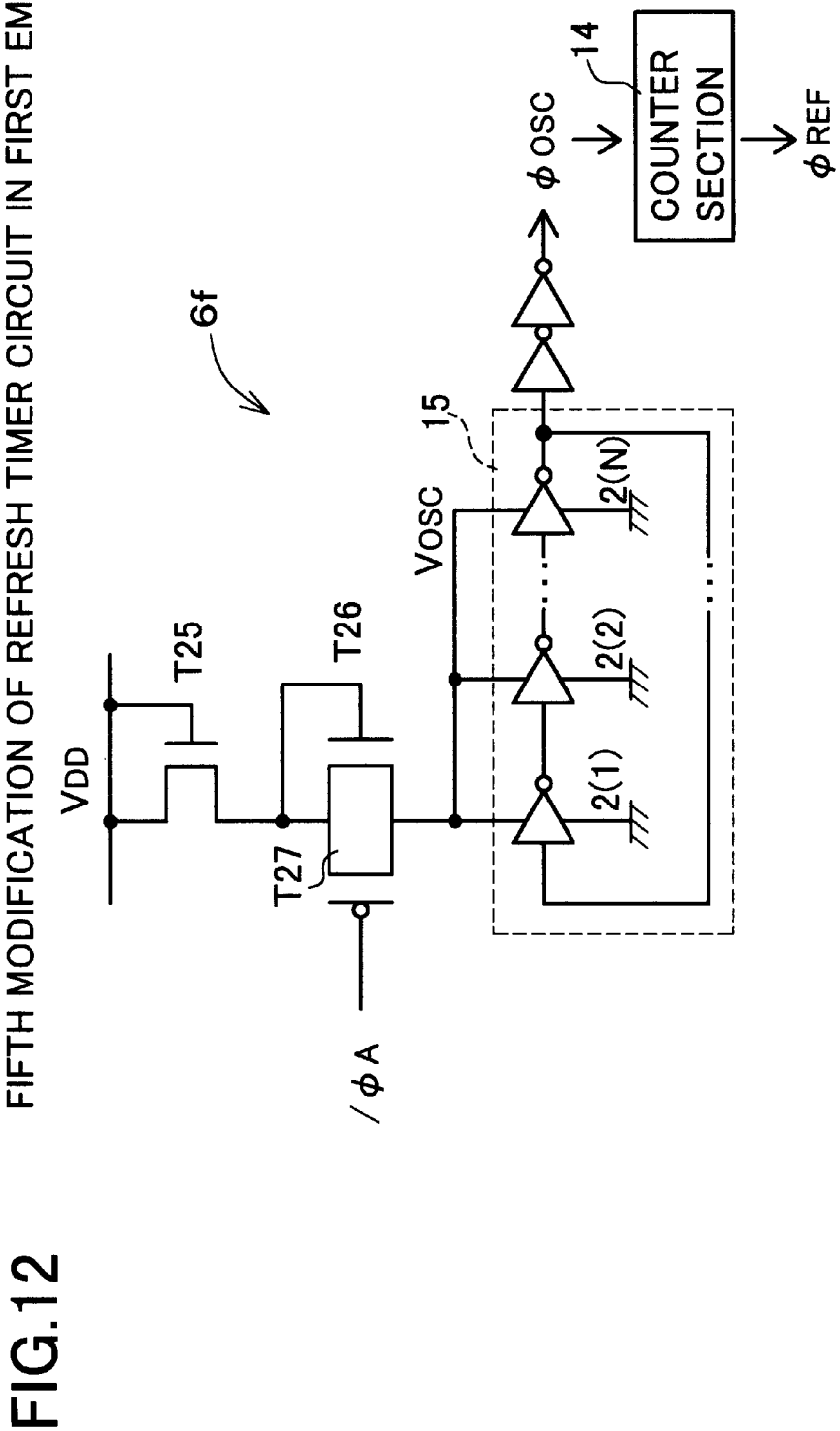
FIG. 12 shows a fifth modification of the refresh timer circuit used in the first embodiment.

FIG. 12 shows a fifth modification 6f of the refresh timer circuit. This modification includes a counter section 14 of and the oscillator circuit 15 of the refresh timer circuit 6a in FIG. 4. A drain and a gate of an NMOS transistor T25 are connected to the power supply voltage VDD, a source is connected to a drain and a gate of an NMOS transistor T26 and connected to a source of a PMOS transistor T27. Further, a source of the NMOS transistor T26 and a drain of the PMOS transistor T27 are connected to each other and to a power supply terminal VOSC of As each of the inverters 2(n) of the oscillator circuit 15. Further, the /ØA which is an output of the substrate voltage detecting circuit 1 is connected to the gate of the PMOS transistor T27.

Figure 13:
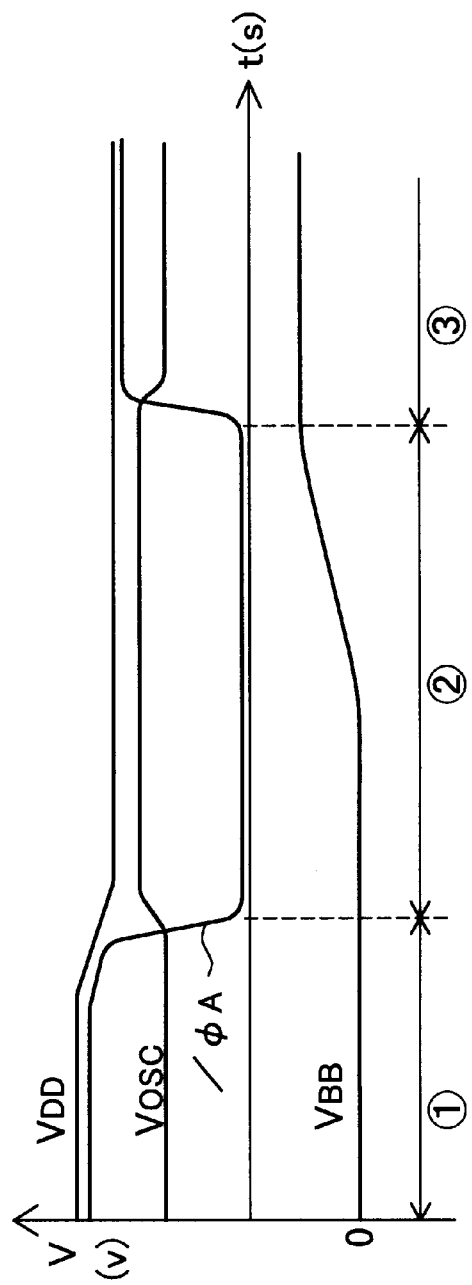
FIG. 13 is a time chart for explaining an operation of the fifth modification of the refresh timer circuit used in the first embodiment.

When the /ØA is high level before and after the varying period of the substrate voltage VBB (see regions ① and ③ in FIG. 13), the gate of the PMOS transistor T27 is high level, and the PMOS transistor T27 is OFF. Therefore, the power supply voltage VDD is connected to the power supply terminal VOSC of each of the inverters 2(n) of the oscillator circuit 15 through the NMOS transistor T25 and the NMOS transistor T26. The connection of each of the NMOS transistors is a so-called diode connection, and a voltage which is lower by a voltage determined by diode characteristic of each of the NMOS transistors in accordance with power supply current is applied to the power supply terminal VOSC of each of the inverters 2(n) of the oscillator circuit 15 (see regions ① and ③ in FIG. 13).

If the /ØA becomes low level during the varying period of the substrate voltage VBB (see region ② in FIG. 13), the gate of the PMOS transistor T27 becomes low level, and the PMOS transistor T27 is ON. Therefore, the source and drain of the NMOS transistor T26 which is diode-connected is short-circuited, and reduced voltage generated in this portion disappears. Therefore, it is possible to reduce the reduction of the power supply voltage VDD in the power supply terminal VOSC of each of the inverters 2(n) of the oscillator circuit 15 (see region ② in FIG. 13), and the refresh cycle can be shortened.

Figure 14:
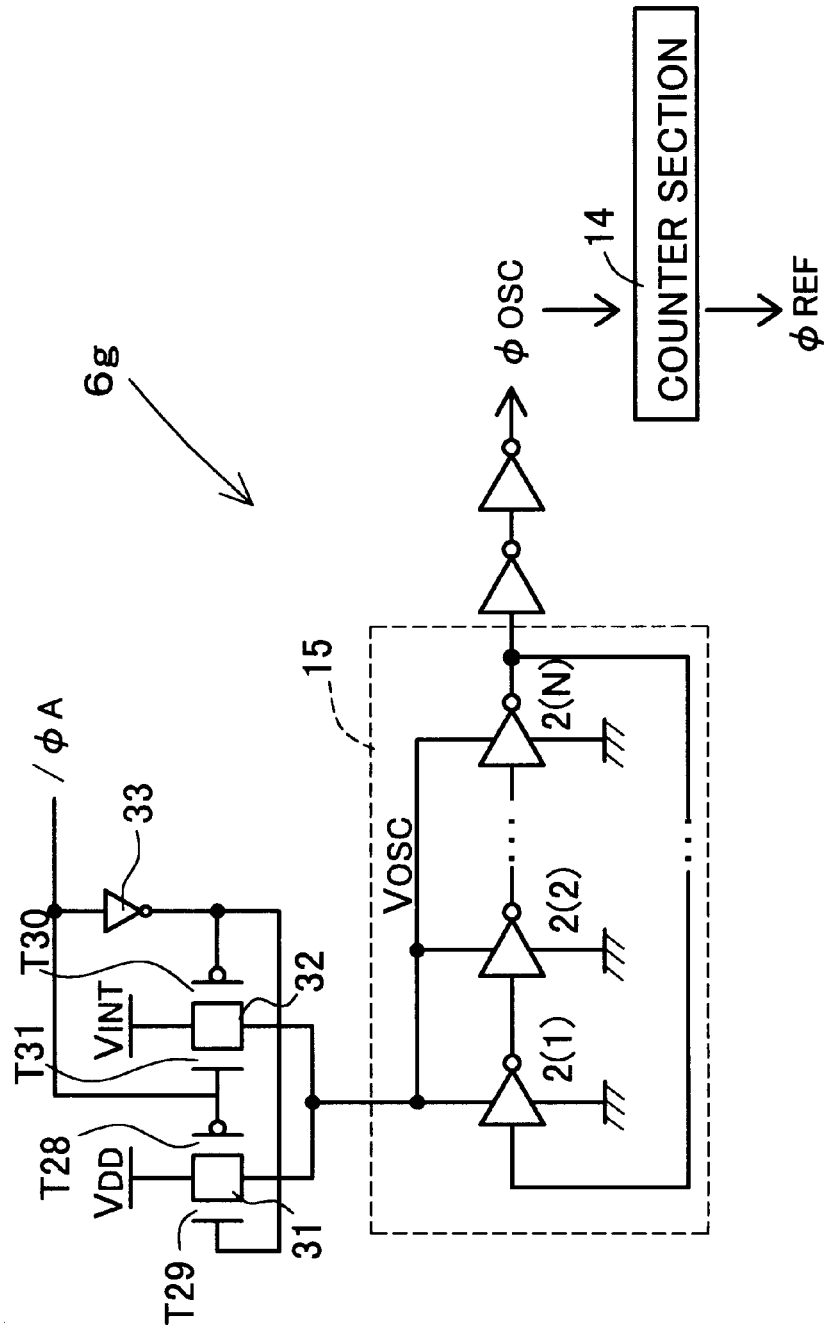
FIG. 14 shows a sixth modification of the refresh timer circuit used in the first embodiment.

FIG. 14 shows a sixth modification 6g of the refresh timer circuit. This modification includes a counter section 14 of and the oscillator circuit 15 of the refresh timer circuit 6a in FIG. 4. Terminals of sources and drains of a PMOS transistor T28 and an NMOS transistor T29 are connected to each other to form a switch circuit 31, one end thereof is connected to the power supply voltage VDD, and the other end is connected to the power supply terminal VOSC of each of the inverters 2(n) of the oscillator circuit 15. Further, terminals of sources and drains of a PMOS transistor T30 and an NMOS transistor T31 are connected to each other to form a switch circuit 32, one end thereof is connected to an internal reduced voltage Vint, and the other end is connected to the power supply terminal VOSC of each of the inverters 2(n) of the oscillator circuit 15. Gates of the PMOS transistor T28 and the NMOS transistor T31 are connected to the output /ØA of the substrate voltage detecting circuit 1, and gates of the NMOS transistor T29 and the PMOS transistor T30 are connected to the /ØA through an inverter 33. Here, the internal reduced voltage Vint is lower than the power supply voltage VDD, and is used as the power supply voltage VDD in the internal circuit by lowering the external supply voltage in the DRAM with the progress of the process technology.

Figure 15:
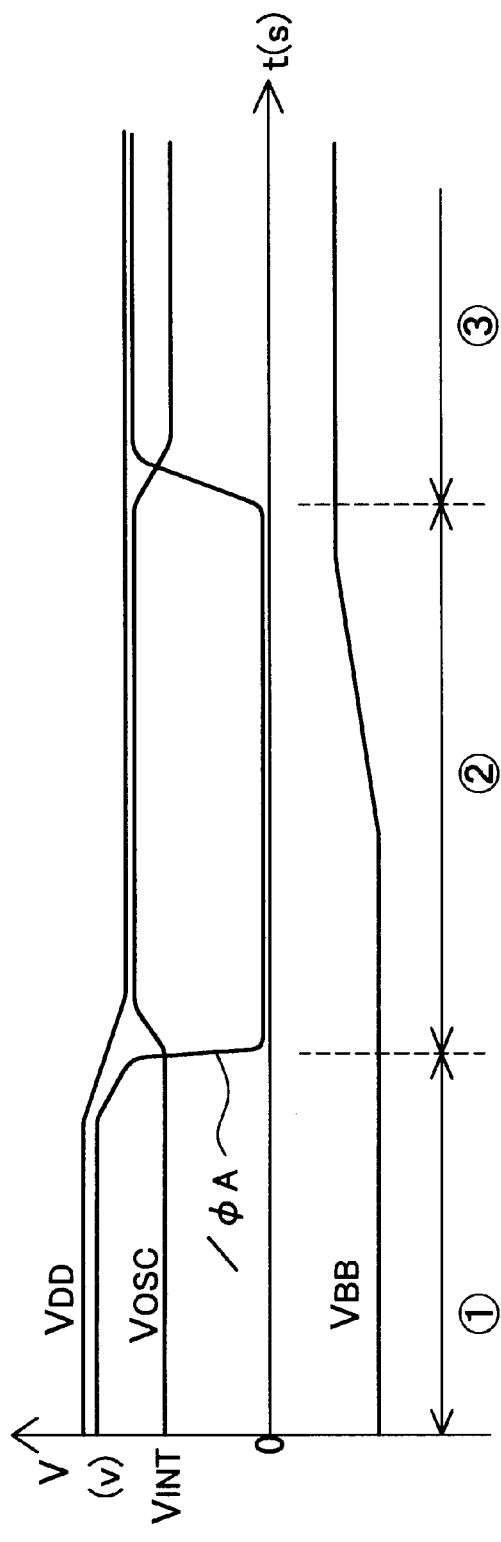
FIG. 15 is a time chart for explaining an operation of the sixth modification of the refresh timer circuit used in the first embodiment.

When the /ØA is high level before and after the varying period of the substrate voltage VBB (see regions ① and ③ in FIG. 15), the gate of the PMOS transistor T28 is high level, the gate of the NMOS transistor T29 is low level, the switch circuit 31 is OFF, the gate of the PMOS transistor T30 is low level, the gate of the NMOS transistor T31 is high level, and the switch circuit 32 is ON. Therefore, the internal reduced voltage Vint is applied to the power supply terminal VOSC of each of the inverters 2(n) of the oscillator circuit 15 (see regions ① and ③ in FIG. 15).

If the /ØA becomes low level during the varying period of the substrate voltage VBB, since the gate voltages of the switches 31 and 32 are inverted, the switch circuit 31 is turned ON and the switch circuit 32 is turned OFF. Therefore, the power supply voltage VDD is applied to the power supply terminal VOSC of each of the inverters 2(n) of the oscillator circuit 15 (see region ② in FIG. 15). During this period, the applied power supply voltage VDD becomes great, the oscillating cycle of the oscillator circuit 15 is shortened and as a result, the refresh cycle is shortened.

Figure 16:
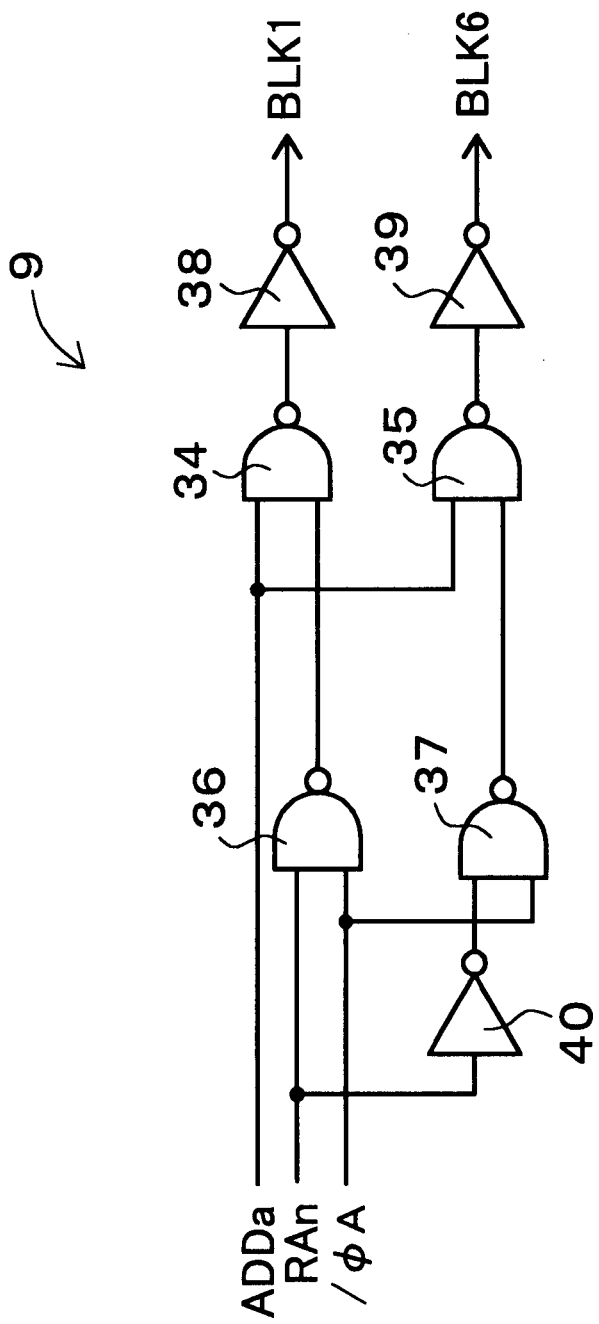
FIG. 16 shows a seventh modification of the refresh timer circuit used in the first embodiment.

FIG. 16 shows a cell array block selecting circuit 9 as a seventh modification of the refresh timer circuit. In the present modification, in place of the refresh timer circuit 6, a cell array block selecting circuit 9 is provided. The cell array block selecting circuit 9 is a circuit for determining a block of a cell array to be selected by input low address. For the sake of convenience, the modification will be explained with the assumption that the memory cell array is divided into six regions, and one of the blocks is selected for the operation in a normal operation. In FIG. 16, ADDa to ADDc (ADDa is shown in FIG. 16 and in the following explanation) which are signals obtained by decoding higher bits of low address are input to two sets of NAND gates 34 and 35. An output of an NAND gate 36 to which RAn which is address one bit lower than address which determines the ADDa to ADDc and the output /ØA of the substrate voltage detecting circuit 1 are input to one NAND gate 34, and an output of the NAND gate 37 to which a signal which is obtained by inverting the RAn by an inverter 40 and an output of the output /ØA of the substrate voltage detecting circuit 1 is input to the other NAND gate 35. Outputs of the two sets of NAND gates 34 and 35 are output as signals that output signal ØBLK1 to ØBLK6 (BLK1 is an output of an inverter 38 and BLK6 is an output of an inverter 39 in FIG. 16) select each of the cell array blocks.

A circuit diagram shown in FIG. 16 is a portion of the cell array block selecting circuit 9, and there are two more same circuits. The BLK2 is output to a decode signal ADDb and a lower address RAn, and the BLK5 is output to a decode signal ADDb and an inverted signal of a lower address RAn. Further, the BLK3 is output to a decode signal ADDc and a lower address RAn, and the BLK4 is output to a decode signal ADDC and an inverted signal of a lower address RAn.

Next, the circuit operation will be explained based on FIG. 16. In a normal operating state, the /ØA is high level, and inverted signals of the lower address RAn are output to the NAND gates 36 and 37. If the ADDa is selected by higher address decode, one block is selected by the lower address RAn. That is, when the low address RAn is low level, the output of the NAND gate 36 becomes high level, and the BLK1 is selected. When the lower address RAn is high level, an output of the NAND gate 37 becomes high level, and the BLK6 is selected. At that time, since the ADDb and ADDc are not selected and low level, non-selected states of the BLK2 to BLK5 are maintained and as a result, only one block is selected. Although it is not illustrated in the drawing, also when the ADDb and ADDc are selected, one of the BLK1 to BLK6 is selected. That is, in the normal operating state, only one of blocks is selected, and the refresh operation is carried out.

When the operation mode is shifted to the date retention mode and during the varying period of the substrate voltage VBB, the /ØA becomes low level, and high levels are output to the NAND gates 36 and 37 irrespective of the lower address RAn. Therefore, if the ADDa is selected by decoding the higher address, both the BLK1 and BLK6 are selected together, and two block are simultaneously selected. As in the normal operating state, the ADDb and ADDc are not selected, and non-selected states of the BLK2 to BLK5 are maintained. Also when the ADDb and ADDc are selected, the BLK2 and BLK5, as well as the BLK3 and BLK4 are simultaneously selected. That is, in the data retention mode, two blocks are simultaneously selected, and the refresh operation is carried out. Therefore, since the number of memory cells to be refreshed simultaneously is increased, effect which is the same as that when the refresh cycle is shortened can be obtained.

Figure 17:
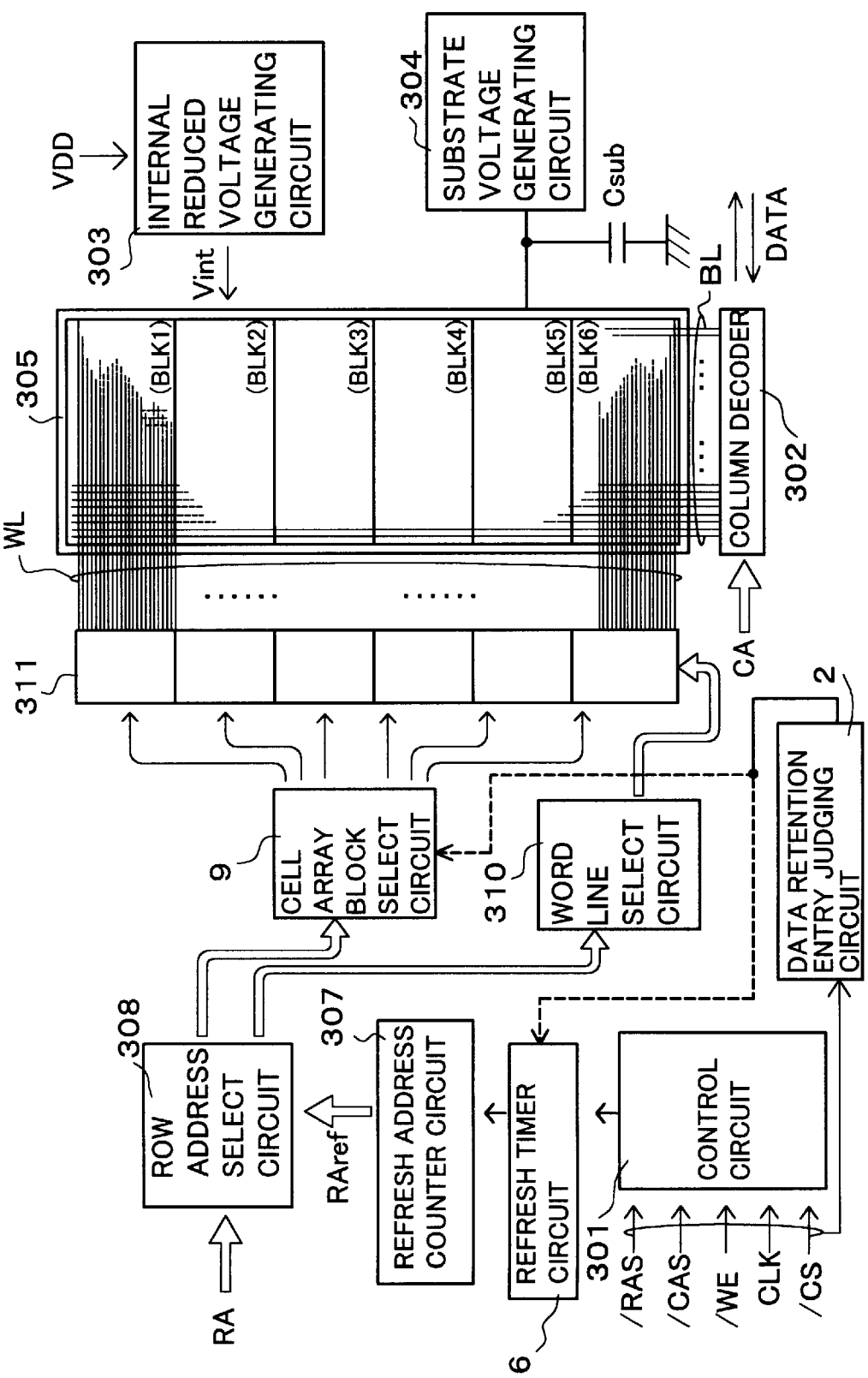
FIG. 17 is a circuit block diagram of a semiconductor memory of a second embodiment embodying the present invention.

FIG. 17 shows a semiconductor memory of a second embodiment embodying the present invention. In a structure shown in FIG. 17, components similar to those described in the description of relevant art are designated with the same symbols, and explanation thereof will be omitted. According to the present embodiment, in a DRAM, in order to set unbalance period between the power supply voltage VDD and the substrate voltage VBB when the operation mode is shifted to the data retention mode, the fact that the operation mode is shifted to the data retention mode is judged from a signal from outside, and a given period from this judged time is counted as a varying period. During this period, the electric charge retention ability is improved by shortening the cycle of refresh operation or by refreshing a plurality of memory cells simultaneously. This embodiment shows a first another embodiment of a method for time-keeping the varying period of the substrate voltage VBB which is different from the first embodiment, and the method for improving the electric charge retention ability is the same as that of the first embodiment. The data retention mode entry judging circuit 2 detects that the operation mode enters the data retention mode by input of an entry signal from outside of the DRAM through an exclusive terminal or a specific combination of signals input to existing terminal, and the varying period of the substrate voltage VBB is counted.

Figure 18:
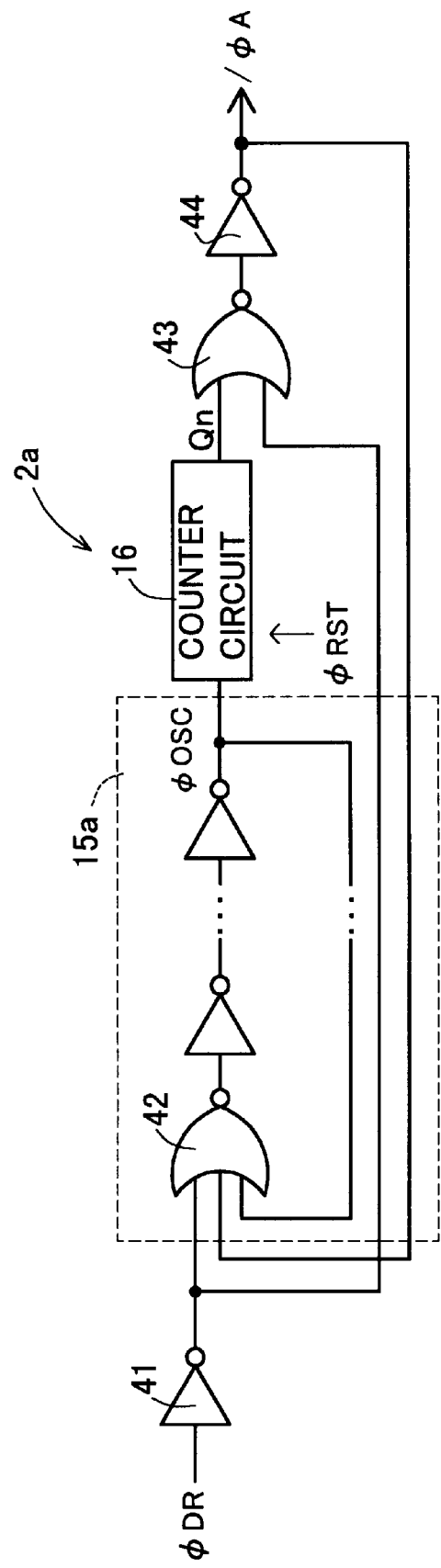
FIG. 18 shows a concrete example of a data retention mode entry judging circuit used in the second embodiment.

FIG. 18 shows a data retention mode entry judging circuit 2a which is a concrete example used in the present embodiment. A data retention mode entry signal ØDR input from outside of the DRAM is input to an inverter 41. An output of the inverter 41 is input to a three-input NOR gate 42 constituting an input stage of an oscillator circuit 15a, and is also input to a rear stage NOR gate 43. The next and subsequent stages of the oscillator circuit 15a is constituted by the even number of stages of inverter arrays, and an output ØOSC of its final stage is fed back to an input of the NOR gate 42 to form an oscillator, and input to the counter circuit 16 as an output of the oscillator circuit 15a. This counter circuit 16 is the same as that of the first embodiment and the same as refresh timer circuits 6a to 6g used in the present embodiment. An output Qn of the counter circuit 16 has been input to another input of the NOR gate 43. Further, an output of the NOR gate 43 is input to the inverter 44, and an output of the inverter 44 is input to the NOR gate 42 which is the input stage of the oscillator circuit 15a and is an output of the data retention mode entry judging circuit 2a.

Figure 19:
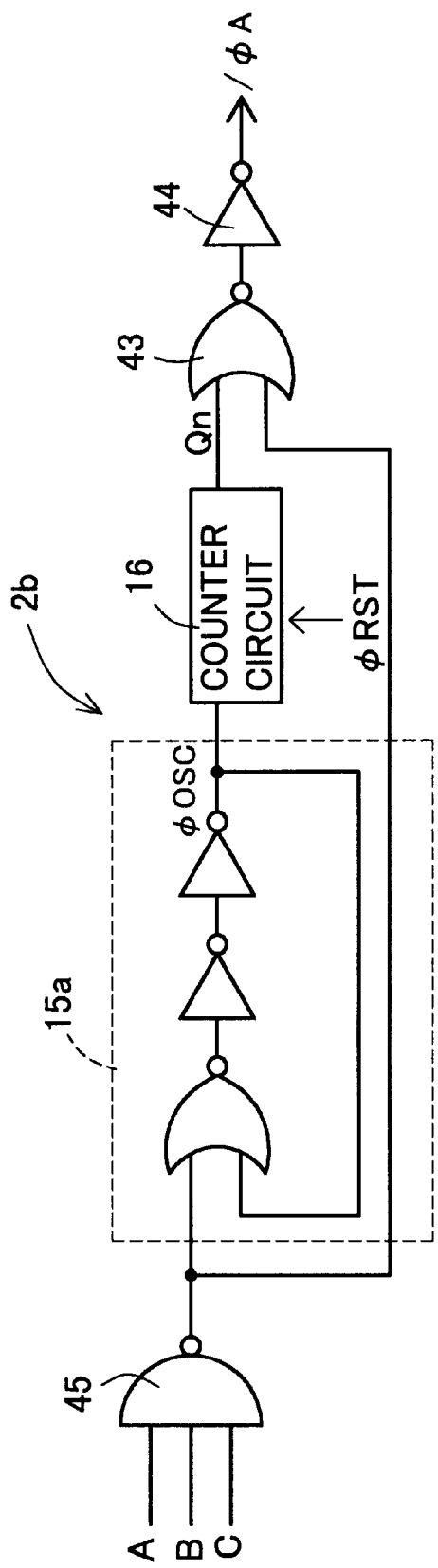
FIG. 19 shows a first modification of the data retention mode entry judging circuit used in the second embodiment.

FIG. 19 shows a first modification 2b of the data retention mode entry judging circuit. Since this modification uses a plurality of external signals for judging the entry, this modification is different from the data retention mode entry judging circuit 2a shown in FIG. 18 in that a gate of the first stage is constituted by a three-input NAND gate 45, but except that, the present modification is the same as the data retention mode entry judging circuit 2a shown in FIG. 18.

Figure 20:
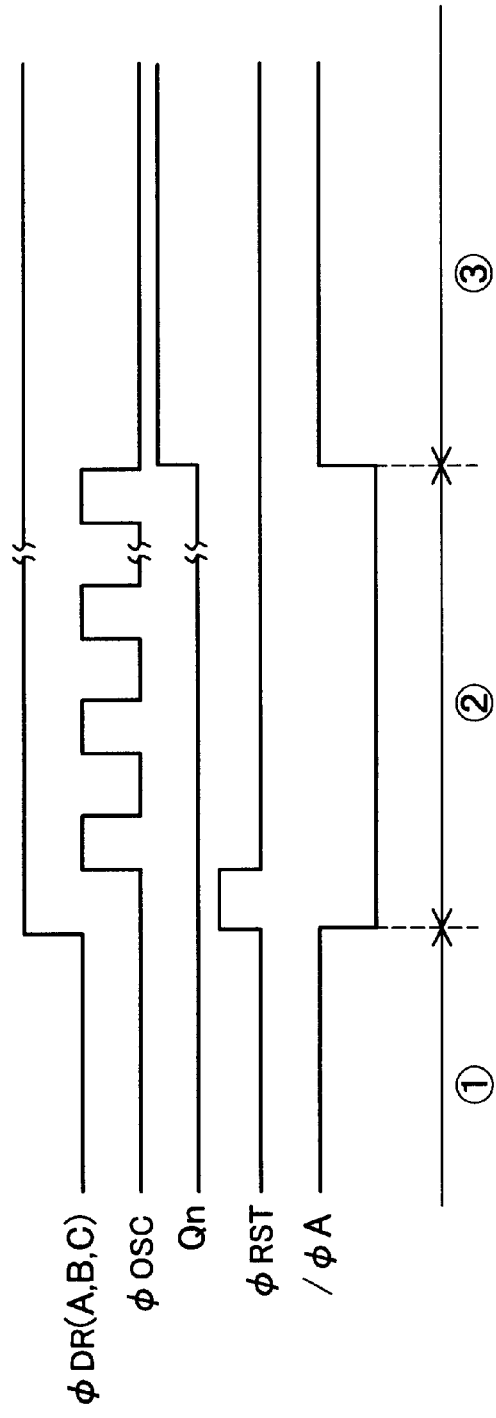
FIG. 20 is a time chart for explaining an operation of the first modification of the data retention mode entry judging circuit used in the second embodiment.

Next, FIG. 20 shows a concrete operation. If the entry signal ØDR becomes high level in the case of the judging circuit 2a in FIG. 18, and if all of the entry signals become high level in the case of the judging circuit 2b, all bits of the counter circuit 16 are reset by a pulse signal ØRST generated by a one-shoot pulse generating circuit, and the Qn becomes low level. An output of the inverter 41 or an output of the NAND gate 45 is low level, the /ØA output through the NAND gate 43 becomes low level (see region ② in FIG. 20), so as to start shortening the refresh cycle. Further, simultaneously, since the signal input to the oscillator circuit 15a becomes low level, the oscillator circuit 15a starts operating, and the ØOSC oscillates. The counter circuit 16 which received the ØOSC signal counts the ØOSC signals predetermined times, thereby inverting the output Qn to high level, and inverting the ØA to high level, and time-keeping of the varying period is completed (see region ② in FIG. 20).

A method for improving the electric charge retention ability during the time-keeping of the varying period of the substrate voltage VBB is the same as that of the first embodiment as described above, its explanation will be omitted here.

Figure 21:
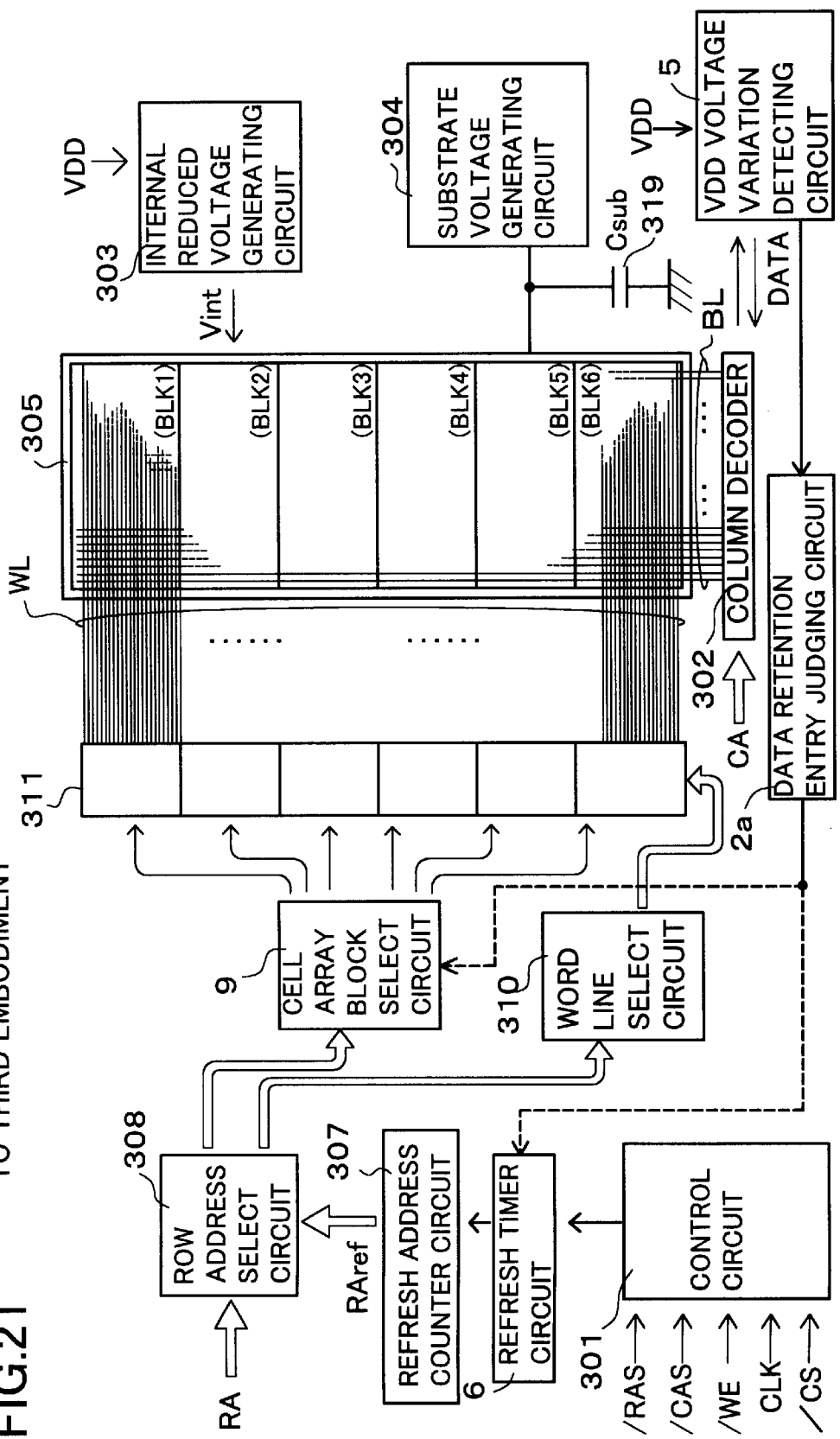
FIG. 21 is a circuit block diagram of a semiconductor memory of a third embodiment embodying the present invention.

FIG. 21 shows a semiconductor memory of a third embodiment embodying the present invention. In a structure shown in FIG. 21, components similar to those described in the description of relevant art are designated with the same symbols, and explanation thereof will be omitted. According to the present embodiment, in a DRAM, in order to set unbalance period between the power supply voltage VDD and the substrate voltage VBB when the operation mode is shifted to the data retention mode, a reduction of the power supply voltage VDD when the operation mode is shifted to the data retention mode is detected. A given period from this detection signal is counted as the varying period, thereby shortening the refresh operation cycle to improve the electric charge retention ability. The present embodiment shows a second different embodiment of a method for time-keeping the varying period of the substrate voltage VBB with respect to the first embodiment, and the method for improving the electric charge retention ability during the time-keeping is the same as that of the first embodiment. This embodiment has a VDD voltage variation detecting circuit 5 for detecting the fact that the operation mode enters into the data retention mode from the reduction of the power supply voltage VDD. By inputting the detection signal to the data retention mode entry judging circuit 2a, a given time is measured to time-keep as a varying period of the substrate voltage VBB.

Figure 22:
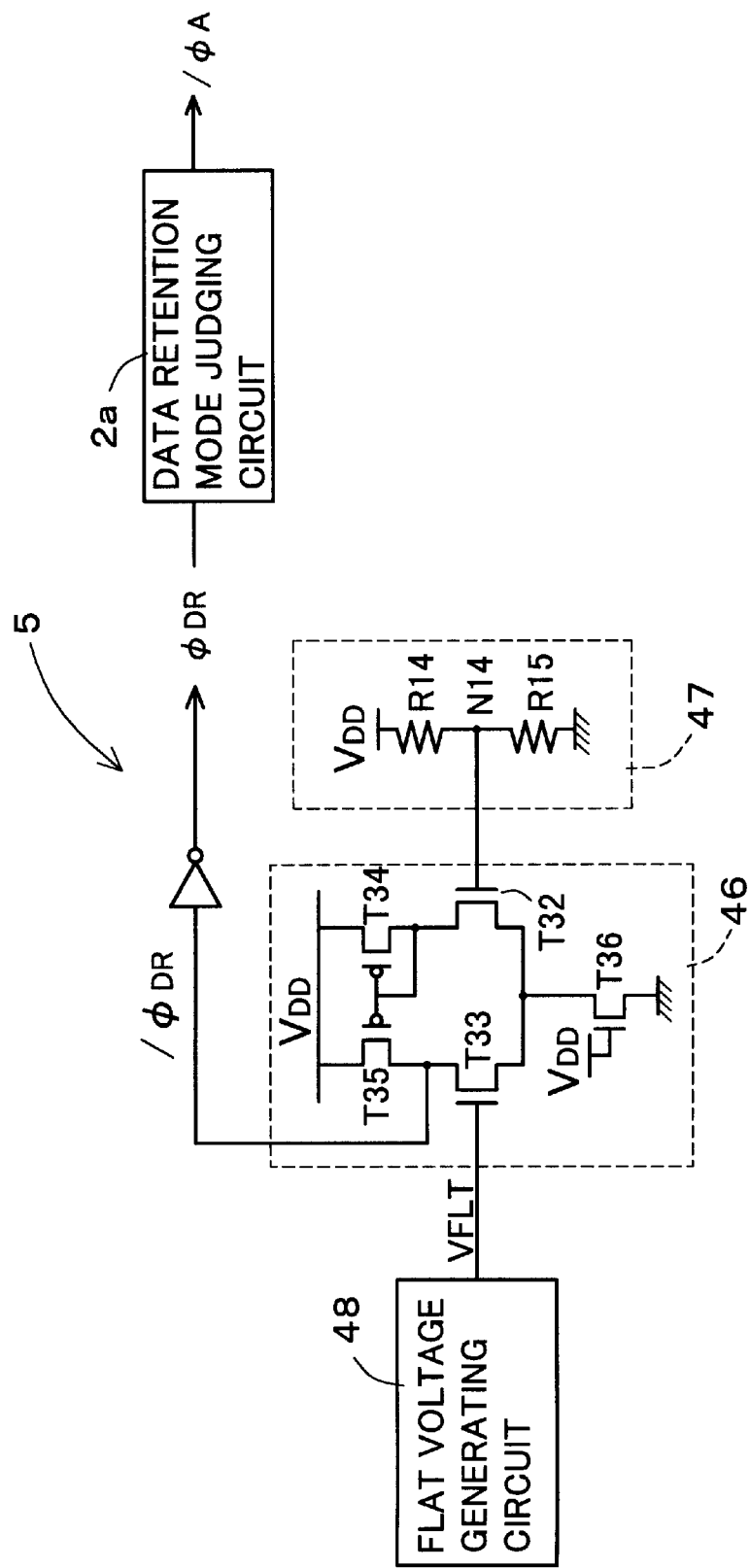
FIG. 22 shows a concrete example of a VDD voltage variation detecting circuit used in the third embodiment.

FIG. 22 shows the VDD voltage variation detecting circuit 5 used in this embodiment. The circuit 5 comprises a differential amplifier circuit (comparator) 46, a power supply voltage VDD voltage-dividing circuit 47, a flat voltage generating circuit 48, and a data retention mode judging circuit 2a which is the same as that of the second embodiment.

In the differential amplifier circuit (comparator) 46, a gate of an NMOS transistor T32 is connected to an output node N14 of divided voltage of a power supply voltage VDD voltage-dividing circuit 47, a gate of an NMOS transistor T33 is connected to an output node VFLT of the flat voltage generating circuit 48, sources of both the NMOS transistors are commonly connected, and a differential pair is formed. A drain and a gate of the PMOS transistor T34 as well as a gate of the PMOS transistor T35 are connected to a drain of the NMOS transistor T32, a drain of the PMOS transistor T35 is connected to a drain of the NMOS transistor T33, sources of both the PMOS transistors are connected to the power supply voltage VDD, thereby forming an active load of the differential amplifier circuit 46. A drain of an NMOS transistor T36 whose source is connected to the ground potential as a biasing source of the differential amplifier circuit 46 and whose gate is connected to the power supply voltage VDD and whose drain is connected to a common source of the NMOS transistors T32 and T33. A comparison result taken from a node /ØDR between the drain of the PMOS transistor T35 and the drain of the NMOS transistor T33 is connected to the input terminal of the inverter 41 of the data retention mode judging circuit 2a through an inverter.

The power supply voltage VDD voltage-dividing circuit 47 comprises a resistor R14 whose one end is connected to the power supply voltage VDD and a resistor R15 whose one end is connected to the ground potential, the other ends of the resistors R14 and R15 are connected to each other at a node N14 to output a divided voltage of the power supply voltage VDD.

The flat voltage generating circuit 48 outputs a constant voltage which is independent from the power supply voltage VDD.

Figure 23:
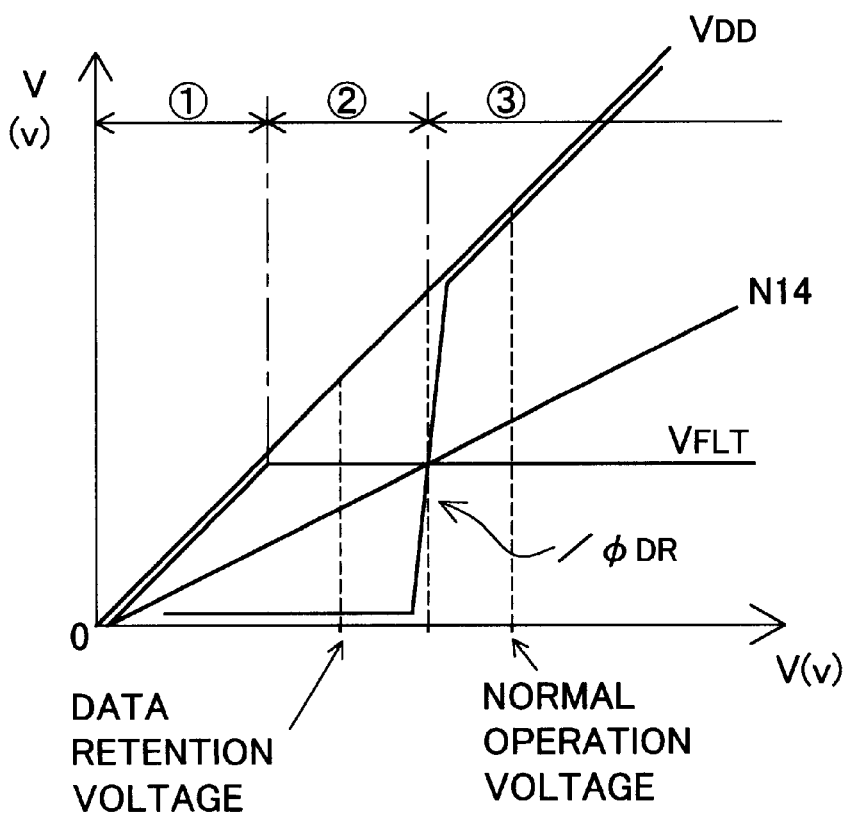
FIG. 23 is a time chart for explaining a comparison operation of a differential amplifier circuit (comparator) in the concrete example of the VDD voltage variation detecting circuit used in the third embodiment.

FIG. 23 concretely shows a comparison operation of the differential amplifier circuit (comparator) 46. In a region ① in FIG. 23, the power supply voltage VDD is equal to or lower than a set voltage of the flat voltage generating circuit 48, and the output voltage VFLT of this circuit follows the power supply voltage VDD and changes. If the voltage of the power supply voltage VDD increases beyond the set voltage of the flat voltage generating circuit 48 into an operation range of the circuit, the operation mode is shifted to a region ②, and the VFLT voltage shows a constant set voltage. Thereafter, even if the power supply voltage VDD further increases, the flat voltage generating circuit 48 keeps outputting the constant VFLT voltage. On the other hand, since the power supply voltage VDD voltage-dividing circuit 47 outputs a voltage which is obtained by dividing the power supply voltage VDD by resistance to the N14, the N14 increases in proportion to the power supply voltage VDD. The VFLT voltage and the N14 voltage become equal to each other at a particular power supply voltage VDD, and if the power supply voltage VDD is lower than it, the VFLT voltage is higher than the N14 voltage, and if the power supply voltage VDD is higher, the VFLT voltage is lower than the N14. Therefore, the output of the differential amplifier circuit (comparator) 46 is inverted if exceeding the particular power supply voltage VDD at which the N14 voltage and the VFLT voltage are equal to each other. That is, in the regions ① and ② in the drawing, the N14 voltage is lower than the VFLT voltage, the output /ØDA of the differential amplifier circuit (comparator) 46 outputs low level, and in the region ③, the N14 voltage is higher than the VFLT voltage, the output /ØDA of the differential amplifier circuit (comparator) 46 outputs high level.

If the VFLT voltage and the N14 voltage are set such that the power supply voltage VDD in the normal operation comes to the region ③ and the power supply voltage VDD in the data retention mode comes to the region ②, the power supply voltage VDD is reduced when the operation mode is shifted to the data retention mode so that a state of the VDD voltage variation detecting circuit 5 is moved from the region ③ to the region ② in the drawing, the /ØDR is inverted to low level, and time-keeping starts in the first stage data retention mode judging circuit 2a.

Since the circuit for time-keeping is the same as the data retention mode entry judging circuit 2a (see FIG. 18) which is a concrete example used in the second embodiment (see FIG. 17), its explanation will be omitted. Further, a method for improving the electric charge retention ability during the time-keeping of the varying period of the substrate voltage VBB is the same as that of the first embodiment as described above, its explanation will be omitted here.

Figure 24:
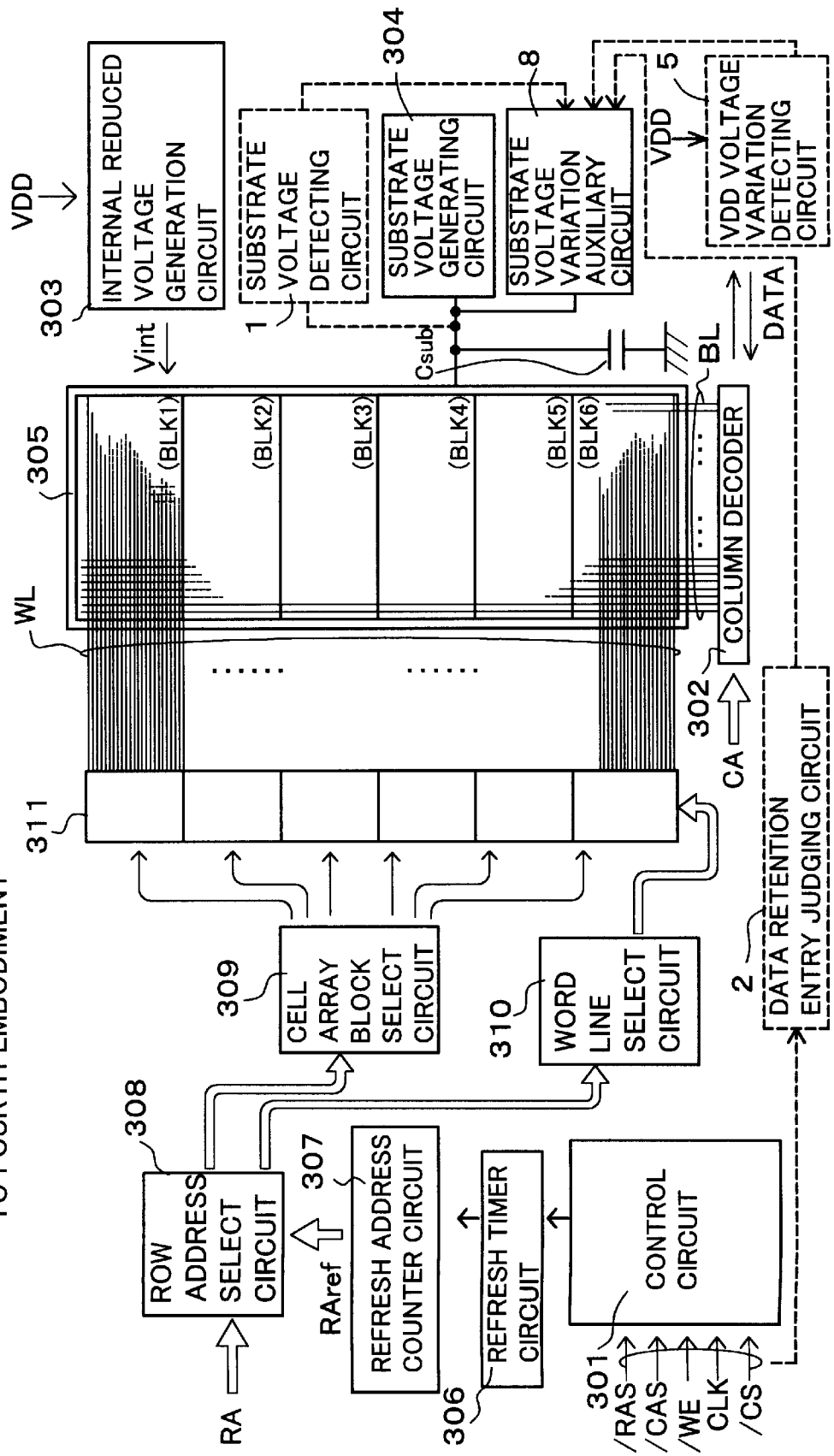
FIG. 24 is a circuit block diagram of a semiconductor memory of a fourth embodiment embodying the present invention.

FIG. 24 shows a semiconductor memory of a fourth embodiment embodying the present invention. In a structure shown in FIG. 24, components similar to those described in the description of relevant art are designated with the same symbols, and explanation thereof will be omitted. According to the present embodiment, in a DRAM, in order to set unbalance period between the power supply voltage VDD and the substrate voltage VBB when the operation mode is shifted to the data retention mode, when the shift to the data retention mode is detected, the increase of the substrate voltage VBB caused by the reduction of the power supply voltage VDD is assisted to follow the variation of the power supply voltage VDD to keep balance of both the voltages, thereby maintaining the electric charge retention ability. Unlike the first to third embodiments, in the present embodiment, deterioration of the transient electric charge retention ability itself when shifting to the data retention mode is overcome. In FIG. 24, the substrate voltage detecting circuit 1, the data retention mode entry judging circuit 2, the VDD voltage variation detecting circuit 5 or the like receives a detection signal indicating the variation of the substrate voltage VBB, thereby operating the substrate voltage variation auxiliary circuit 8.

Figure 25:
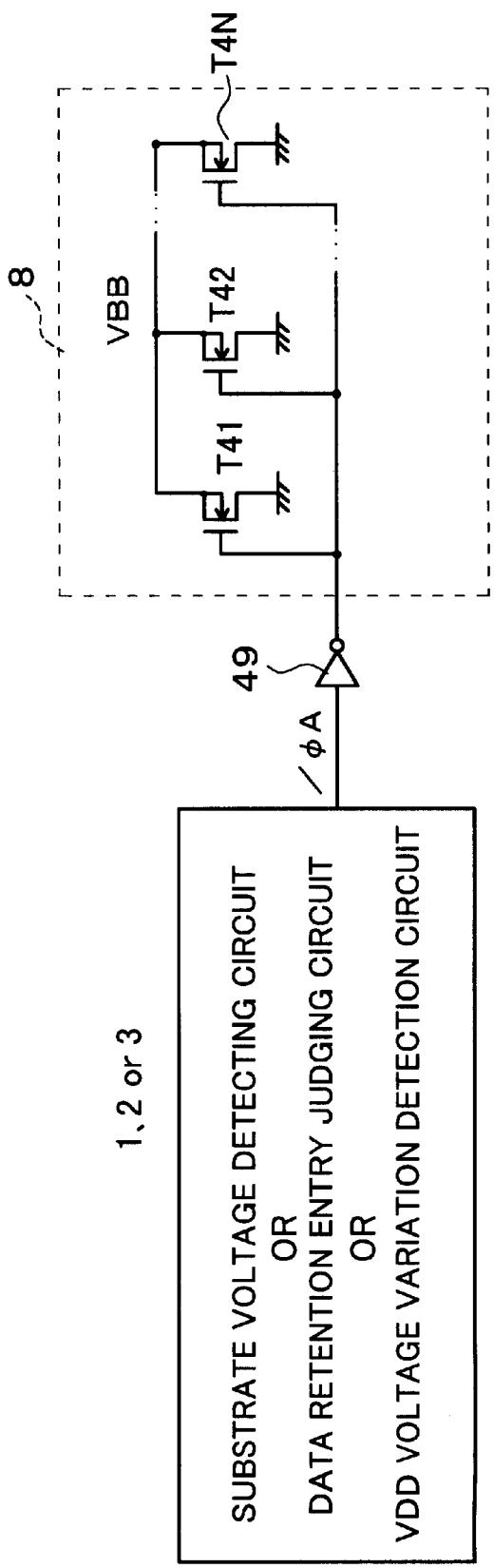
FIG. 25 shows a concrete example of a substrate voltage variation auxiliary circuit used in the fourth embodiment.

FIG. 25 shows a concrete example used in the present embodiment. The substrate voltage variation auxiliary circuit 8 comprises a plurality of NMOS transistors T41 to T4N, and the output /ØA of any one the substrate voltage detecting circuit 1, the data retention mode entry judging circuit 2 and the VDD voltage variation detecting circuit 5 is commonly input to gates of the circuit 8 through an inverter 49. Further, drains of the NMOS transistors T41 to T4N are connected to the ground potential, and sources thereof are connected to the substrate voltage VBB. The NMOS transistors T41 to T4N are disposed such in a chip such as to be dispersed uniformly.

In a normal operating state, since the /ØA is high level, the NMOS transistors T41 to T4N are OFF. If the /ØA outputs low level as a varying period of the substrate voltage VBB by the shift to the data retention mode, the NMOS transistors T41 to T4N are turned ON, and the substrate voltage VBB is short-circuited to the ground potential. When the substrate voltage VBB is shifted to shallow by the reduction of the power supply voltage VDD, it is possible to rapidly discharge a large capacity component Csub of the substrate portion of the memory cell region by assisting the driving ability of the substrate voltage generating circuit 304, and a balance between the power supply voltage VDD and the substrate voltage VBB can be kept excellently even during the transient period at the time of the shift to the data retention mode. By disposing the short-circuit NMOS transistors T41 to T4N in the chip such as to be dispersed uniformly, it is possible to uniformly vary the substrate voltage VBB, thereby preventing the local unbalance of the voltage.

Figure 26:
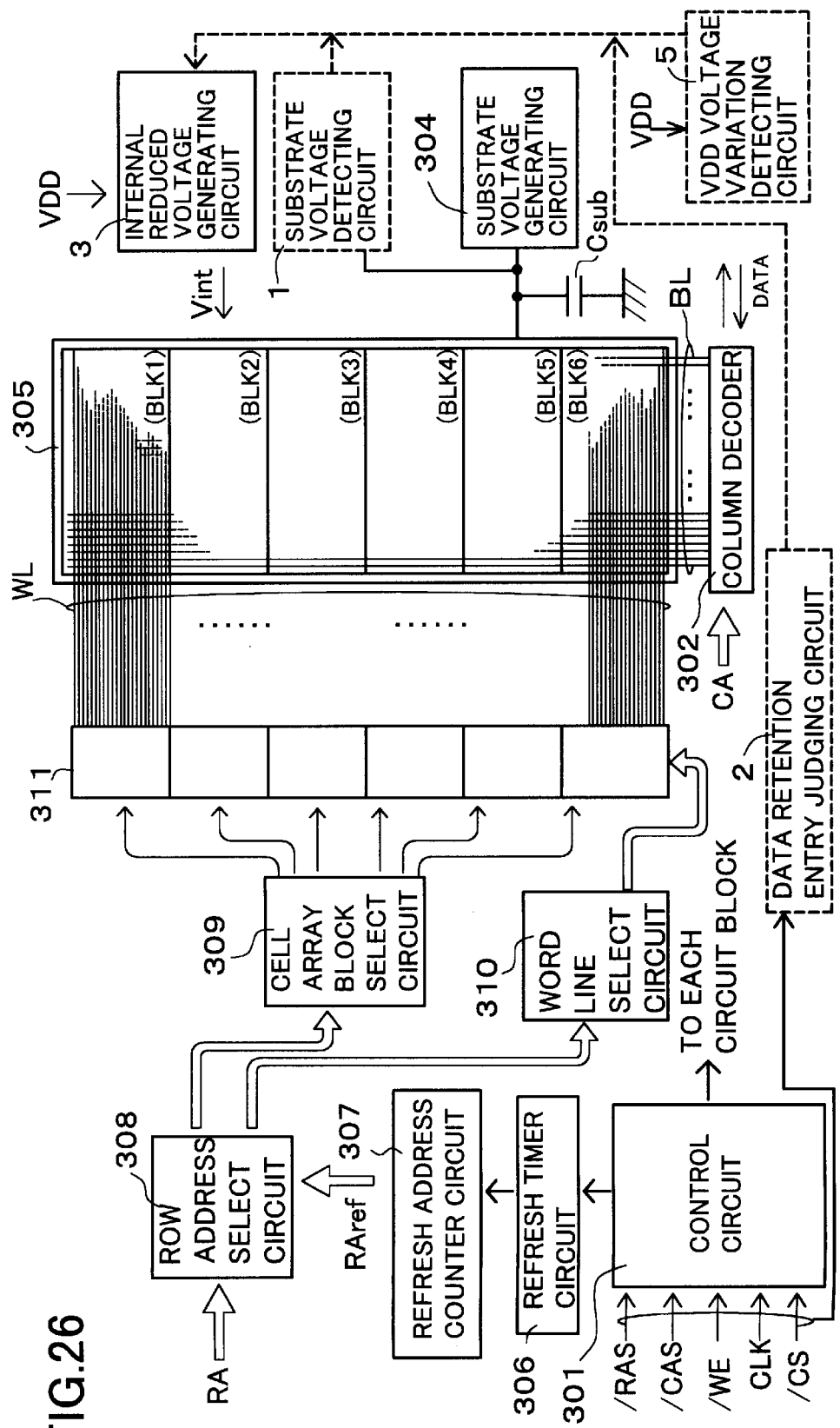
FIG. 26 is a circuit block diagram of a semiconductor memory of a fifth embodiment embodying the present invention.

FIG. 26 shows a semiconductor memory of a fifth embodiment embodying the present invention. In a structure shown in FIG. 26, components similar to those described in the description of relevant art are designated with the same symbols, and explanation thereof will be omitted. The present embodiment relates to a DRAM of a type reducing a power supply voltage VDD inside and using the same as an internal reduced voltage Vint, and in order to delete the unbalance period between the internal reduced voltage Vint and the substrate voltage VBB when the operation mode is shifted to the data retention mode, when the shift to the data retention mode is detected, the change of the internal reduced voltage Vint is delayed so as to follow the rise of the substrate voltage VBB. With this feature, balance of voltage of the both of them is maintained to maintain the electric charge retention ability. Unlike the first to third embodiments, like the fourth embodiment, in the present embodiment, transient deterioration of the electric charge retention ability itself when shifting to the data retention mode is overcome. A method for detecting the varying period of the substrate voltage VBB or measuring the time is the same as those in the first to third embodiments, the substrate voltage detecting circuit 1, the data retention mode entry judging circuit 2, the VDD voltage variation detecting circuit 5 or the like receives a detection signal indicating the variation of the substrate voltage VBB. The output signal /ØA is input to the internal reduced voltage generating circuit 3 having a voltage control function.

Figure 27:
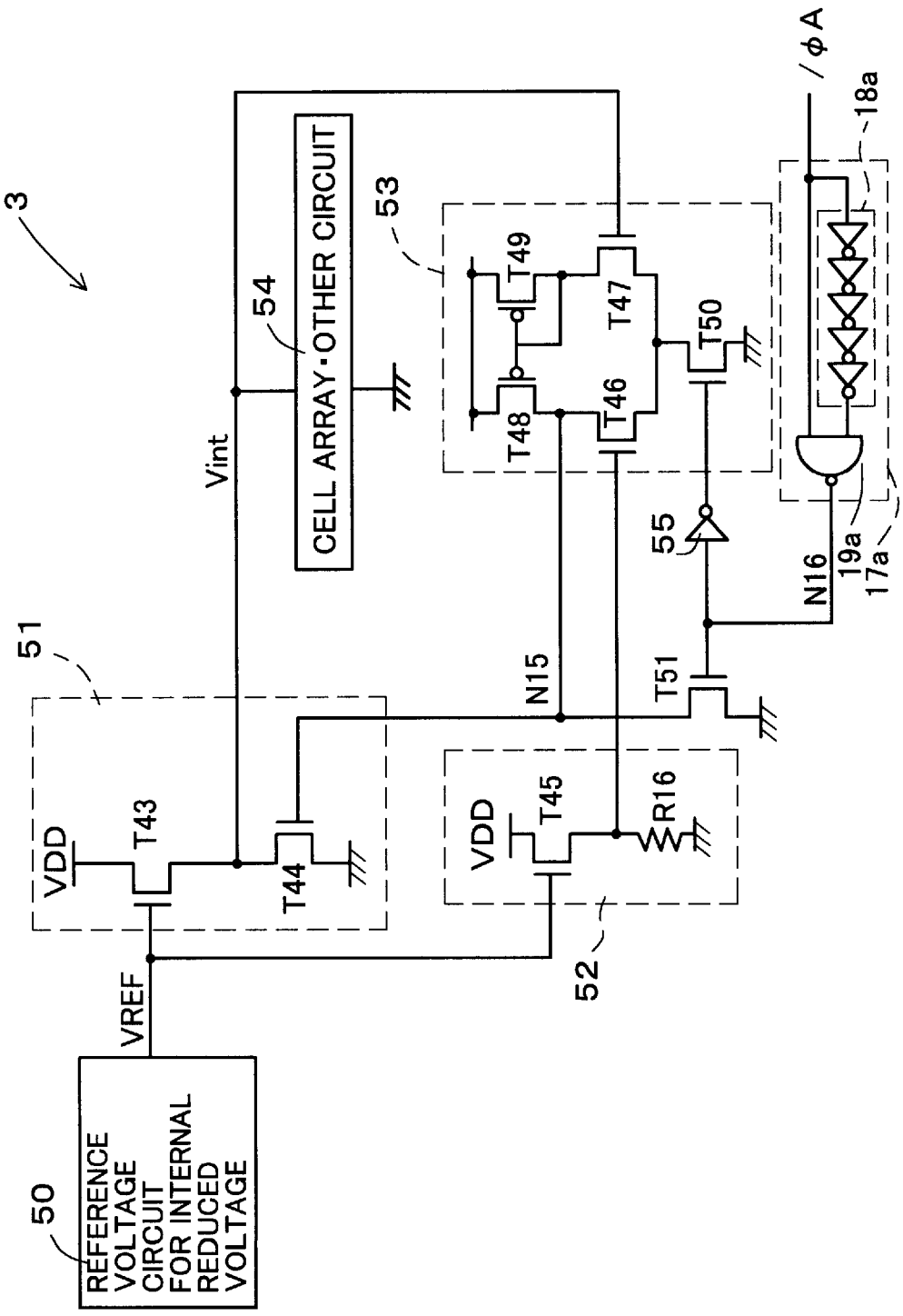
FIG. 27 shows a concrete example of an internal reduced voltage circuit having a voltage control function used in the fifth embodiment.

FIG. 27 shows the internal reduced voltage generating circuit 3 having the voltage control function which is a concrete example used in the present embodiment. The circuit 3 comprises an internal reduced voltage reference voltage circuit 50, an internal reduced voltage output circuit 51, an internal reduced voltage setting circuit 52, a differential amplifier circuit (comparator) 53, and a pulse generating circuit 17a. The pulse generating circuit 17a is the same as that used in the refresh timer circuit 6a (see FIG. 4).

A drain of an NMOS transistor T43 of the internal reduced voltage output circuit 51 and an NMOS transistor T45 of the internal reduced voltage setting circuit 52 are connected to the power supply voltage VDD, and gates thereof are connected to a VREF which is an output of the internal reduced voltage reference voltage circuit 50. A source of the NMOS transistor T43 is connected to a drain of a NMOS transistor T44, a source of the NMOS transistor T44 is connected to the ground potential, a gate thereof is connected to drains of an output node N15 of the differential amplifier circuit (comparator) 53 and a NMOS transistor T51, thereby forming the internal reduced voltage output circuit 51, the source of the NMOS transistor T43 is connected to a gate of an NMOS transistor T47 which is an input of the differential amplifier circuit (comparator) 53 as an internal reduced voltage Vint, and is supplied to a cell array and internal circuits 54 in the chip. On the other hand, a source of the NMOS transistor T45 is connected to the ground potential through a resistor R16 to form the internal reduced voltage setting circuit 52, and the source of the NMOS transistor T45 is connected to a gate of an NMOS transistor T46 which is an input of the differential amplifier circuit (comparator) 53.

In the differential amplifier circuit (comparator) 53, the NMOS transistor T46 to which the source of the NMOS transistor T45 is input constitutes a negative input terminal, the NMOS transistor T47 to which the Vint which is the source of the NMOS transistor T43 is input constitutes a positive input terminal, the sources of both the NOMS transistors are commonly connected, and a differential pair is constituted. A drain and a gate of a PMOS transistor T49 as well as a gate of a PMOS transistor T48 are connected to the drain of the NMOS transistor T47, the drain of the PMOS transistor T48 is connected to the drain of the NMOS transistor T46, and connected to the gate of the NMOS transistor T44 and the drain of the NMOS transistor T51 as output N15 of the differential amplifier circuit (comparator) 53. Sources of the PMOS transistors T48 and T49 are connected to the power supply voltage VDD, and an active load of the differential amplifier circuit is formed. Further, a drain of a NMOS transistor T50 whose source is connected to the ground potential as a bias source of the differential amplifier circuit and whose gate is connected to an output of an inverter 55 is connected to a common source of the NMOS transistors T46 and T47, and the bias current is supplied to the differential amplifier circuit (comparator) 53. When the gate voltage of the NMOS transistor T46 which is the negative input terminal is higher than the gate voltage of the NMOS transistor T47 which is the positive input terminal, the output node N15 outputs low level, and when lower, the output node N15 outputs high level, thereby carrying out the differential amplifying (comparing) operation.

A pulse generating circuit 17a receives the /ØA signal, and its output is connected to an inverter 55 and a gate of the NMOS transistor T51. A source of the NMOS transistor T51 is connected to the ground potential.

Figure 28:
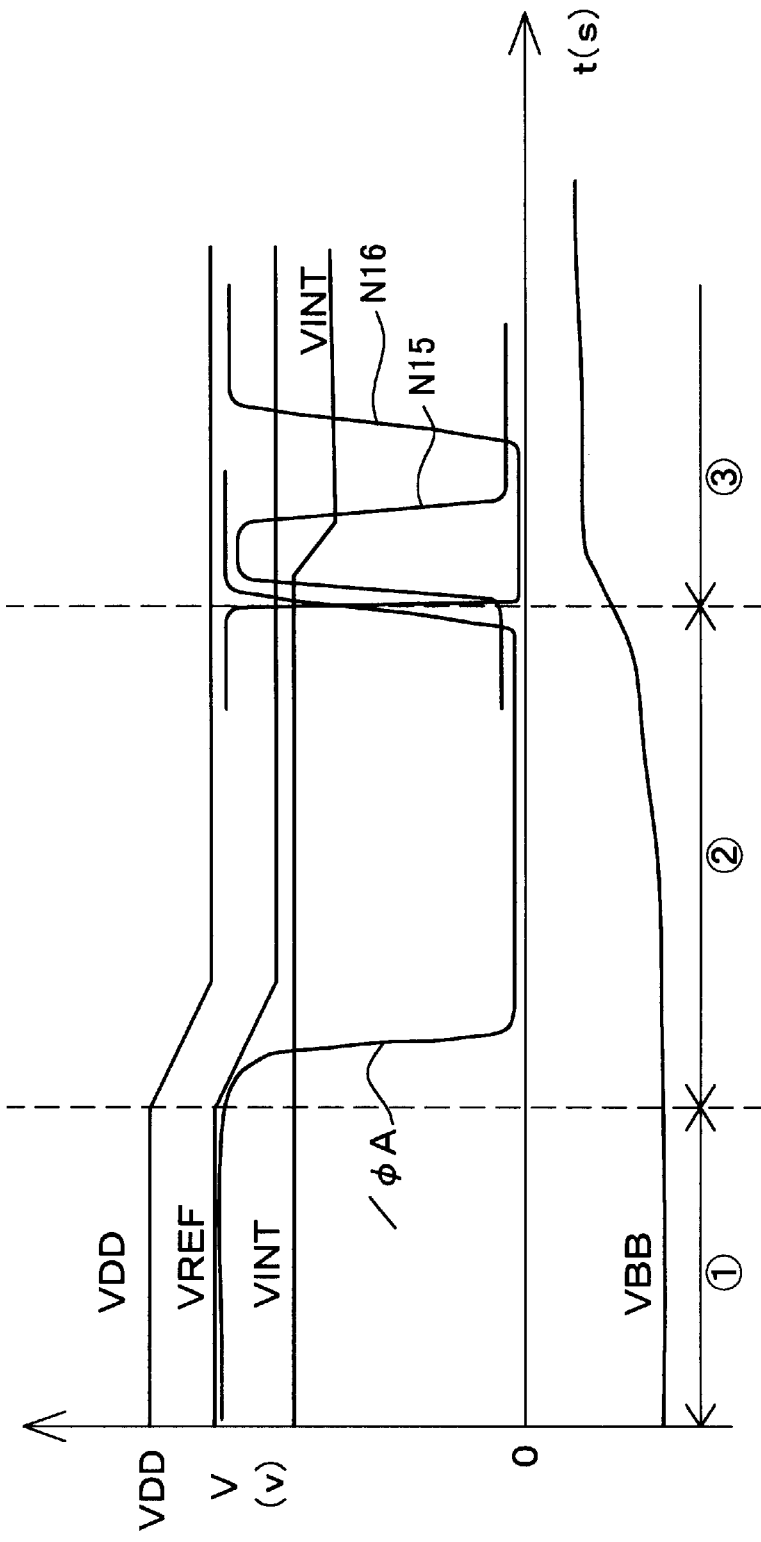
FIG. 28 is a time chart for explaining an operation of the concrete example of the internal reduced voltage circuit having the voltage control function used in the fifth embodiment.

Next, a concrete circuit operation will be explained with reference to FIG. 28. A region ① is a normal operation state. The power supply voltage VDD is set high, the substrate voltage VBB is set deep, and the internal reduced voltage Vint is set to a voltage corresponding to the normal operation. The DRAM operates in this state.

When the operation mode is shifted to the data retention mode, the power supply voltage VDD is reduced, the /ØA is inverted to low level, and the operation mode is moved to a region ②. A set value of the substrate voltage VBB becomes shallow in accordance with the power supply voltage VDD, but rise of the voltage value is gradual because of the capacity component of the substrate. Similarly, the voltage value of the output VREF of the internal reduced voltage reference voltage circuit 50 is reduced in accordance with the power supply voltage VDD, but since the internal reduced voltage Vint is supplied to the cell array and the internal circuit 54 and it is connected to a large capacity component, reduction of the voltage Vint value is gradual. Further, since the output of the pulse generating circuit 17a at that time is high level, the NMOS transistor T51 is ON, the NMOS transistor T50 is maintained OFF, the output N15 of the differential amplifier circuit (comparator) 53 is pulled into low level by the NMOS transistor T51, the NMOS transistor T44 is maintained OFF, the pull of the internal step-down voltage Vint is not assisted, and it is gradually changed while keeping a balance with the substrate voltage VBB.

When the varying period of the substrate voltage VBB is elapsed and the /ØA is inverted to high level and the operation mode is shifted to a region ③, the pulse generating circuit 17a outputs a negative pulse from an NAND gate 19a in accordance with a delay time of a delay element 18a. During this period, the NMOS transistor T51 is turned OFF and at the same time, the NMOS transistor T50 is turned ON through an inverter 55, thereby bringing the differential amplifier circuit (comparator) 53 into active state, the internal reduced voltage Vint (the gate of the NMOS transistor T47) and a set value of the internal reduced voltage setting circuit 52 (the gate of the NMOS transistor T46) are compared with each other. At that time, since the internal reduced voltage Vint is higher, the output N15 of the differential amplifier circuit (comparator) 53 is high level, the NMOS transistor T44 is turned ON, the voltage value is swiftly reduced, and swiftly is balanced to a set value by reduction of the power supply voltage VDD.

By the above operation, in a type in which the power supply voltage VDD is reduced inside and used as the internal reduced voltage Vint, the change of the internal reduced voltage Vint can be delayed according to the varying period of the substrate voltage VBB due to the reduction of the power supply voltage VDD when the operation mode is shifted to the data retention mode, thereby a balance of both the voltages can be kept to solve the deterioration of the electric charge retention ability.

If the NMOS transistor T44 is disposed such as to be dispersed uniformly in the chip, it is possible to uniformly and swiftly vary the internal reduced voltage Vint in the chip, and a local unbalance of voltages can be prevented.

Figure 29:
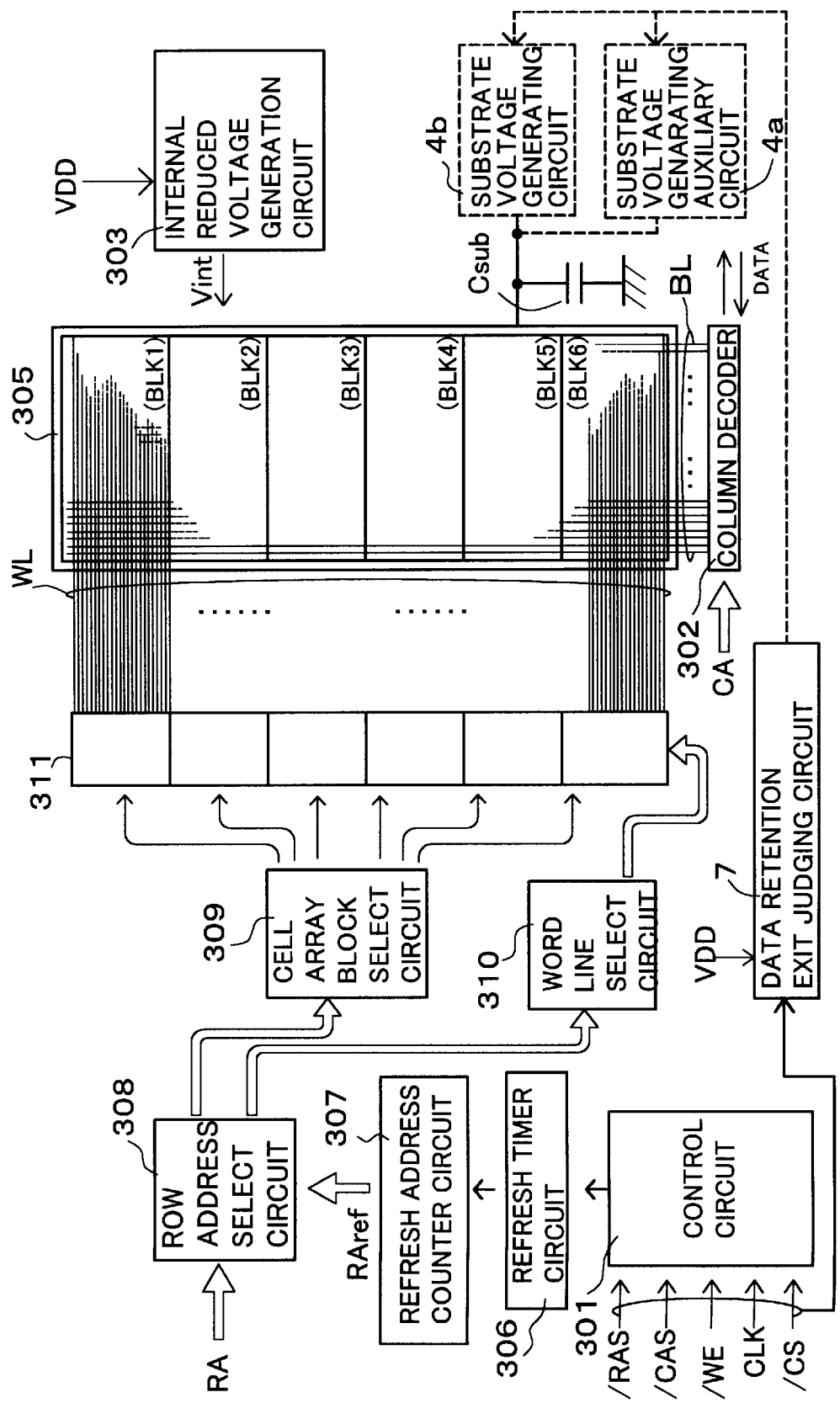
FIG. 29 is a circuit block diagram of a semiconductor memory of a sixth embodiment embodying the present invention.

FIG. 29 shows a semiconductor memory of a sixth embodiment embodying the present invention. In a structure shown in FIG. 29, components similar to those described in the description of relevant art are designated with the same symbols, and explanation thereof will be omitted. In the present embodiment, in a DRAM, in order to delete the unbalance period between the power supply voltage VDD and the substrate voltage VBB when the operation mode is returned from the data retention mode, the reduction of the substrate voltage VBB caused by the rise of the power supply voltage VDD is assisted when the operation mode is returned from the data retention mode, thereby allowing it to follow the variation of the power supply voltage VDD to keep balance between both the voltages so that the electric charge retention ability is maintained, and transient deterioration of the electric charge retention ability itself is deleted. In FIG. 29, the data retention exit detecting circuit 7 detects the fact that the operation mode is returned from the data retention mode, operates a substrate voltage generating auxiliary circuit 4a or a substrate voltage generating circuit 4b, thereby temporarily strengthening a supply ability of the substrate voltage VBB.

Figure 30:
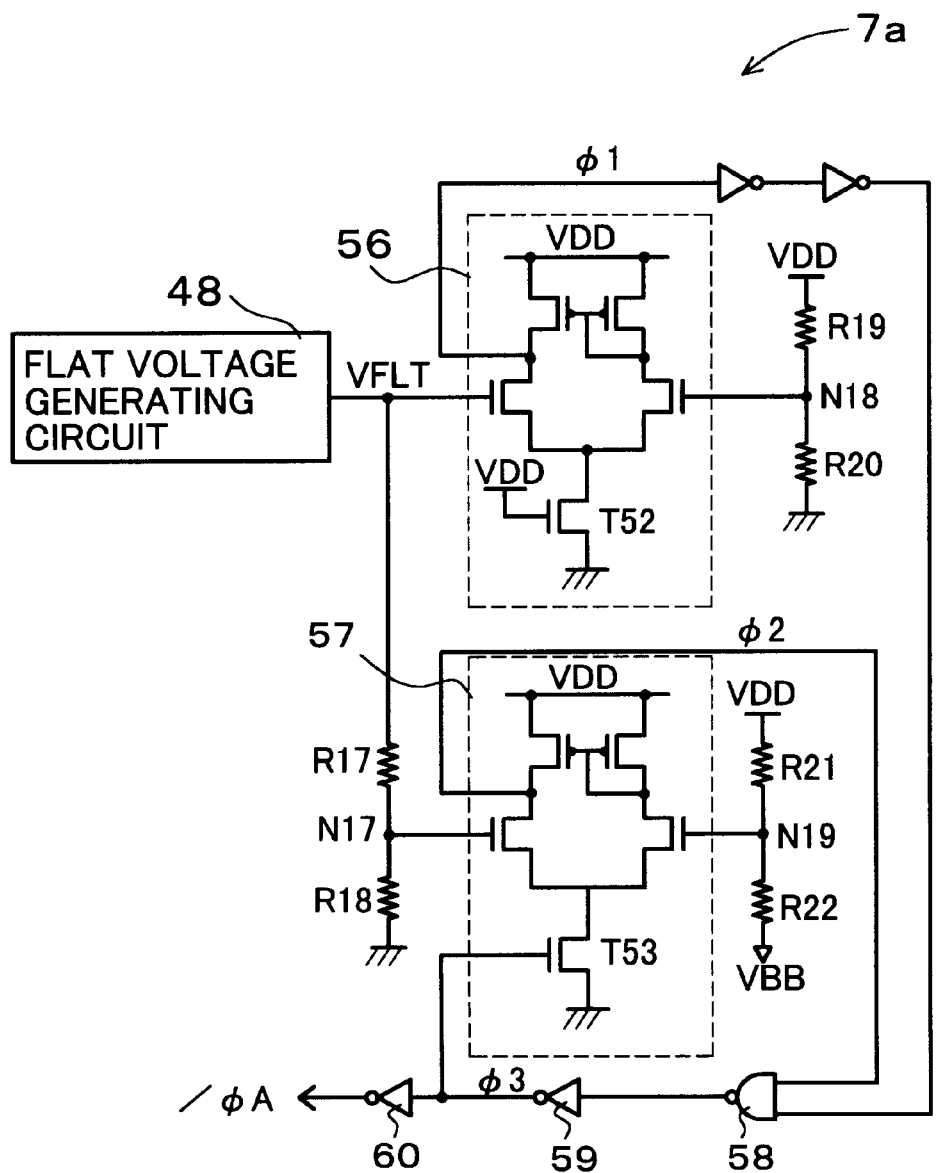
FIG. 30 shows a concrete example of a data retention exit detecting circuit used in the sixth embodiment.

FIG. 30 shows the data retention exit detecting circuit 7a which is a concrete example used in the present embodiment. The flat voltage generating circuit is the same as that used in the third embodiment (see FIGS. 22 and 23), and differential amplifier circuits (comparators) 56 and 57 are the same as the differential amplifier circuit (comparator) 53 (see FIG. 27). This detecting circuit generates a negative pulse /ØA when the power supply voltage VDD is increased.

An output VFLT from the flat voltage generating circuit 48 is connected a negative input terminal of the differential amplifier circuit (comparator) 56, a resistor R19 whose one end is connected to the power supply voltage VDD and a resistor R20 whose one end is connected to the ground potential are input (node N18) to a positive input terminal of the differential amplifier circuit (comparator) 56. A drain of an NMOS transistor T52 which is a bias current source is connected to sources of both the input NMOS transistors and a source of the transistor T52 is connected to the ground potential, and a gate thereof is connected to the power supply voltage VDD. Further, an output Ø1 of the differential amplifier circuit (comparator) 56 is input to an NAND gate 58 through two stage inverters.

A resistor R17 whose one end is connected to the output VFLT from the flat voltage generating circuit 48 and a resistor R18 whose one end is connected to the ground potential are connected to a negative input terminal of the differential amplifier circuit (comparator) 57 (node N17). A resistor R21 whose one end is connected to the power supply voltage VDD and a resistor R22 whose one end is connected to the substrate voltage VBB are connected to a positive input terminal (node N19). A drain of an NMOS transistor T53 which is a bias current source is connected to sources of both the input NMOS transistors, a source of the transistor T53 is connected to the ground potential, and a gate thereof is connected to an output of an inverter 59 (node Ø3). This inverter 59 receives an output of an NAND gate 58. Further, an output Ø2 of the differential amplifier circuit (comparator) 57 is input to the NAND gate 58. The node Ø3 is input to the substrate voltage generating auxiliary circuit 4a or the substrate voltage generating circuit 4b as /ØA through an inverter 60.

Figure 31:
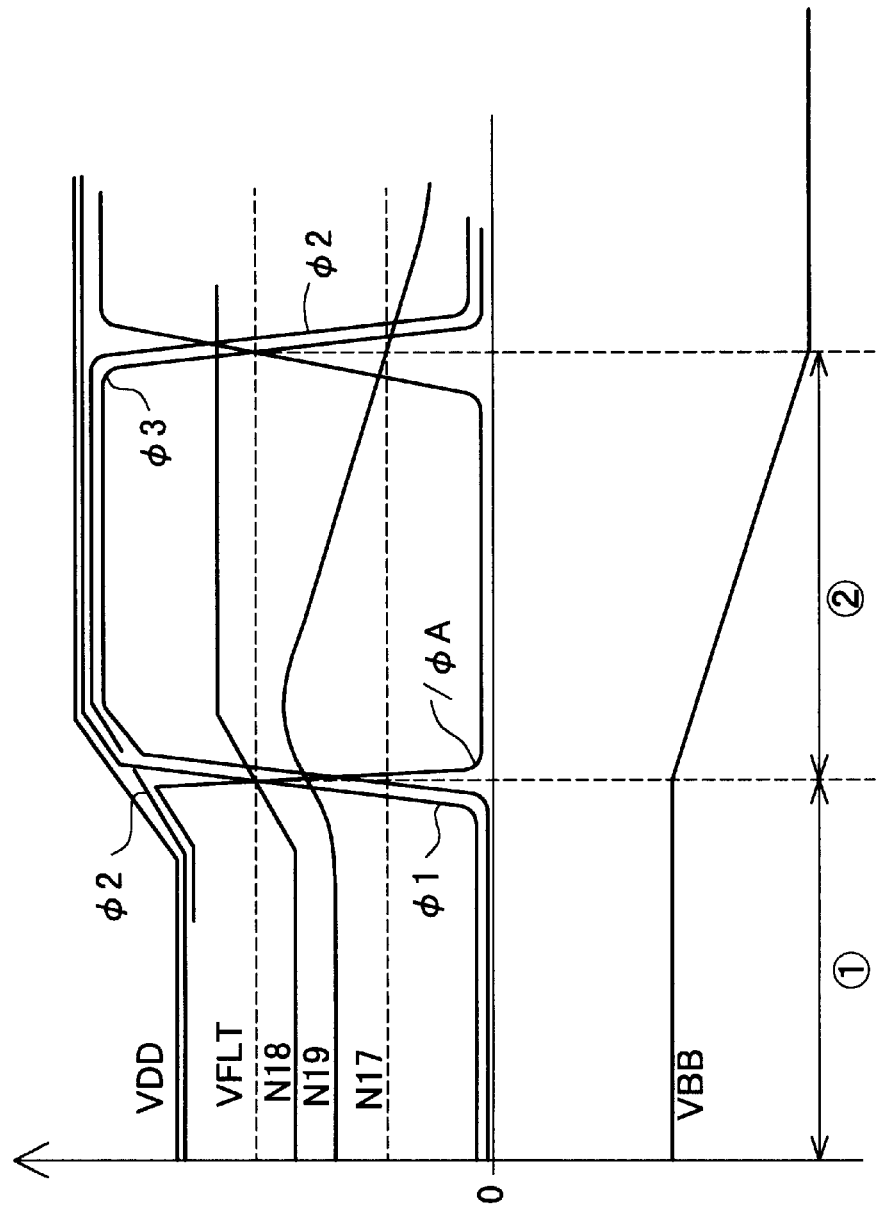
FIG. 31 is a time chart for explaining an operation of the concrete example of the data retention exit detecting circuit used in the sixth embodiment.

Next, a concrete circuit operation will be explained with reference to FIG. 31. In FIG. 31, a region ① is an operation state in the data retention mode. The power supply voltage VDD is set low, and the substrate voltage VBB is set shallow. In this state, the refresh operation is carried out at low power consumption. In this state, the node N18 which is the positive input terminal of the differential amplifier circuit (comparator) 56 is set lower than the VFLT which is the negative input terminal, and the output Ø1 of the differential amplifier circuit (comparator) 56 is low level. Therefore, an input of the NAND gate 58 is also low level, and the Ø3 is also low level. The differential amplifier circuit (comparator) 57 remains in non-active state and high level (region ① in the drawing).

If the operation mode is returned from the data retention mode, the power supply voltage VDD is increased, and the node N18 which is the positive terminal of the differential amplifier circuit (comparator) 56 is also increased, but since the VFLT which is the negative input terminal outputs a constant voltage, the output Ø1 of the differential amplifier circuit (comparator) 56 is inverted and high level is output. On the other hand, in the case of the differential amplifier circuit (comparator) 57, since the power supply voltage VDD is increased while the substrate voltage VBB remains shallow immediately after the shift, the node N19 is increased, the Ø3 becomes high level through the NAND gate 58 and the inverter 59 by the inversion of the Ø1 and thus, the output Ø2 maintains high level. At that time, since the Ø3 is high level, the /ØA becomes low level through the inverter 60.

The node N19 is once rises by the rise of the power supply voltage VDD, but with time thereafter, the substrate voltage VBB gradually becomes deep, and the node N19 is reduced gradually. If it is reduced to a value lower than the voltage level of the node N17 which is the negative input terminal of the differential amplifier circuit (comparator) 57, since the output Ø2 of the differential amplifier circuit (comparator) 57 is inverted into low level, the /ØA is inverted to high level through the NAND gate 58 and the two stage inverters. By the above operation, if the power supply voltage VDD is increased, a negative pulse appears in the /ØA (region ② in the drawing).

Figure 32:
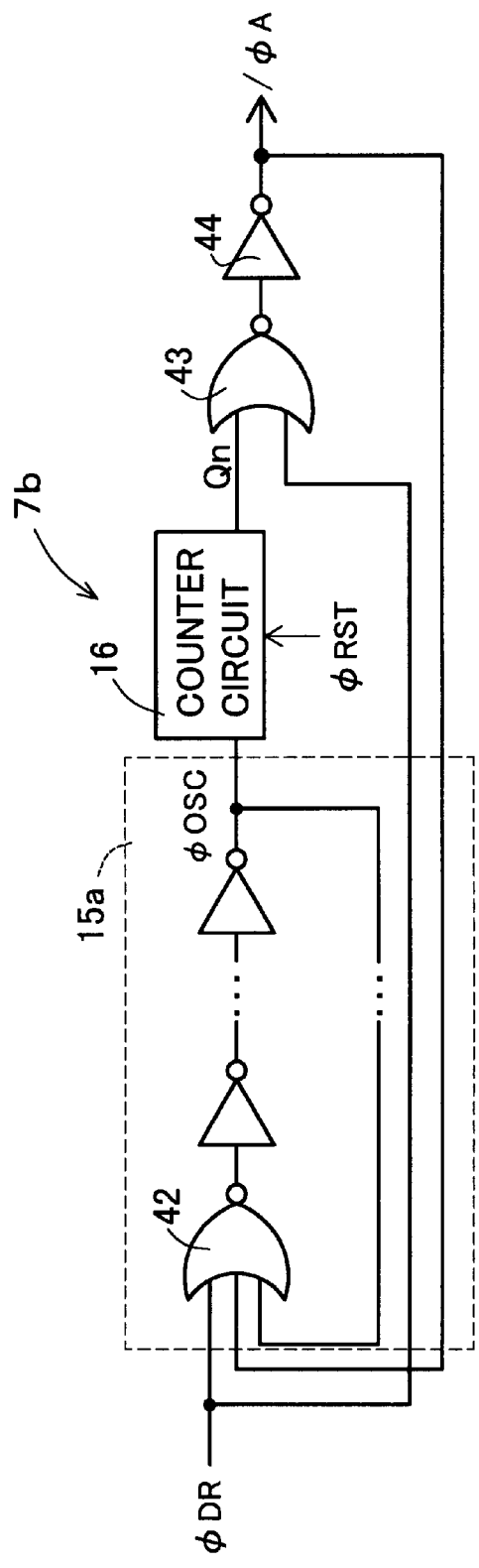
FIG. 32 shows a first modification of the concrete example of the data retention exit detecting circuit used in the sixth embodiment.

FIG. 32 shows a first modification 7b of the data retention exit detecting circuit used in the present embodiment. In this embodiment, the inverter 41 in the data retention mode entry judging circuit 2a in the second embodiment is deleted. A data retention mode setting signal through exclusive terminal from outside of the DRAM is used as a trigger. Because it is necessary to catch the exit time, it is operated by a signal which inverted from the data retention mode entry judging circuit 2a. Since a detailed circuit operation is the same as that of the data retention mode entry judging circuit 2a, explanation thereof will be omitted here.

Figure 33:
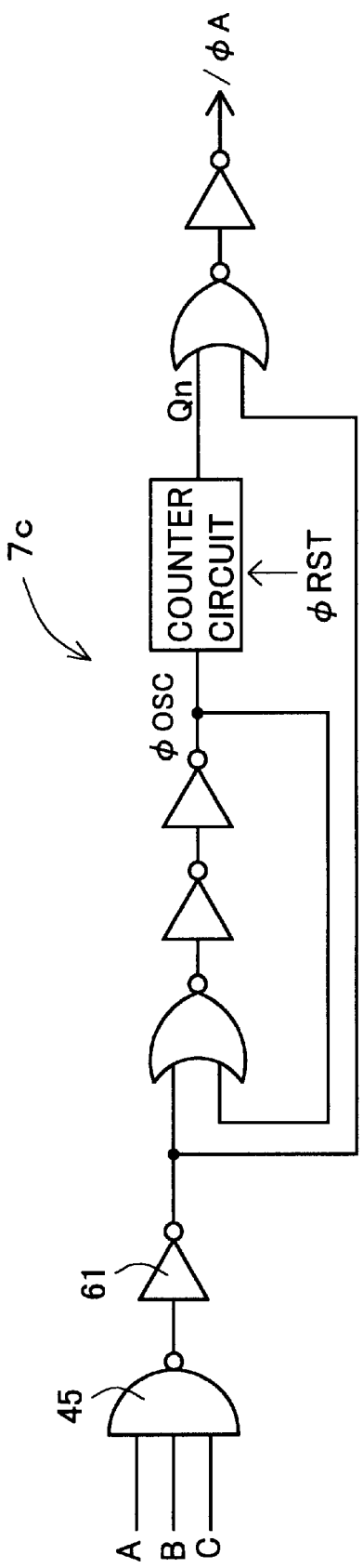
FIG. 33 shows a second modification of the concrete example of the data retention exit detecting circuit used in the sixth embodiment.

FIG. 33 shows a second modification 7c of the data retention exit detecting circuit used in the present embodiment. In this embodiment, an inverter 61 is added to the data retention mode entry judging circuit 2b in the second embodiment. This has the same effect as that of the first embodiment (FIG. 32), and it is effective when the data retention mode is set by particular combination of signal input to existing terminal of the DRAM. Since a detailed circuit operation is the same as that of the data retention mode entry judging circuit 2b, explanation thereof will be omitted here.

Next, a concrete example of a circuit which receives low pulse of the /ØA output from the data retention exit detecting circuits 7a to 7c to reinforce the generation of the substrate voltage VBB. First, as a concrete example, the substrate voltage generating auxiliary circuit 4a is shown in FIG. 34.

Figure 34:
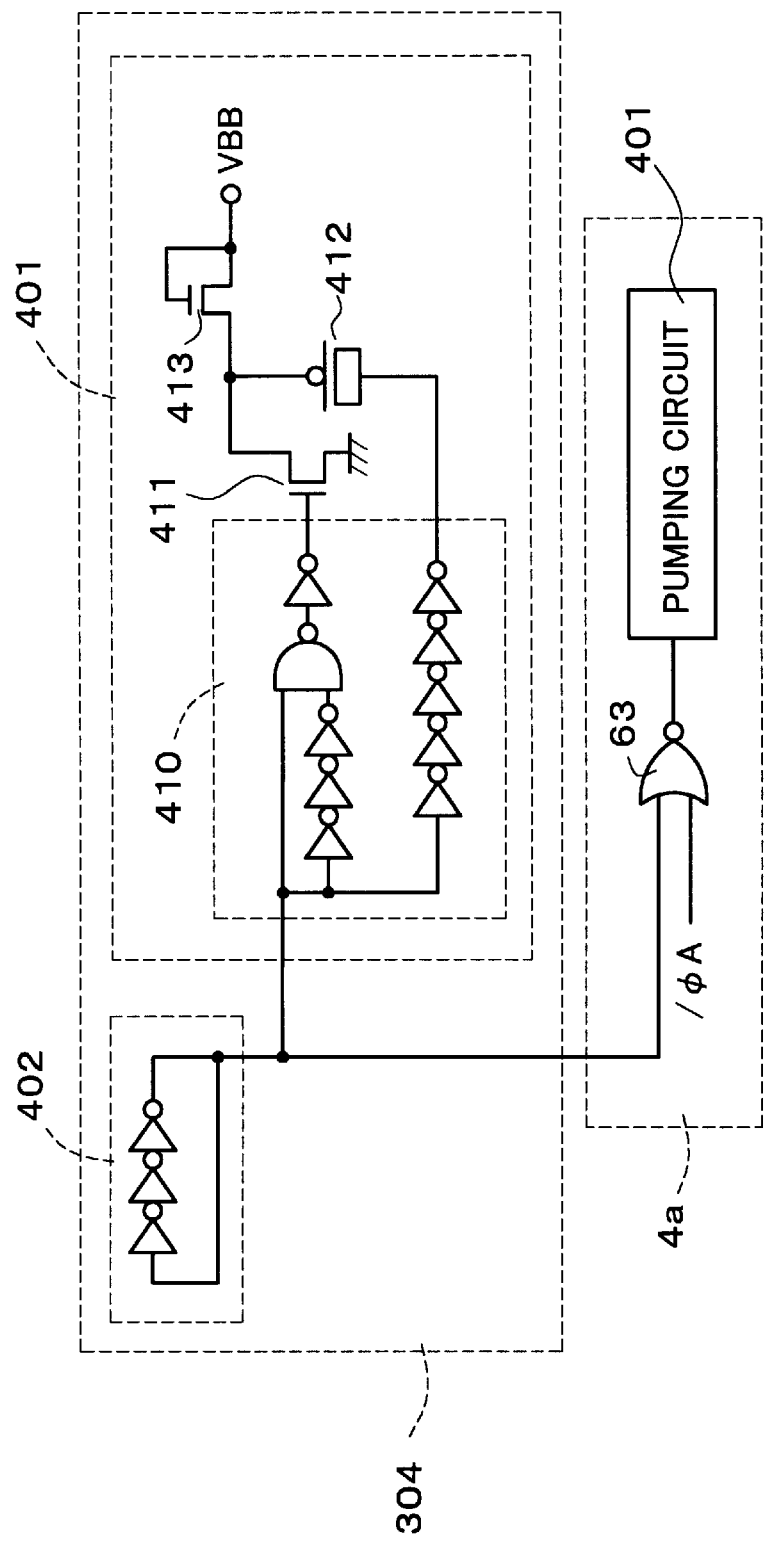
FIG. 34 shows a concrete example of a substrate voltage generating auxiliary circuit which receives a signal /ØA from the data retention exit detecting circuit used in the sixth embodiment, and which reinforces the generation of a substrate voltage VBB.

In FIG. 34, a conventional voltage generating circuit 304 is also shown. The voltage generating circuit 304 comprises a pumping circuit 401 and an oscillator circuit 402. The pumping circuit 401 comprises a pumping logic 410, an NMOS switch 411, a pumping PMOS capacitor 412 and an NMOS diode 413. In synchronism with oscillation of the oscillator 402, two outputs of the pumping logic 410 are alternately switching, thereby electric charge is taken out from the substrate voltage VBB to form a negative voltage. That is, the NMOS switch 411 is turned ON to precharge a cathode side of the NMOS diode 413 to a level of the ground potential, and in a next cycle, the pumping PMOS capacitor 412 is pulled toward the negative side, the electric charge is taken out from the VBB terminal through the NMOS diode 413 to generate the negative voltage.

The substrate voltage generating auxiliary circuit 4a inputs an NOR gate 63 to an oscillator input of the pumping circuit 401. A signal from the oscillator 402 and the /ØA are input to the NOR gate 63. In a normal operating state, the /ØA is high level, and the output of the NOR gate is fixed to low level, and the pumping circuit 401 in the substrate voltage generating auxiliary circuit 4a is in the stopped state. As explained above, when the /ØA generates low pulse, the pumping circuit 401 starts operating, and in addition to the pumping circuit 401 in the normal operating state, it operates to generate the substrate voltage VBB and thus, the driving ability of the substrate voltage generating circuit 304 is effectively strengthened, and it is possible to follow the rise of the power supply voltage VDD and change the substrate voltage VBB.

Figure 35:
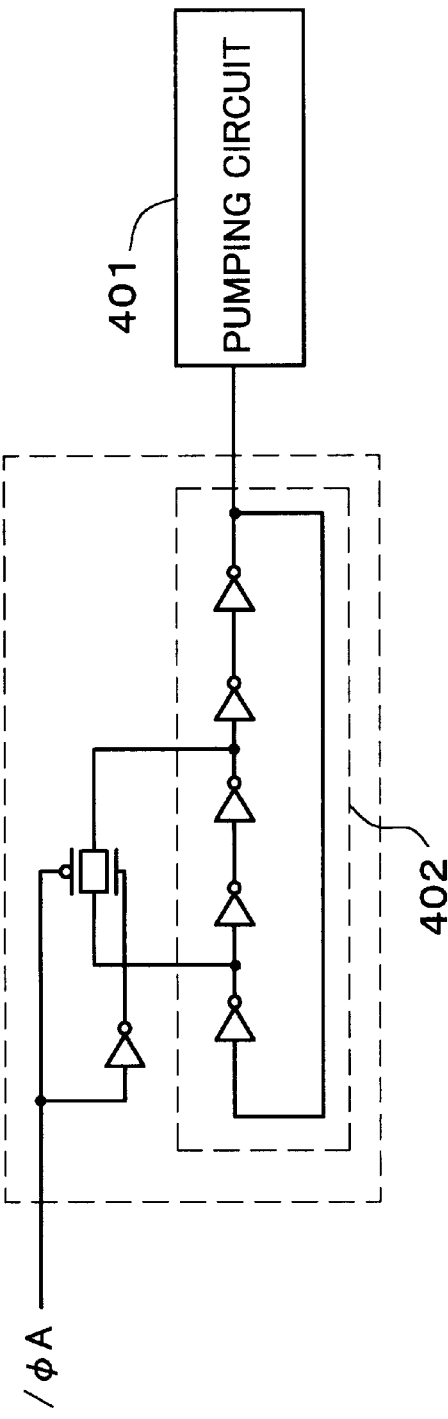
FIG. 35 shows a modification of the substrate voltage generating auxiliary circuit which receives the signal /ØA from the data retention exit detecting circuit used in the sixth embodiment, and which reinforces the generation of the substrate voltage VBB.

FIG. 35 shows the substrate voltage generating auxiliary circuit 4b which is a modification. In this modification, only when the /ØA is low pulse, the oscillator cycle is shortened to strengthen the ability of the substrate voltage generating circuit. This structure includes the same structure as that of the third modification 6d of the refresh timer circuit in the first embodiment (see FIG. 10). In order to shorten the refresh cycle in the first embodiment, the same structure as that for shortening the oscillating cycle of the oscillator circuit 15 is applied so as to enhance the pumping frequency of the substrate voltage generating circuit. The oscillating frequency is increased by decreasing the number of stages of the inverters constituting the oscillator 402. Detailed explanation will be omitted.

Figure 36:
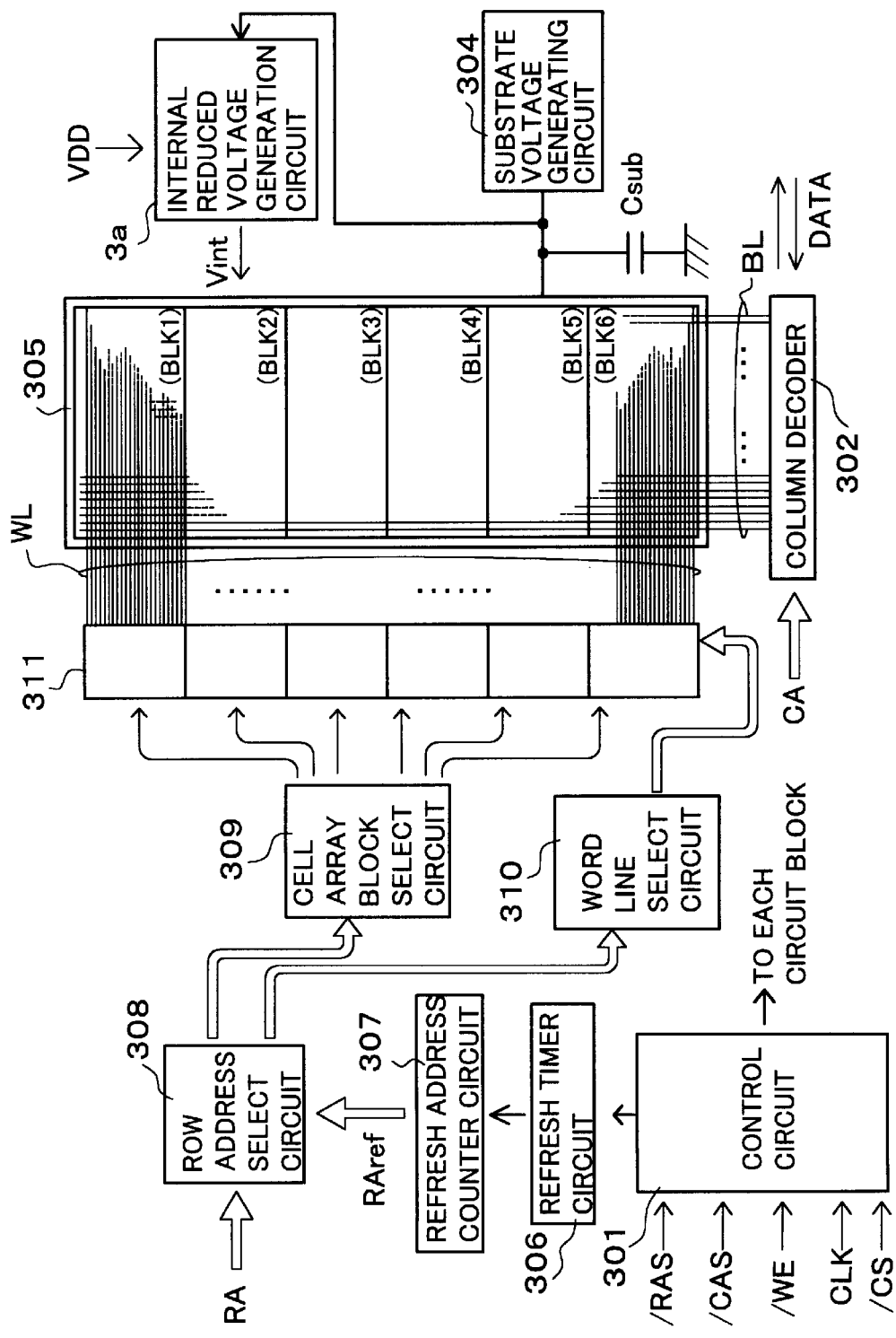
FIG. 36 is a circuit block diagram of a semiconductor memory of a seventh embodiment embodying the present invention.

FIG. 36 shows a semiconductor memory of a seventh embodiment embodying the present invention. In a structure shown in FIG. 36, components similar to those described in the description of relevant art are designated with the same symbols, and explanation thereof will be omitted. This embodiment relates to a DRAM of a type in which the power supply voltage VDD is reduced inside and used as the internal reduced voltage Vint, and when an operation mode is shifted into the data retention mode or returned from the data retention mode, in order to dissolve the unbalance period between the internal reduced voltage Vint and the substrate voltage VBB, the internal reduced voltage Vint is changed in accordance with variation of the substrate voltage VBB. That is, when the operation mode is shifted to the data retention mode, the internal reduced voltage Vint is reduced in synchronism with rise of the substrate voltage VBB, and when the operation mode is returned from the data retention mode, the internal reduced voltage Vint is increased in synchronism with reduction of the substrate voltage VBB. With this feature, the balance of both the voltages is kept to maintain the electric charge retention ability. Like the fourth to sixth embodiments, the present embodiment is for deleting the transient deterioration of the electric charge retention ability. In FIG. 36, this embodiment includes an internal reduced voltage circuit 3a having a voltage control function, and the internal reduced voltage Vint in accordance with the substrate voltage VBB is output.

Figure 37:
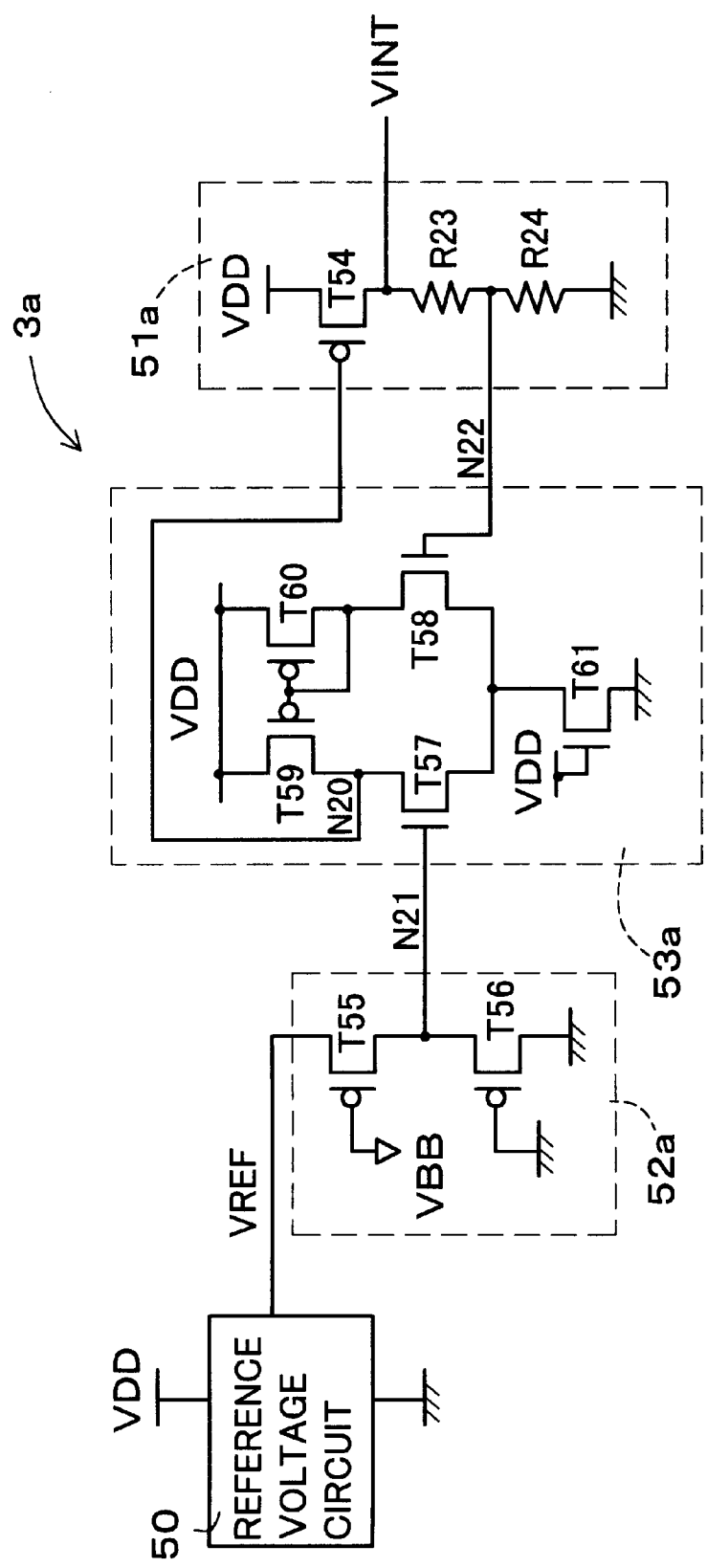
FIG. 37 shows a concrete example of an internal reduced voltage circuit having a voltage control function used in the seventh embodiment.
Figure 38:
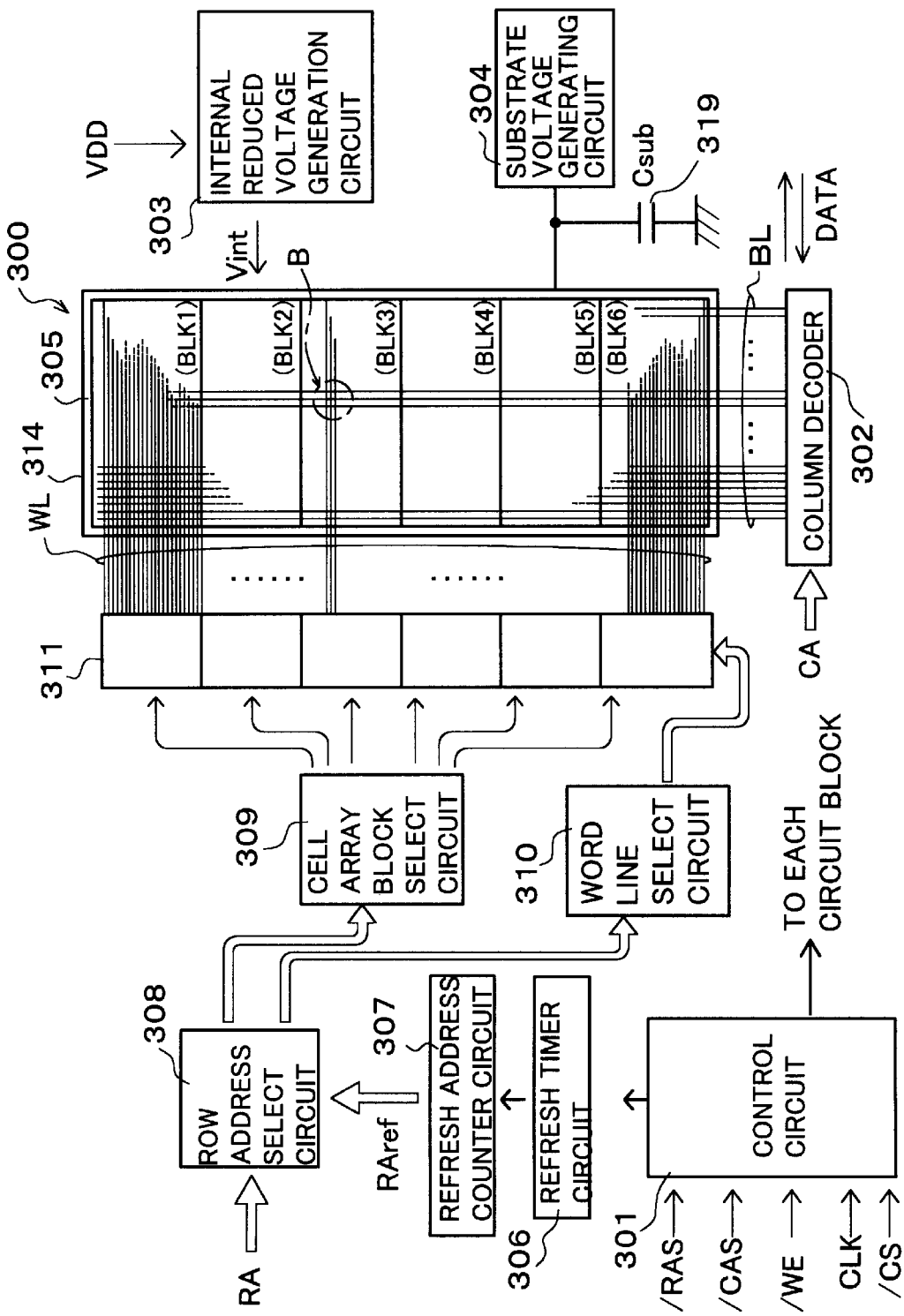
FIG. 38 is a circuit block diagram of a conventional semiconductor memory.
Figure 39:
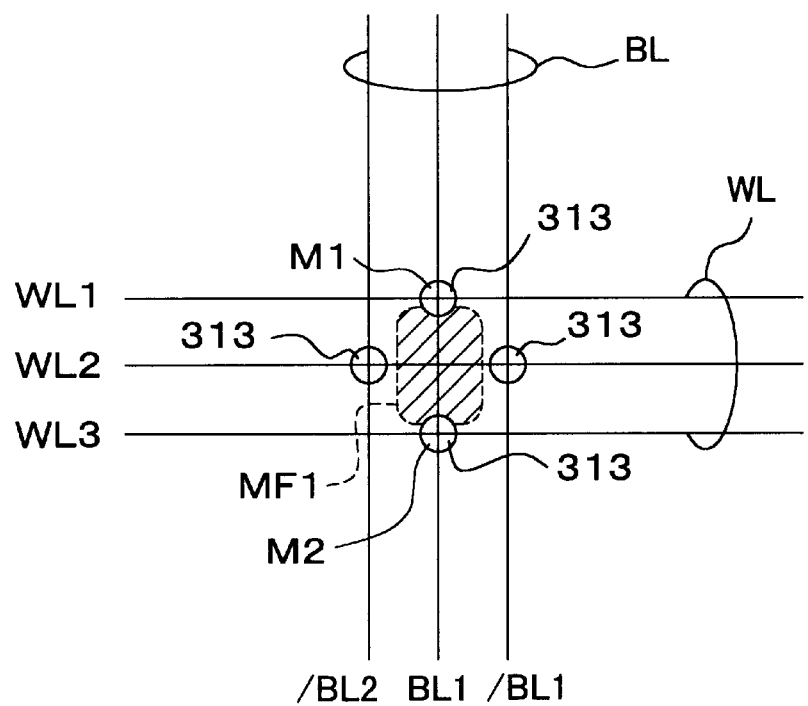
FIG. 39 is a schematic view showing a positional relation of memory cells, word lines and bit lines in a memory cell array in the semiconductor memory.

FIG. 37 shows a concrete example of the internal reduced voltage circuit 3a having the voltage control function used in the present embodiment. The circuit 3a comprises an internal reduced voltage reference voltage circuit 50, an internal reduced voltage outputting circuit 51a, an internal reduced voltage setting circuit 52a, and a differential amplifier circuit (comparator) 53a.

A gate of a PMOS transistor T54 of the internal reduced voltage outputting circuit 51a is connected to an output N20 of the differential amplifier circuit (comparator) 53a, a source of the transistor T54 is connected to the power supply voltage VDD, a drain of the transistor T54 is connected to one end of a resistor R23, and internal reduced voltage Vint is output. The other end of the resistor R23 is connected to one end of a resistor R24 whose other end is connected to the ground potential, and is fed back to the differential amplifier circuit (comparator) 53a as a monitor node N22 of the internal reduced voltage Vint.

A source of the PMOS transistor T55 of the internal reduced voltage setting circuit 52a is connected to an output VREF of the internal reduced voltage reference voltage circuit 50, a drain of the transistor T55 is connected to a source of a PMOS transistor T56 to output a set voltage N21. A drain and a gate of the PMOS transistor T56 are connected to the ground potential, and a gate of the PMOS transistor T55 is connected to the substrate voltage VBB.

In the differential amplifier circuit (comparator) 53a, a source of an NMOS transistor T57 whose gate receives an output N21 of the internal reduced voltage setting circuit 52a and a source of an NMOS transistor T58 whose gate receives a feedback signal from the internal reduced voltage outputting circuit 51a are commonly connected, and a differential pair is formed. A drain and a gate of a PMOS transistor T60 are connected to a drain of an NMOS transistor T58, and a gate of a PMOS transistor T59 is connected to the drain of the NMOS transistor T58, a drain of the PMOS transistor T59 is connected to a drain of the NMOS transistor T57, and is connected to a gate of the PMOS transistor T54 of the internal reduced voltage outputting circuit 51a. Sources of the PMOS transistors T59 and T60 are connected to the power supply voltage VDD, and an active load of the differential amplifier circuit (comparator)

53a is formed. Further, a drain of an NMOS transistor T61 whose source is connected to the ground potential as a bias source and whose gate is connected to the power supply voltage VDD is connected to sources of the NMOS transistors T57 and T58.

Next, a concrete circuit operation will be explained. A conductance of the PMOS transistor T55 of the internal reduced voltage setting circuit 52a is determined in accordance with magnitude of a negative voltage VBB to be applied to the gate with respect to a constant voltage VREF to be applied to the source, and the current flows to the ground potential through the PMOS transistor T56. Therefore, it is self-biased to determine the voltage of the node N21 such that the PMOS transistor T56 can flow current in accordance with the current ability of the PMOS transistor T55. That is, if the VBB voltage becomes deep, the conductance of the PMOS transistor T55 is increased, and to balance with this, the conductance of the PMOS transistor T56 is increased and thus, the voltage of the node N21 is increased. On the contrary, if the VBB voltage becomes shallow, since the conductance of the PMOS transistor T56 may be small so as to meet the PMOS transistor T55 having a small conductance, the voltage of the node N21 is reduced. If the VBB voltage which is a negative voltage becomes deep, the node N21 which is the positive voltage is increased, and if it becomes shallow, the node N21 is decreased, it is controlled in accordance with the VBB voltage.

Further, the differential amplifier circuit (comparator) 53a constitutes a feedback circuit together with the internal reduced voltage outputting circuit 51a, and is controlled such that both inputs of the differential amplifier circuit (comparator) 53a always have the same voltage. That is, if the node N21 increases and becomes greater than the node N22, the bias current constituting the differential pair flows through the transistor T57, thereby reducing the output N20 to low level. This turns the PMOS transistor T54 of the internal reduced voltage outputting circuit 51a ON, and increases the internal reduced voltage Vint and the node N22. This state is continued until the node N22 becomes equal to the node N21. On the contrary, if the node N21 reduces and becomes lower than the node N22, the bias current constituting the differential pair flows through the transistor T58, the current is supplied from the PMOS transistor T59 through the PMOS transistor T60, and the output N20 is increased to high level. This turns the PMOS transistor T54 of the internal reduced voltage outputting circuit 51a OFF, the internal reduced voltage Vint is consumed by the internal circuit in the semiconductor memory and lowered, thereby lowering the node N22. This state is continued until the node N22 becomes equal to the node N21. The above operation is repeated and finally, the node N22 becomes equal to the node N21 and keep balance. The voltage relation at that time is:

$$Vint=((R23+R24)/R24)\times V(N21)$$

and if R23, R24 and V(N21) are appropriately set, the optimal Vint voltage with respect to the VBB voltage can be obtained.

According to this embodiment, since the optimal internal reduced voltage Vint always having well balance with respect to variation of the substrate voltage VBB, it is possible to delete the transient deterioration of the electric charge retention ability caused by variation in substrate voltage VBB when the operation mode is shifted to the data retention mode or returned from the data retention mode.

The above described first to seventh embodiments can of course be used alone, but a plurality of embodiments can be used simultaneously. Especially, if the first to fifth embodiments as well as the sixth and seventh embodiments are combined and used, the electric charge retention ability of the memory cell can be improved in both when the operation mode is shifted to the data retention mode or returned from the data retention mode, which is preferable.

As described in detail above, according to the semiconductor memory of the present embodiment, when the operation mode is shifted to the data retention mode, transient deterioration of the electric charge retention ability during the varying period of the substrate voltage VBB due to reduction of the power supply voltage VDD or the internal reduced voltage Vint can be restored or deleted by detecting the varying period or time-keeping. Further, when the operation mode is returned from the data retention mode, transient deterioration of the electric charge retention ability during the varying period of the substrate voltage VBB due to rise of the power supply voltage VDD or the internal reduced voltage Vint can be restored or deleted by detecting the varying period or time-keeping. With this, in the data retention mode, in a state where the power supply voltage VDD or the internal reduced voltage Vint is reduced, it can be operated with long refresh cycle, and it is most suitable for reduction of power consumption. According to the present invention, the effect can be obtained not only during a transient period between the normal operating state and the data retention mode, but also in an unbalance voltage state between the power supply voltage VDD or the internal reduced voltage Vint and the substrate voltage VBB.

The present invention should not be limited to the above embodiments, and it is of course possible to variously improve and change without departing from the subject of the present invention.

What is claimed is:

1. A semiconductor memory device with a first operation mode operating at a first power supply voltage and a second operation mode for carrying out a refresh operation of memory cells at a second power supply voltage lower than the first power supply voltage, the semiconductor memory device comprising:
    a substrate voltage generating circuit for generating a substrate voltage applied to a substrate portion of a memory cell region;
    a refresh section for carrying out the refresh operation of the memory cells at a predetermined cycle in the first operation mode; and
    a refresh control section for controlling the refresh section so that the refresh operation is carried out at a first cycle which is shorter than the predetermined cycle during a varying period of the substrate voltage when the first operation mode is shifted to the second operation mode.

2. The semiconductor memory device according to claim 1, wherein the refresh control section controls the refresh section so that the refresh operation is carried out at a second cycle longer than the predetermined cycle after the varying period is elapsed.

3. The semiconductor memory device according to claim 2, further comprising a cycle setting circuit for setting the first cycle during the varying period,
    wherein the refresh control section controls the refresh section so that the refresh operation is carried out at the first cycle set by the cycle setting circuit.

4. The semiconductor memory device according to claim 3, wherein the first cycle is set by increasing a driving power supply voltage applied to the cycle setting circuit.

5. The semiconductor memory device according to claim 4, wherein the substrate voltage generated by the substrate voltage generating circuit is set to a negative voltage, and the first cycle is set by applying the substrate voltage with a negative voltage value to a reference voltage terminal of the cycle setting circuit.

6. The semiconductor memory device according to claim 4, further comprising:
   a reducing circuit connected between the power supply voltage and a power supply terminal of the cycle setting circuit, the reducing circuit generating a reduced voltage lower than the power supply voltage and outputting the reduced voltage to the power supply terminal of the cycle setting circuit; and
   a short-circuit for short-circuiting between an input and an output of the reducing circuit;
   wherein the predetermined cycle is set by applying the reduced voltage to the cycle setting circuit, and the first cycle is set by short-circuiting the reducing circuit by the short-circuit.

7. The semiconductor memory device according to claim 4, further comprising:
   an internal reduced voltage generating circuit for generating a voltage lower than the power supply voltage;
   a switching circuit for switching a connection between a power supply terminal of the cycle setting circuit and the power supply voltage or the internal reduced voltage generating circuit;
   wherein the predetermined cycle is set by connecting the cycle setting circuit and the internal reduced voltage generating circuit through the switching circuit and applying the voltage lower than the power supply voltage to the cycle setting circuit, and
   wherein the first cycle is set by connecting the cycle setting circuit and the power supply voltage through the switching circuit and applying the power supply voltage to the cycle setting circuit.

8. The semiconductor memory device according to claim 3, wherein the first cycle is set by increasing a driving current applied to the cycle setting circuit.

9. The semiconductor memory device according to claim 8, further comprising:
   a driving current control circuit for controlling the driving current applied to the cycle setting circuit;
   wherein the driving current control circuit applies a predetermined driving current to the cycle setting circuit during a period except for the varying period and applies a driving current higher than the predetermined driving current to the cycle setting circuit during the varying period.

10. The semiconductor memory device according to claim 3, wherein the cycle setting circuit comprises odd inverters connected in a loop manner, and a short-circuit for short-circuiting a part of the inverters during the varying period.

11. The semiconductor memory device according to claim 1, wherein the refresh control section elongates the first cycle in response to the substrate voltage during the varying period.

12. The semiconductor memory device according to claim 1, wherein the refresh control section controls the refresh section so that a number of the memory cells larger than a number of the memory cells selected in one time refresh operation in the first operation mode is refreshed during the varying period.

13. The semiconductor memory device according to claim 12, wherein the refresh control section simultaneously selects word lines, each corresponding to the memory cells.

14. The semiconductor memory device according to claim 12, wherein the refresh control section simultaneously selects cell array blocks in each of which a plurality of the memory cells are arranged.

15. A semiconductor memory device with a first operation mode operating at a first power supply voltage and a second operation mode for carrying out a refresh operation of memory cells at a second power supply voltage lower than the first power supply voltage, the semiconductor memory device comprising:
   a substrate voltage generating circuit for generating a substrate voltage applied to a substrate portion of a memory cell region;
   a refresh section for carrying out the refresh operation of the memory cells at a predetermined cycle in the first operation mode; and
   a substrate voltage control circuit for connecting the substrate voltage to a predetermined voltage node during a varying period of the substrate voltage when the first operation mode is shifted to the second operation mode.

16. The semiconductor memory device according to claim 15, wherein the substrate voltage is connected to a reference voltage node during the varying period and a plurality of the substrate voltage control circuits are dispersively arranged in the semiconductor memory device.

17. A semiconductor memory device with a first operation mode operating at a first power supply voltage and a second operation mode for carrying out a refresh operation of memory cells at a second power supply voltage lower than the first power supply voltage, the semiconductor memory device comprising:
   a substrate voltage generating circuit for generating a substrate voltage applied to a substrate portion of a memory cell region;
   a reduced voltage generating circuit for generating the second power supply voltage from the first power supply voltage;
   wherein the reduced voltage generating circuit reduces a level of the second power supply voltage in response to a variation of the substrate voltage during a varying period in which the first operation mode is shifted to the second operation mode.

18. The semiconductor memory device according to claim 17, wherein a plurality of the reduced voltage generating circuits are dispersively arranged in the semiconductor memory device.

19. A semiconductor memory device with a first operation mode operating at a first power supply voltage and a second operation mode for carrying out a refresh operation of a memory cell at a second power supply voltage lower than the first power supply voltage, the semiconductor memory device comprising:
   a substrate voltage generating circuit for generating a substrate voltage applied to a substrate portion of a memory cell region;
   a reduced voltage generating circuit for generating the second power supply voltage from the first power supply voltage;
   wherein the reduced voltage generating circuit reduces the first power supply voltage to the second power supply voltage after the substrate voltage reaches to a predetermined level when the first operation mode is shifted to the second operation mode.

20. A semiconductor memory device with a first operation mode operating at a first power supply voltage and a second operation mode for carrying out a refresh operation of memory cells at a second power supply voltage lower than the first power supply voltage, the semiconductor memory comprising:

a substrate voltage generating circuit for generating a substrate voltage applied to a substrate portion of a memory cell region;

wherein a driving ability of the substrate voltage generating circuit is increased during a period in which the second operation mode is shifted to the first operation mode.

21. The semiconductor memory device according to claim 20, wherein the substrate voltage generating circuit comprises a first substrate voltage generating circuit operating constantly and a second substrate voltage generating circuit which is temporarily operated during the period.

22. The semiconductor memory device according to claim 20, wherein the substrate voltage generating circuit comprises a charge pump circuit, and a pumping frequency of the charge pump circuit is increased during the period.

* * * * *